US010446335B2

(12) United States Patent
Hurwitz et al.

(10) Patent No.: US 10,446,335 B2
(45) Date of Patent: Oct. 15, 2019

(54) POLYMER FRAME FOR A CHIP, SUCH THAT THE FRAME COMPRISES AT LEAST ONE VIA IN SERIES WITH A CAPACITOR

(71) Applicant: Zhuhai Advanced Chip Carriers & Electronic Substrate Solutions Technologies Co. Ltd., Zhuhai (CN)

(72) Inventors: Dror Hurwitz, Zhuhai (CN); Alex Huang, Zhuhai (CN)

(73) Assignee: Zhuhai ACCESS Semiconductor Co., Ltd., Zhuhai (CN)

( * ) Notice: Subject to any disclaimer, the term of this patent is extended or adjusted under 35 U.S.C. 154(b) by 685 days.

(21) Appl. No.: 14/555,633

(22) Filed: Nov. 27, 2014

(65) Prior Publication Data
US 2015/0228416 A1    Aug. 13, 2015

Related U.S. Application Data

(63) Continuation-in-part of application No. 13/962,075, filed on Aug. 8, 2013, now Pat. No. 9,349,788, and a
(Continued)

(51) Int. Cl.
*H01G 17/00* (2006.01)
*H05K 1/16* (2006.01)
(Continued)

(52) U.S. Cl.
CPC ............ *H01G 17/00* (2013.01); *H01G 4/008* (2013.01); *H01G 4/1209* (2013.01); *H01G 4/224* (2013.01); *H01G 4/228* (2013.01); *H01G 4/33* (2013.01); *H01L 23/49822* (2013.01); *H01L 23/5389* (2013.01); *H01L 28/65* (2013.01); *H05K 1/115* (2013.01); *H05K 1/162* (2013.01); *H05K 1/165* (2013.01); *H05K 3/4647* (2013.01); *H01F 27/2804* (2013.01); *H01L 23/49827* (2013.01); *H01L 24/24* (2013.01); *H01L 24/97* (2013.01); *H01L 2224/04105* (2013.01); *H01L 2224/24195* (2013.01); *H01L 2924/19105* (2013.01); *H03H 7/0115* (2013.01); *H05K 1/186* (2013.01); *H05K 3/005* (2013.01); *H05K 3/0052* (2013.01); *H05K 2201/098* (2013.01); *H05K 2201/09627* (2013.01); *H05K 2201/09672* (2013.01); *H05K 2203/308* (2013.01)

(58) Field of Classification Search
CPC .......... H01G 17/00; H01G 4/008; H01G 4/12; H01K 1/181; H01K 1/162; H01L 27/01; H01L 15/16; H03H 7/01
See application file for complete search history.

(56) References Cited

U.S. PATENT DOCUMENTS

2003/0162442 A1* 8/2003 Panella ................ H05K 1/0262
439/607.05
2004/0080021 A1* 4/2004 Casper ................ H01L 21/4846
257/528
(Continued)

*Primary Examiner* — Nguyen T Ha
(74) *Attorney, Agent, or Firm* — Wiggin and Dana LLP; Gregory S. Rosenblatt; Jonathan D. Hall

(57) ABSTRACT

A chip socket defined by an organic matrix framework, wherein the organic matrix framework comprises at least one via post layer where at least one via through the framework around the socket includes at least one capacitor comprising a lower electrode, a dielectric layer and an upper electrode in contact with the via post.

30 Claims, 41 Drawing Sheets

Related U.S. Application Data continuation-in-part of application No. 13/962,316, filed on Aug. 8, 2013, now Pat. No. 10,014,843, and a continuation-in-part of application No. 14/269,884, filed on May 5, 2014, now abandoned.

(51) Int. Cl.

| | |
|---|---|
| *H05K 1/11* | (2006.01) |
| *H01G 4/12* | (2006.01) |
| *H01G 4/008* | (2006.01) |
| *H01G 4/33* | (2006.01) |
| *H01G 4/224* | (2006.01) |
| *H01G 4/228* | (2006.01) |
| *H01L 49/02* | (2006.01) |
| *H05K 3/46* | (2006.01) |
| *H01L 23/498* | (2006.01) |
| *H01L 23/538* | (2006.01) |
| *H01F 27/28* | (2006.01) |
| *H03H 7/01* | (2006.01) |
| *H01L 23/00* | (2006.01) |
| *H05K 1/18* | (2006.01) |
| *H05K 3/00* | (2006.01) |

(56) References Cited

U.S. PATENT DOCUMENTS

| | | | |
|---|---|---|---|
| 2004/0099893 A1* | 5/2004 | Martin | H01L 27/11502 257/295 |
| 2004/0124511 A1* | 7/2004 | Li | H05K 1/0212 257/678 |
| 2008/0081380 A1* | 4/2008 | Celii | H01L 27/11507 438/3 |
| 2008/0265399 A1 | 10/2008 | Chao | |
| 2009/0085691 A1* | 4/2009 | Kim | H05K 1/0231 333/185 |
| 2010/0013081 A1* | 1/2010 | Toh | H01L 21/6835 257/692 |
| 2012/0025861 A1* | 2/2012 | Park | G01R 1/045 324/756.02 |
| 2012/0134069 A1* | 5/2012 | Dooley | H01G 4/30 361/330 |
| 2013/0115722 A1* | 5/2013 | Nakagawa | H01L 24/97 438/15 |
| 2013/0257470 A1* | 10/2013 | Park | G01R 1/0483 324/756.02 |
| 2013/0278568 A1* | 10/2013 | Lasiter | H01L 23/49827 345/204 |
| 2013/0307140 A1 | 11/2013 | Huang et al. | |
| 2015/0042415 A1 | 2/2015 | Hurwitz et al. | |

\* cited by examiner

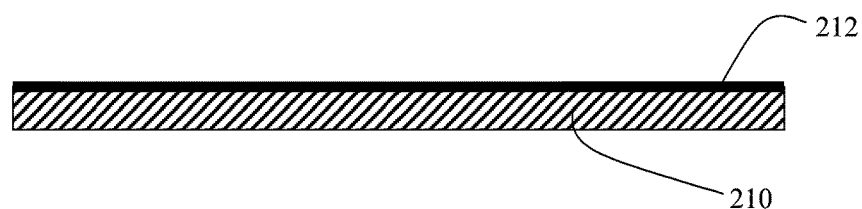
Fig. 9(iii)

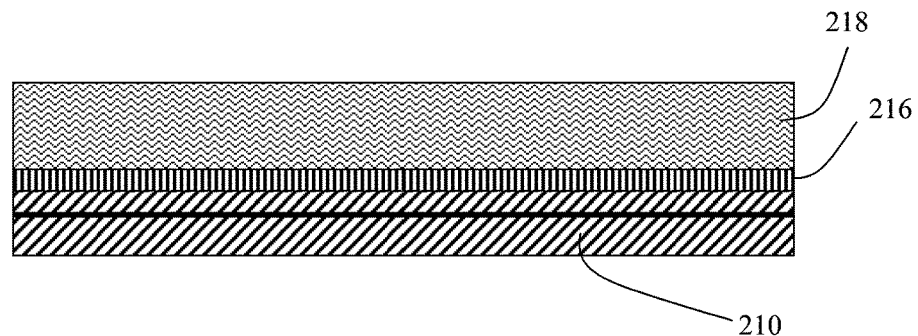
Fig. 9(vi)
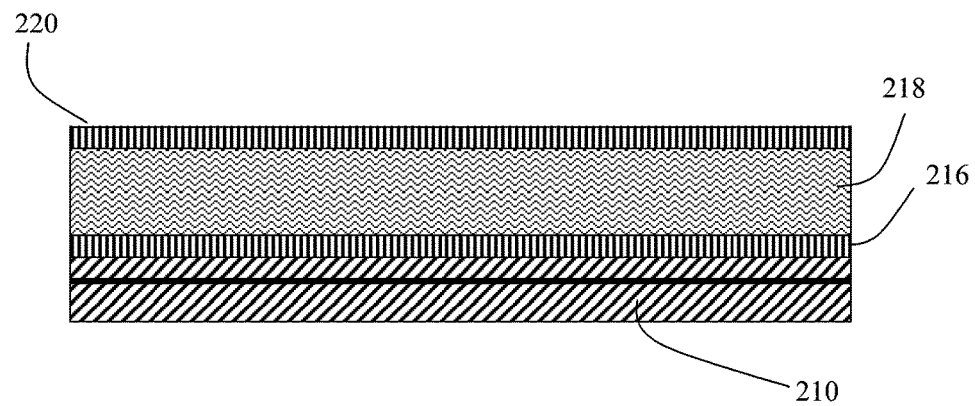
Fig. 9(vii)
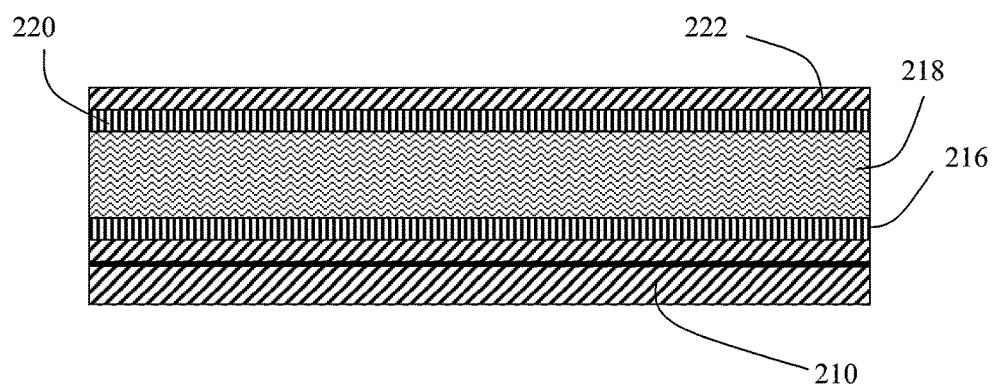
Fig. 9(viii)

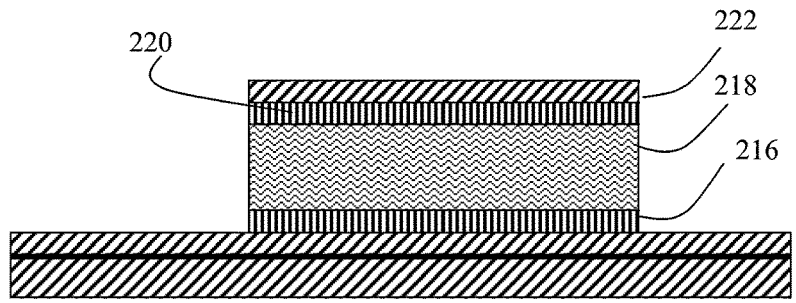
Fig. 9(xii)
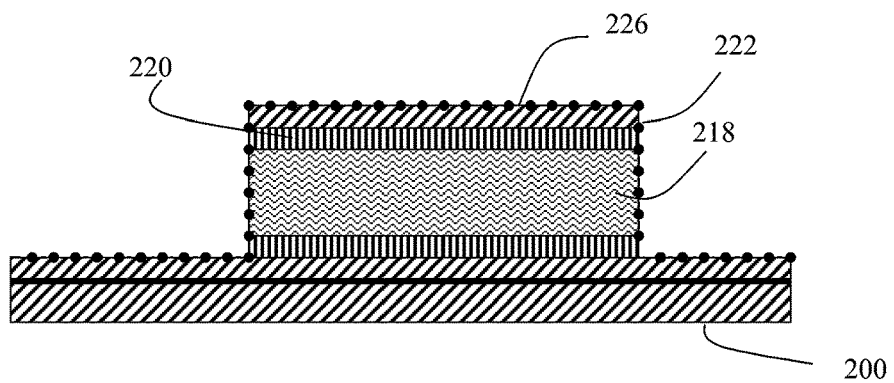
Fig. 9(xiii)
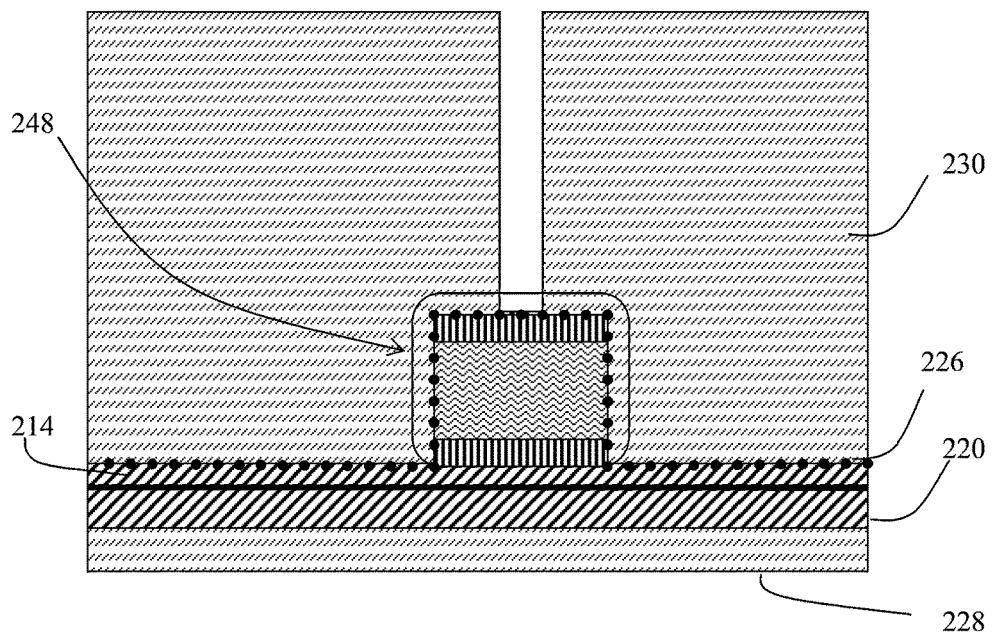
Fig. 9(xiv)

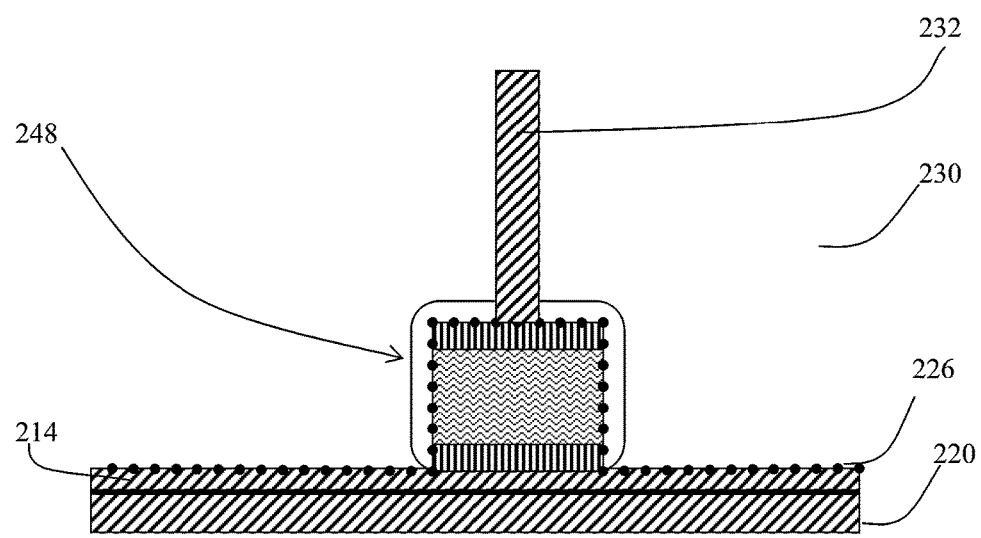
Fig. 9(xvi)

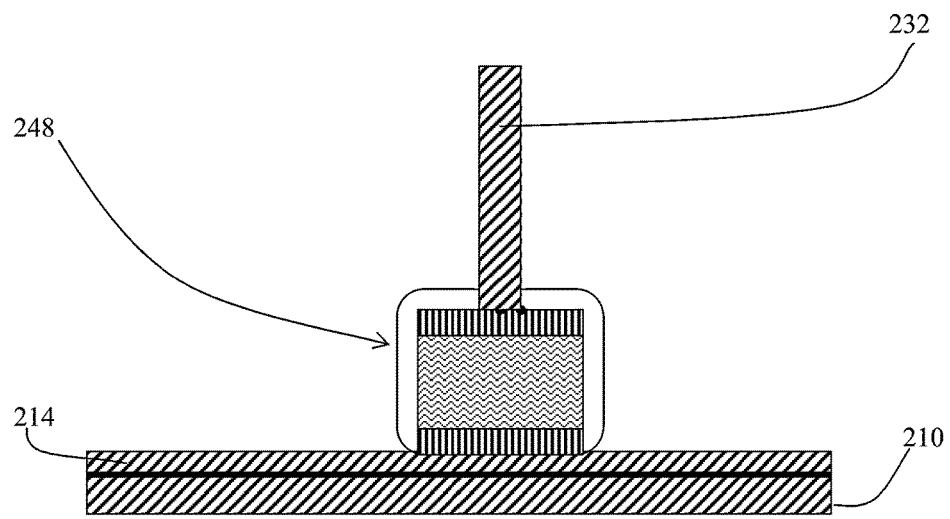
Fig. 9(xvii)
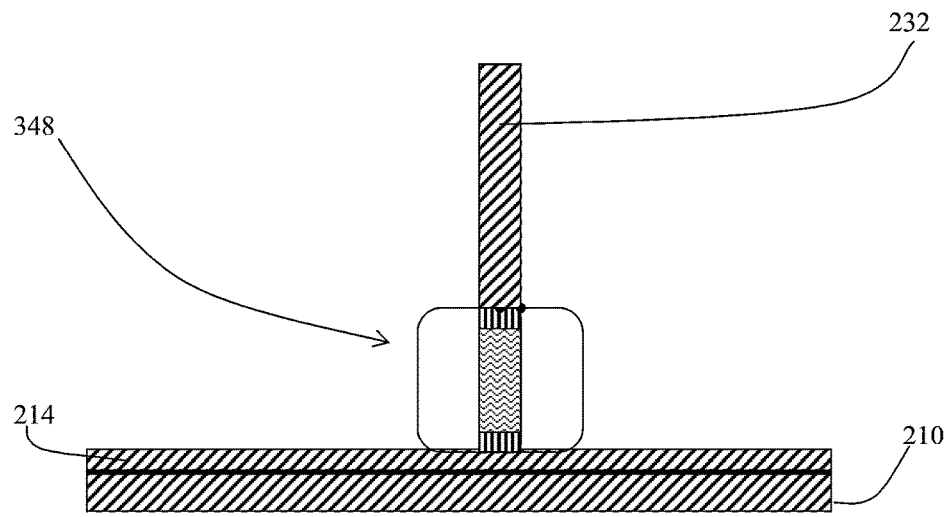
Fig. 9(xviii)

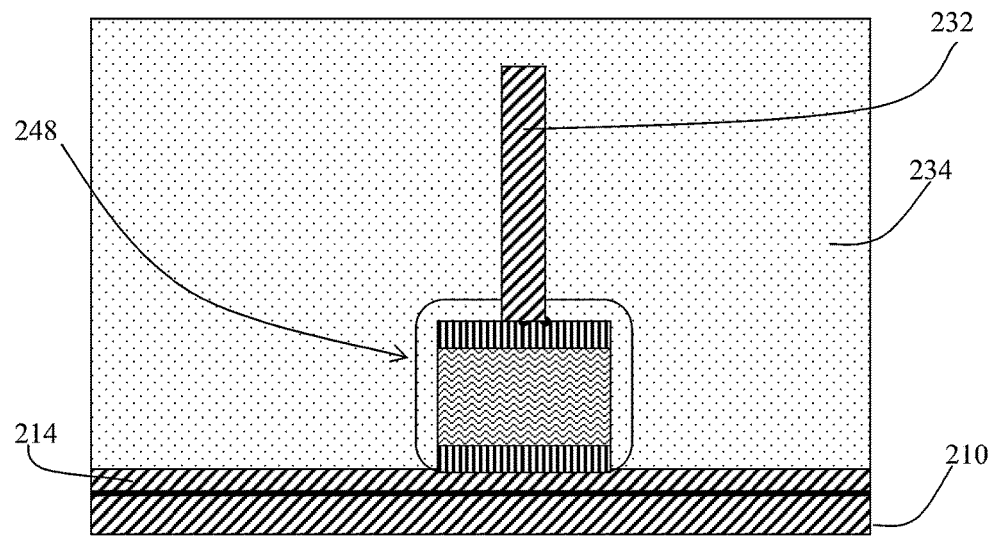
Fig. 9(xix)

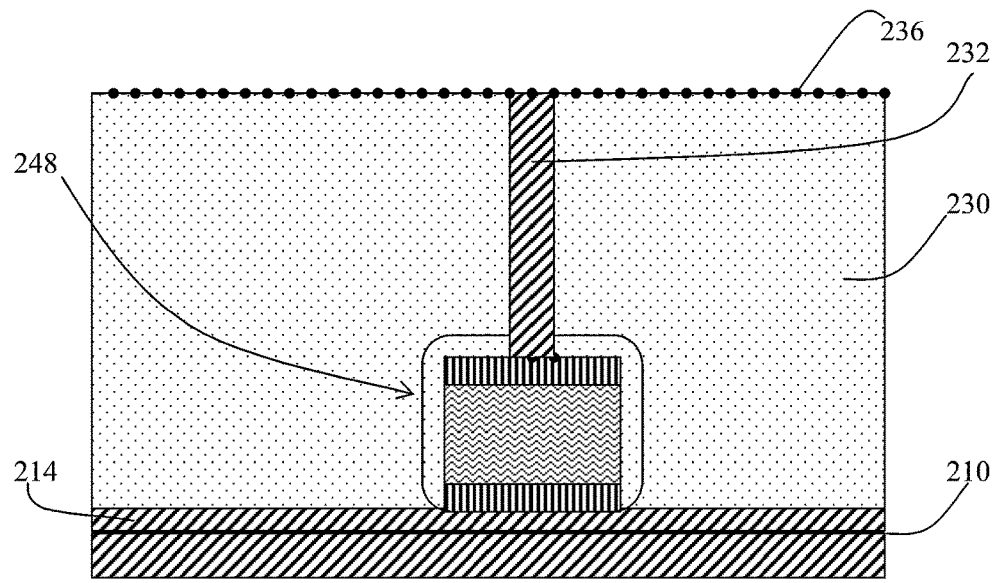
Fig. 9(xxi)
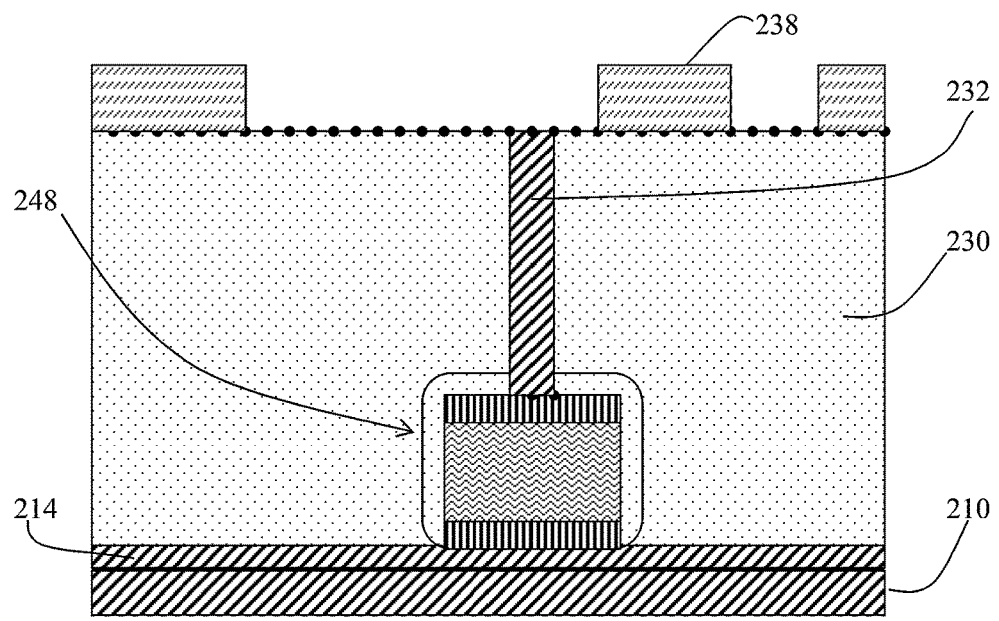
Fig. 9(xxii)

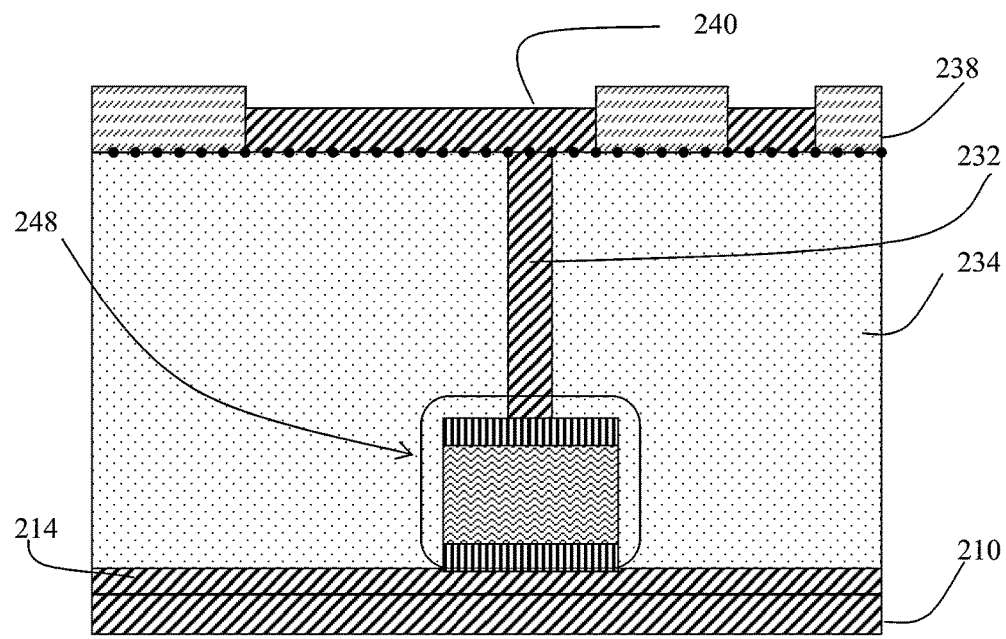
Fig. 9(xxiii)
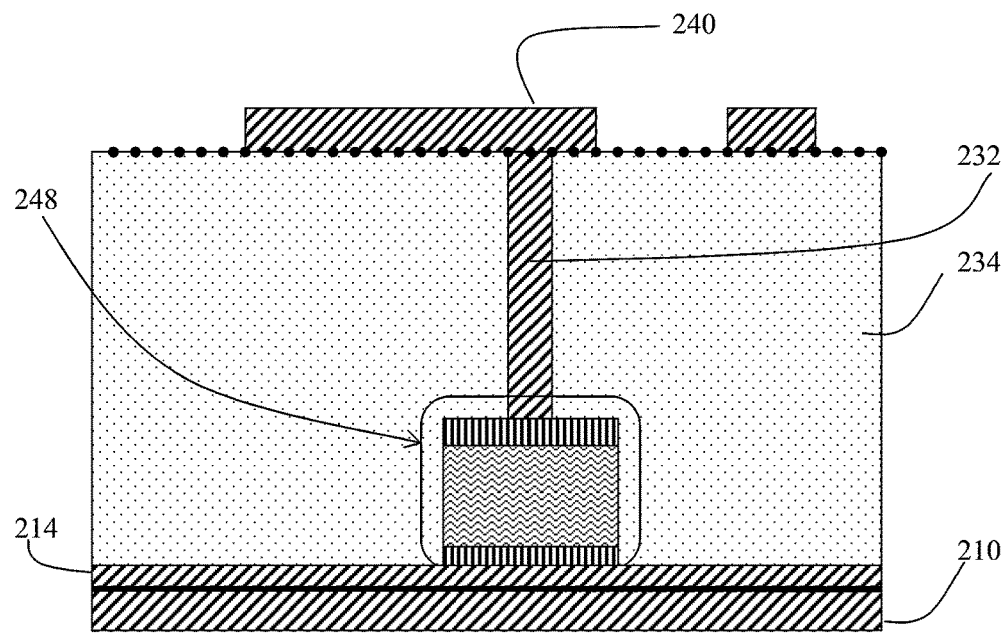
Fig. 9(xxiv)

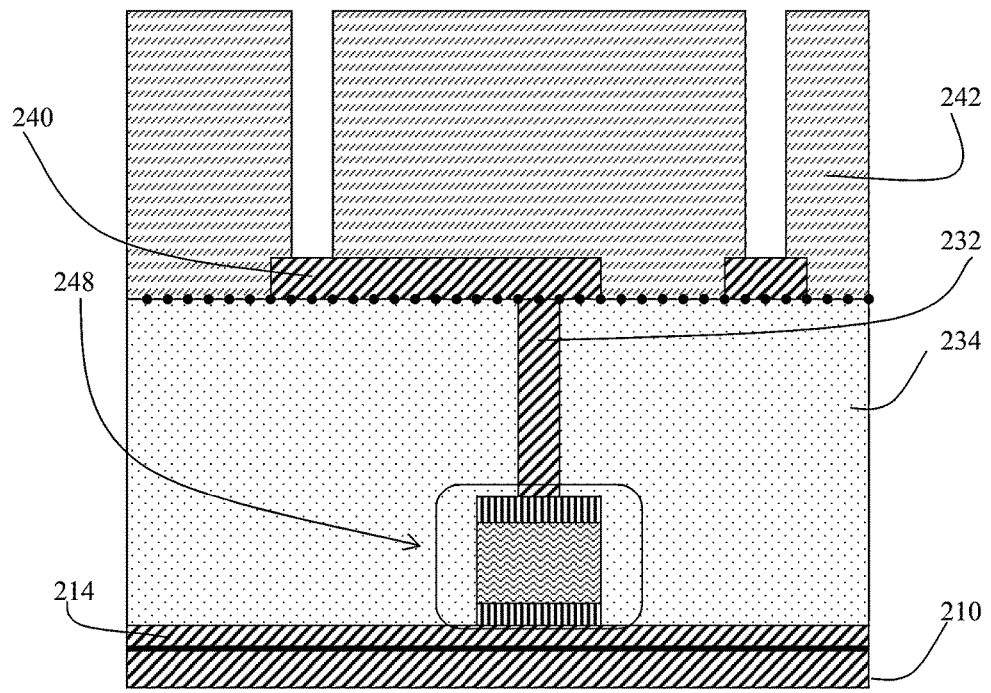
Fig. 9(xxv)
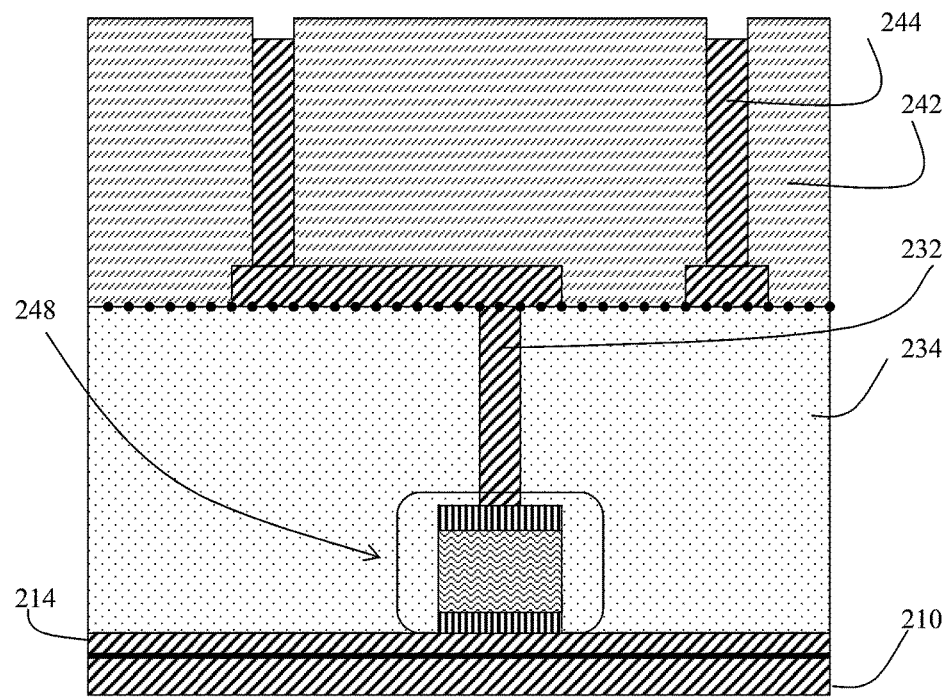
Fig. 9(xxvi)

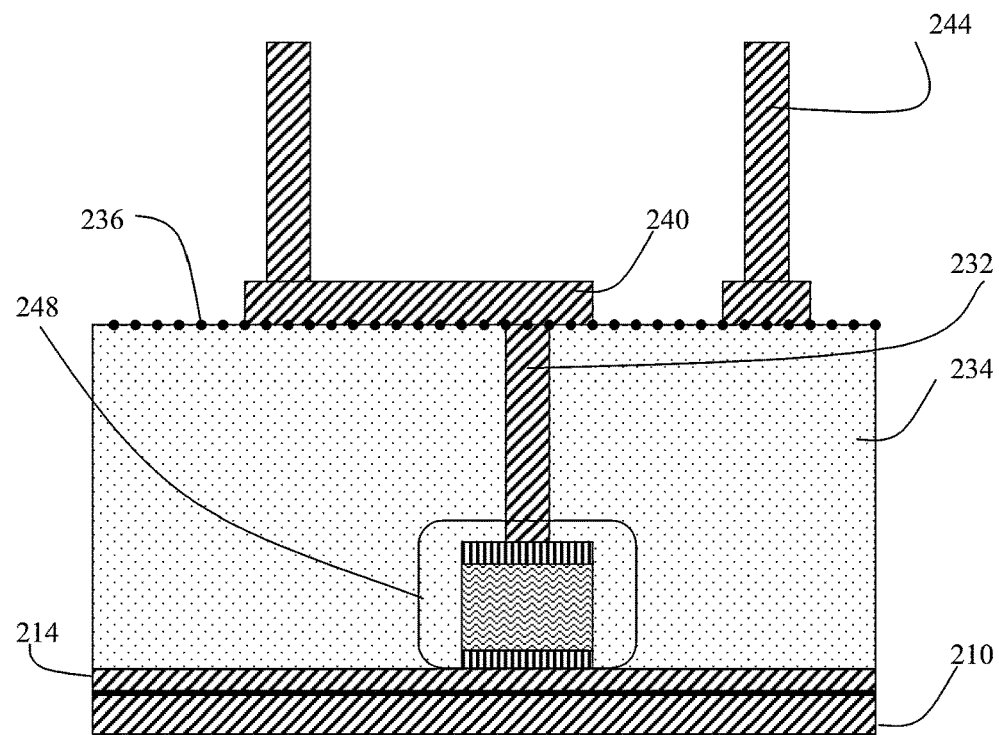
Fig. 9(xxvii)
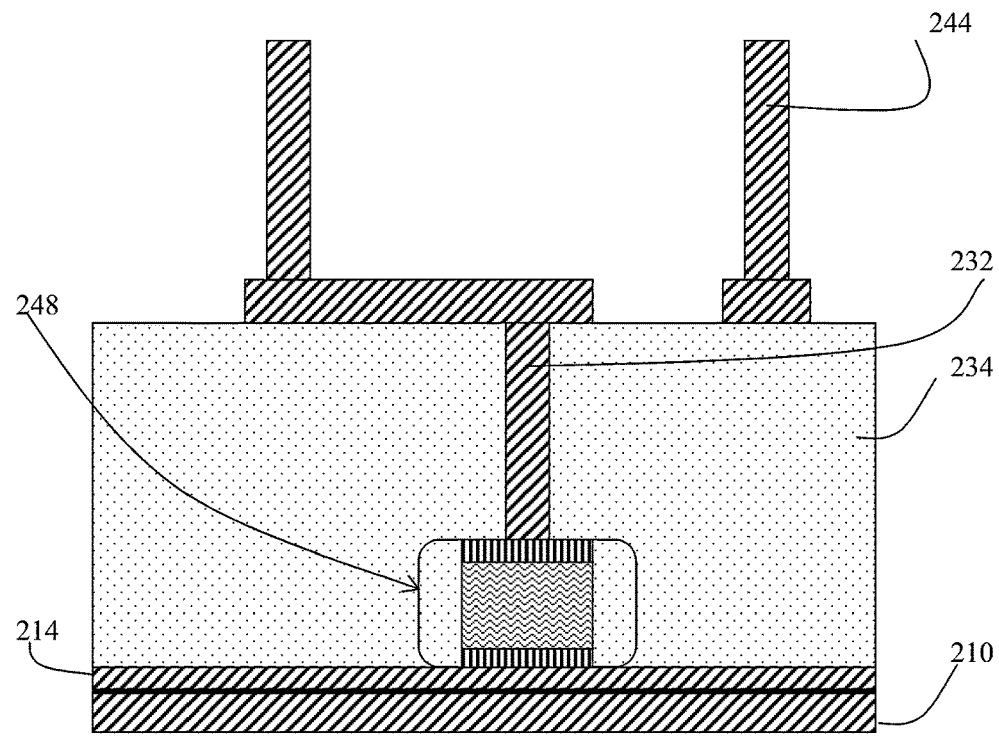
Fig. 9(xxviii)

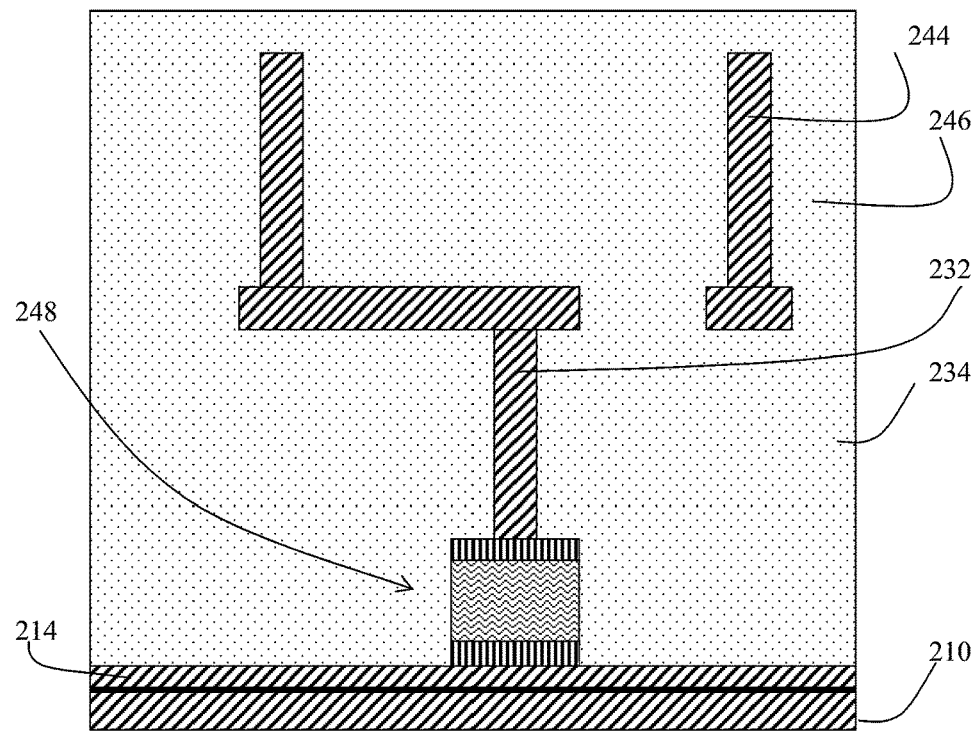
Fig. 9(xxix)
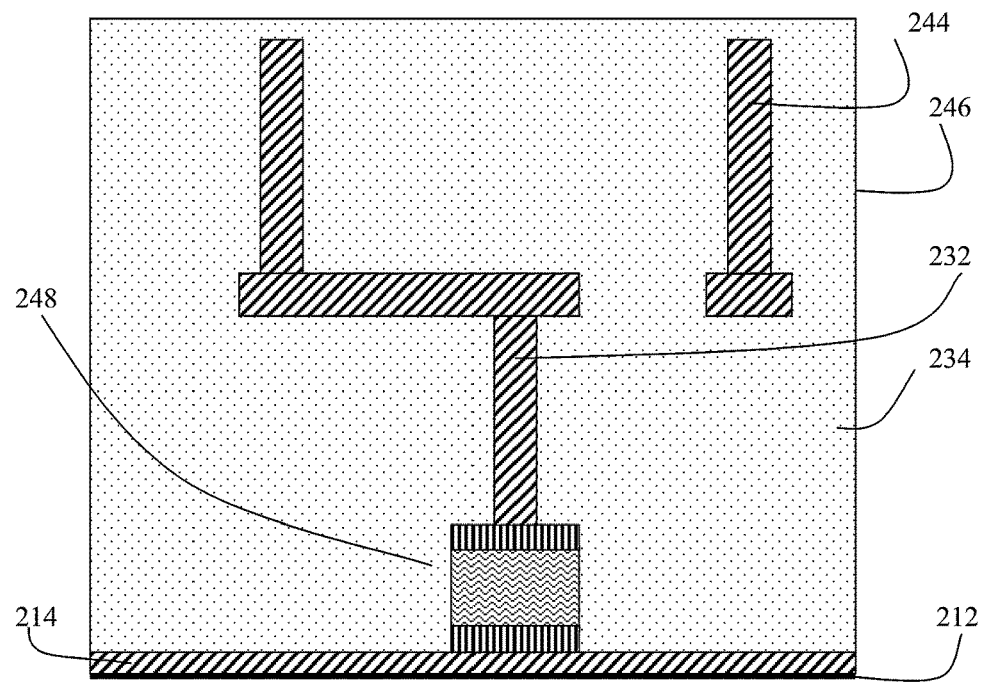
Fig. 9(xxx)

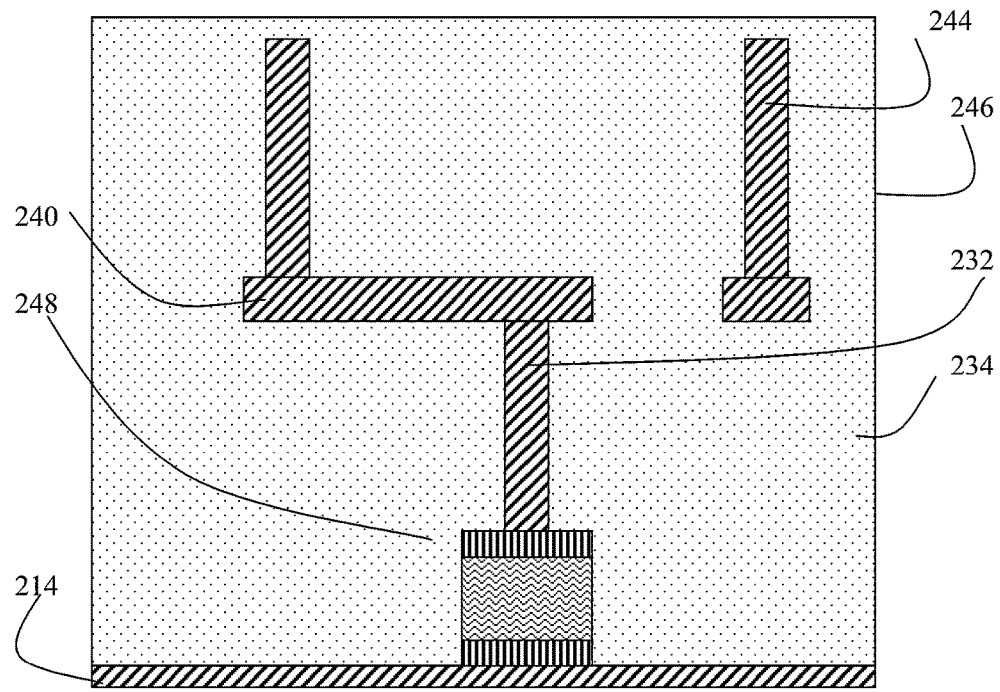
Fig. 9(xxxi)
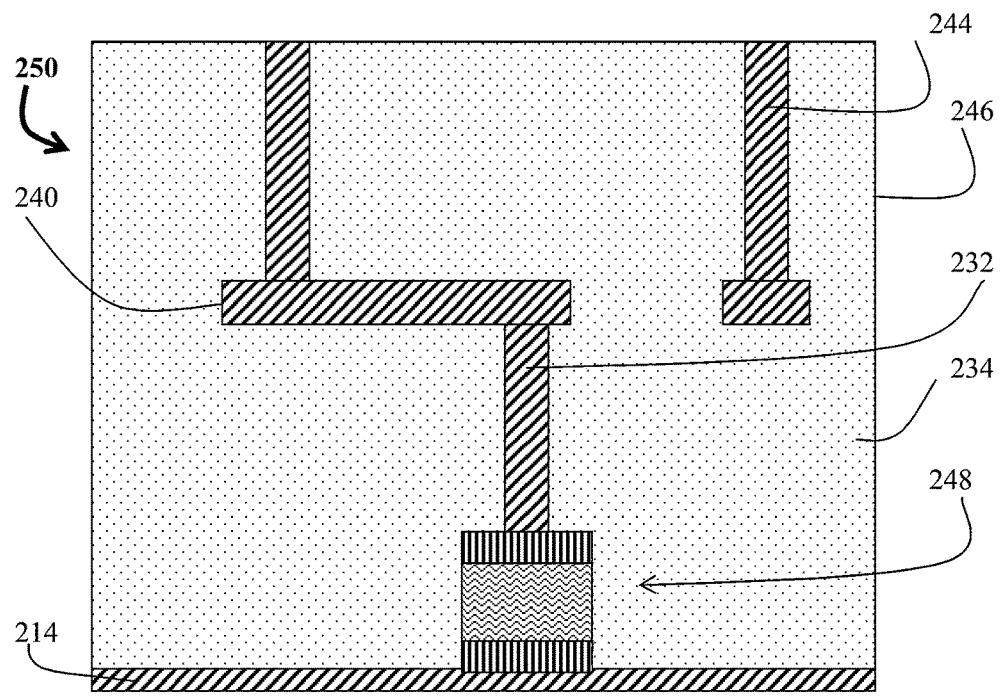
Fig. 9(xxxii)

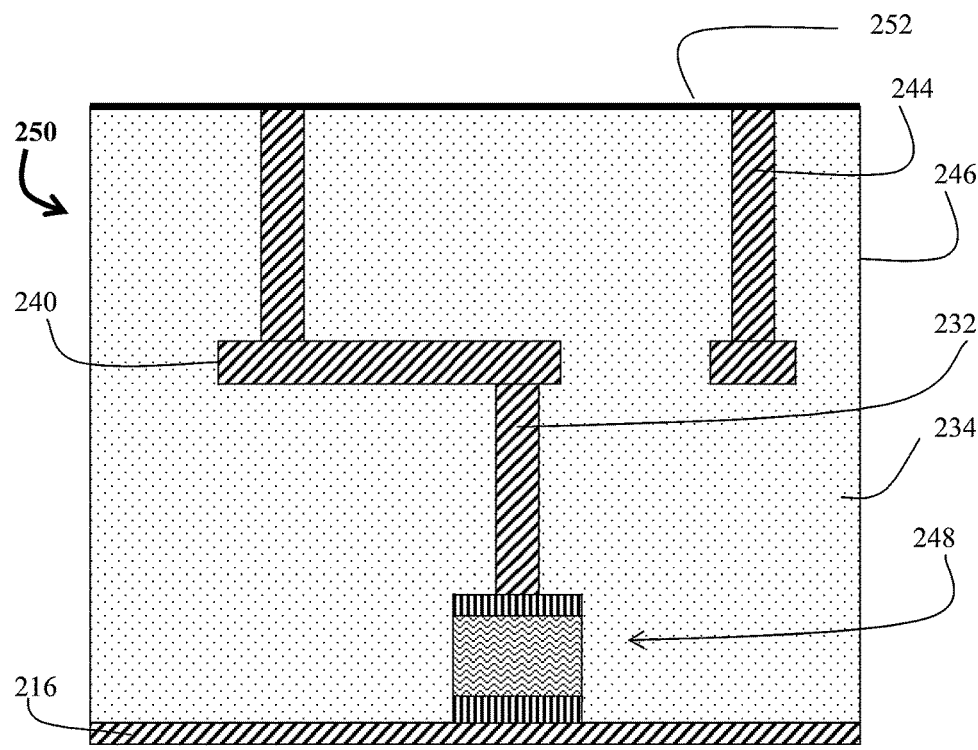
Fig. 10(xxxiii)
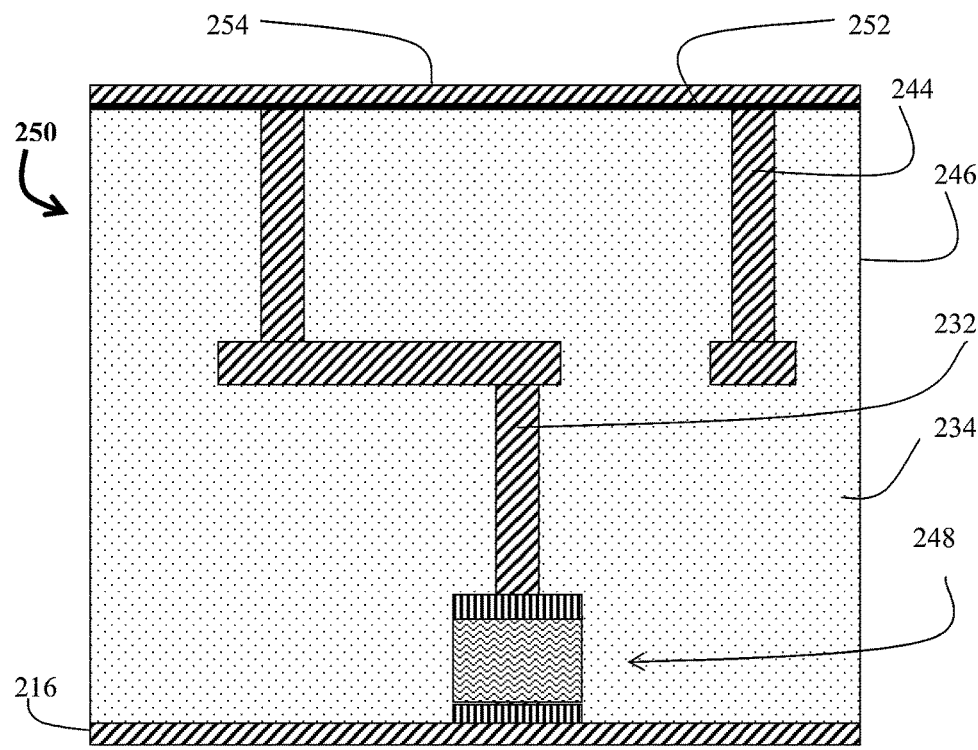
Fig. 10(xxxiv)

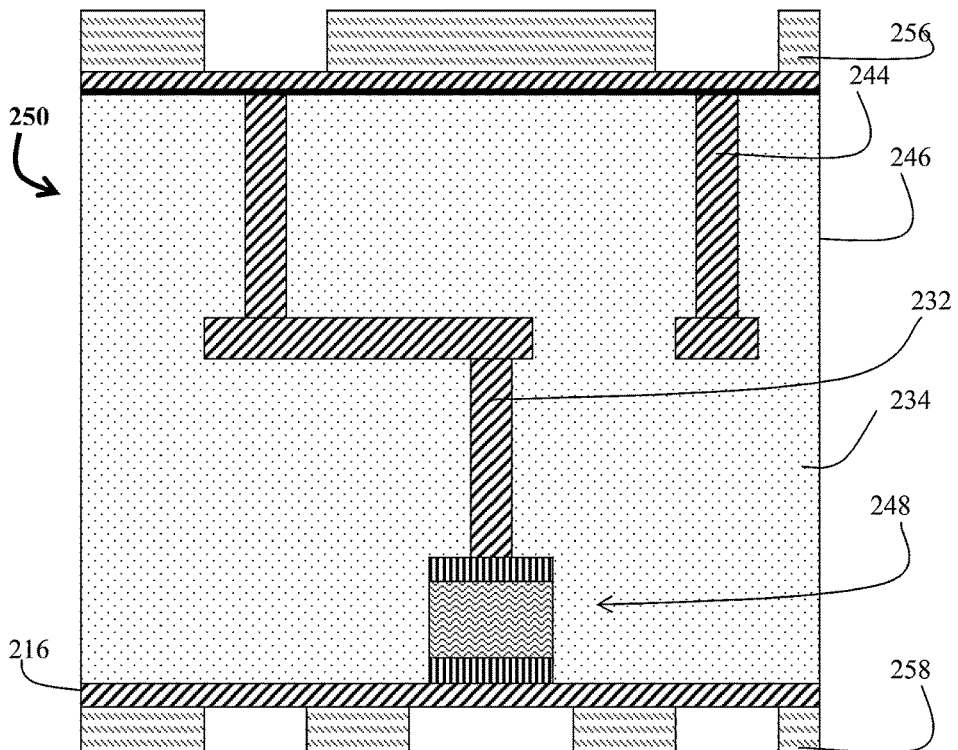
Fig. 10(xxxv)
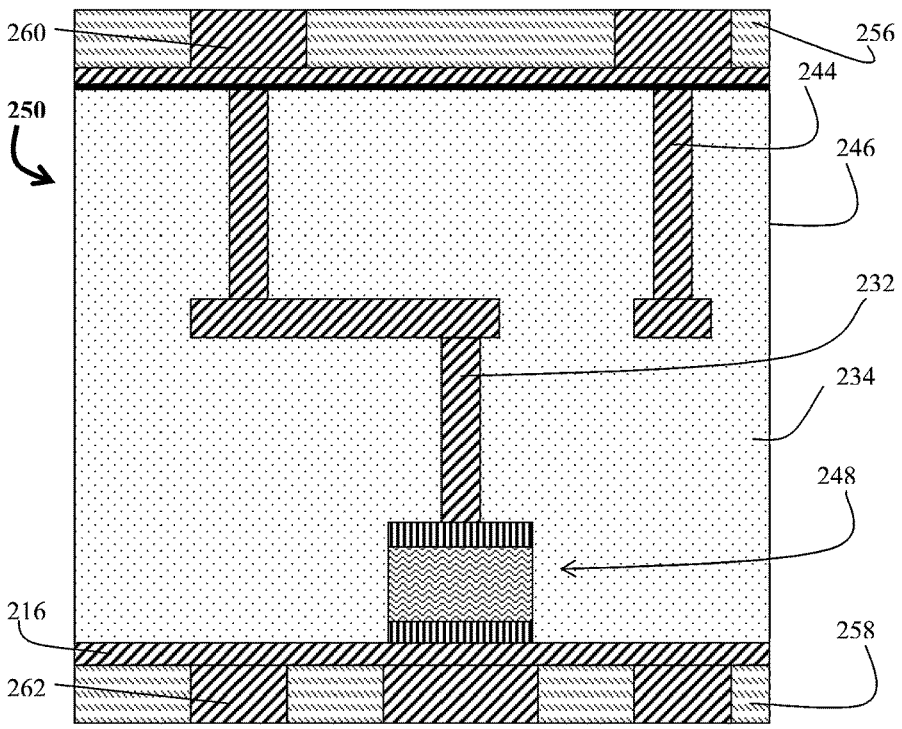
Fig. 10(xxxvi)

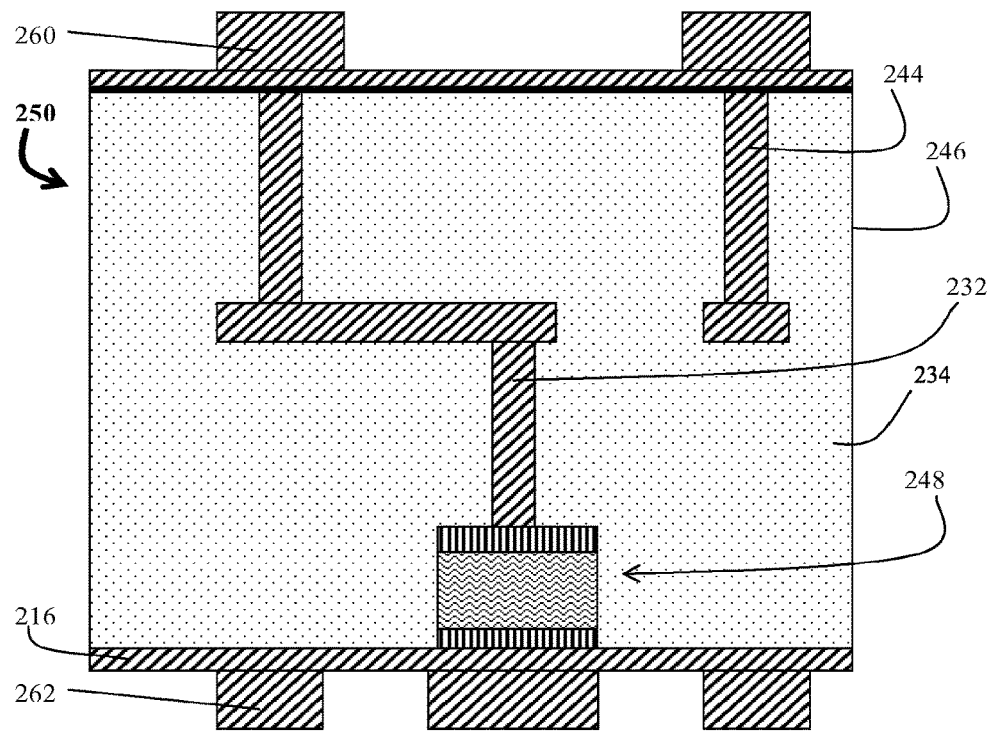
Fig. 10(xxxvii)
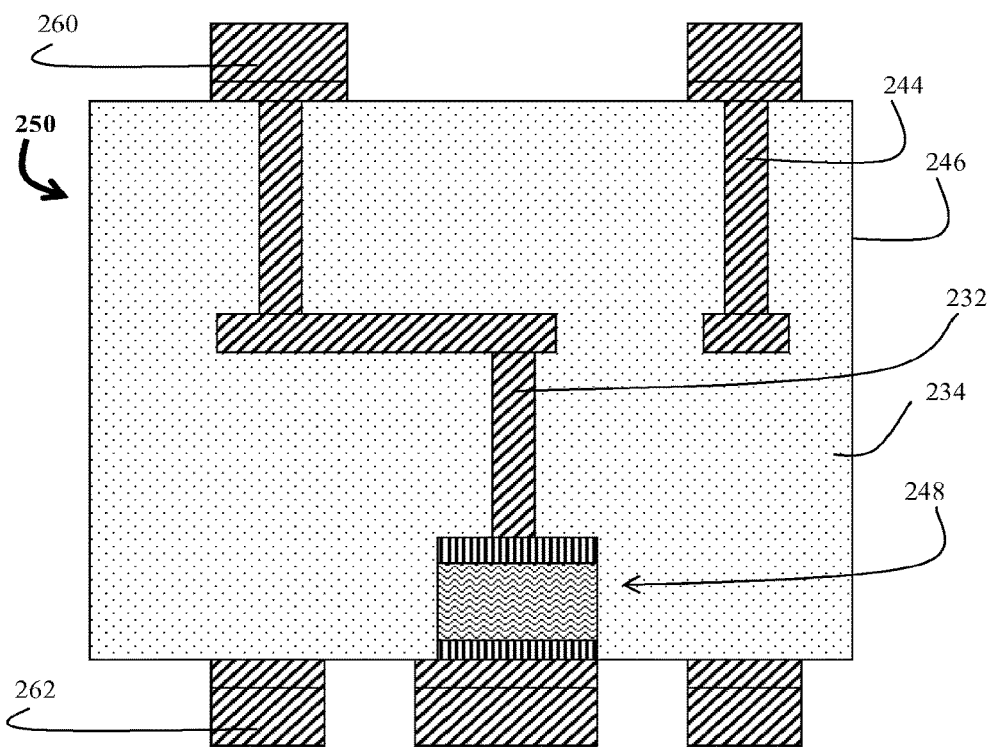
Fig. 10(xxxviii)

Fig. 10(xxxix)

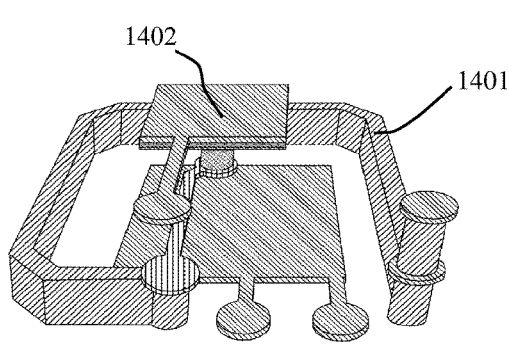
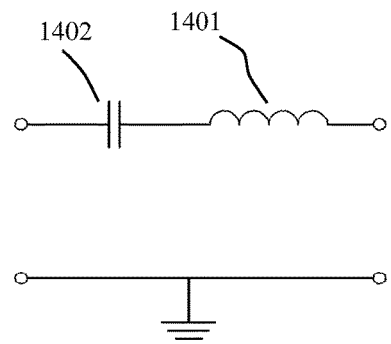
Fig. 14a          Fig. 14b
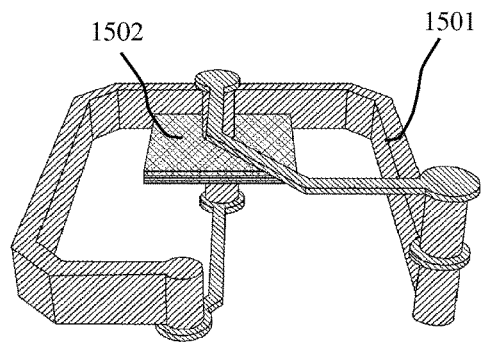
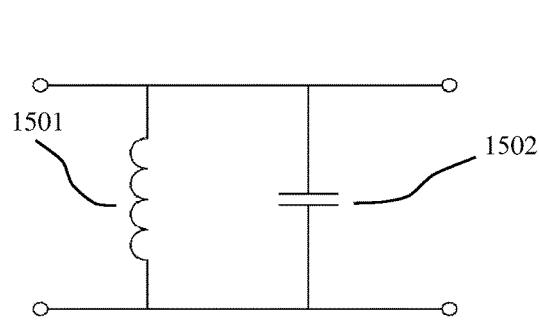
Fig. 15a          Fig. 15b
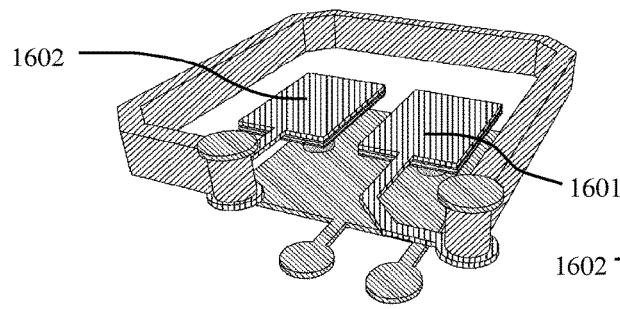
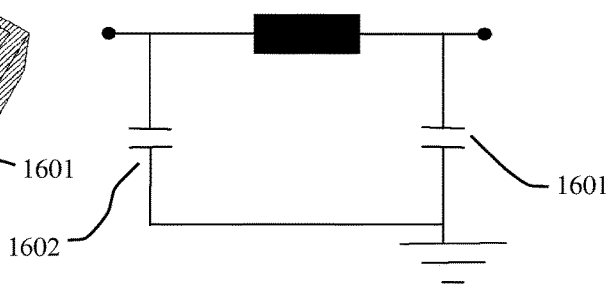
Fig. 16a          Fig. 16b

POLYMER FRAME FOR A CHIP, SUCH THAT THE FRAME COMPRISES AT LEAST ONE VIA IN SERIES WITH A CAPACITOR

The present invention claims priority from U.S. Ser. No. 13/962,075 (granted as U.S. Pat. No. 9,349,788) to Hurwitz, filed on Aug. 8, 2013, and titled "Thin Film Capacitors Embedded in Polymer Dielectric"; from U.S. Ser. No. 13/962,316 (granted as U.S. Pat. No. 10,014,843) to Hurwitz, filed on Aug. 8, 2013, and titled "Multilayer Structures and Embedded Features", and from U.S. Ser. No. 14/269,884 (abandoned) to Hurwitz, filed of May 5, 2014 and titled "Interposer Frame With Polymer Matrix and Methods of Fabrication".

BACKGROUND

Field of the Disclosure

The present invention is directed to improved chip packaging and specifically to embedded chips wherewith passive components such as capacitors and filters are incorporated within the Chip package.

Description of the Related Art

Driven by an ever greater demand for miniaturization of ever more complex electronic components, consumer electronics such as computing and telecommunication devices are becoming more integrated. This has created a need for support structures such as IC substrates and IC interposers that have a high density of multiple conductive layers and vias that are electrically insulated from each other by a dielectric material.

The general requirement for such support structures is reliability and appropriate electrical performance, thinness, stiffness, planarity, good heat dissipation and a competitive unit price.

Of the various approaches for achieving these requirements, one widely implemented manufacturing technique that creates interconnecting vias between layers uses lasers to drill holes through the subsequently laid down dielectric substrate through to the previously deposited metal layer for subsequent filling with a metal, usually copper, that is deposited therein by a plating technique. This approach to creating vias is sometimes referred to as 'drill & fill', and the vias created thereby may be referred to as 'drilled & filled vias'.

There are a number of disadvantages with the drilled & filled via approach. Since each via is required to be separately drilled, the throughput rate is limited, and the costs of fabricating sophisticated, multi-via IC substrates and interposers becomes prohibitive. In large arrays it is difficult to produce a high density of high quality vias having different sizes and shapes in close proximity to each other by the drill & fill methodology. Furthermore, laser drilled vias have rough sides walls and taper inwards through the thickness of the dielectric material. This tapering reduces the effective diameter of the vias. It may also adversely affect the electrical contact to the previous conductive metal layer—especially at ultra small via diameters, thereby causing reliability issues. Additionally, the side walls are particularly rough where the dielectric being drilled is a composite material comprising glass or ceramic fibers in a polymer matrix, and this roughness may create additional stray inductances.

The filling process of the drilled via holes is usually achieved by copper electroplating. The electroplating deposition technique may result in dimpling, where a small crater appears at the top of the via. Alternatively, overfill may result, where a via channel is filled with more copper than it can hold, and a domed upper surface that protrudes over the surrounding material is created. Both dimpling and overfill tend to create difficulties when subsequently stacking vias one on top of the other, as required when fabricating high-density substrates and interposers. Furthermore, it will be appreciated that large via channels are difficult to fill uniformly, especially when they are in proximity to smaller vias within the same interconnecting layer of the interposer or IC substrate design.

While the range of acceptable sizes and reliability is improving over time, the disadvantages described hereinabove are intrinsic to the drill & fill technology and are expected to limit the range of possible via sizes. It will further be noted that laser drilling is best for creating round via channels. Although slot shaped via channels may theoretically be fabricated by laser milling, in practice, the range of geometries that may be fabricated is somewhat limited and vias in a given support structure are typically cylindrical and substantially identical.

Fabrication of vias by drill & fill is expensive and it is difficult to evenly and consistently fill the via channels created thereby with copper using the relatively, cost-effective electroplating process.

Laser drilled vias in composite dielectric materials are practically limited to diameters of $60 \times 10^{-6}$ m (60 microns), and even so suffer from significant tapering and rough side walls due to the nature of the composite material drilled and in consequence of the ablation process involved.

In addition to the other limitations of laser drilling as described hereinabove, there is a further limitation of the drill & fill technology in that it is difficult to create different diameter vias in the same layer, since when drill different sized via channels are drilled and then filled with metal to fabricate different sized vias, the via channels fill up at different rates. Consequently, the typical problems of dimpling or overfill that characterize drill & fill technology are exasperated, since it is impossible to simultaneously optimize deposition techniques for different sized vias.

An alternative solution that overcomes many of the disadvantages of the drill & fill approach, is to fabricate vias by depositing copper or other metal into a pattern created in a photo-resist, using a technology otherwise known as 'pattern plating'.

In pattern plating, a seed layer is first deposited. Then a layer of photo-resist is deposited thereover and subsequently exposed to create a pattern, and selectively removed to make trenches that expose the seed layer. Via posts are created by depositing Copper into the photo-resist trenches. The remaining photo-resist is then removed leaving the upstanding via posts, the seed layer is etched away, and a dielectric material, that is typically a polymer impregnated glass fiber mat, is laminated thereover and therearound to encase the vias posts. Various techniques and processes can then be used to planarize the dielectric material, removing part of it to expose the tops of the via posts to allow conductive connection to ground thereby, for building up the next metal layer thereupon. Subsequent layers of metal conductors and via posts may be deposited there onto by repeating the process to build up a desired multilayer structure.

In an alternative but closely linked technology, known hereinafter as 'panel plating', a continuous layer of metal or alloy is deposited onto a substrate. A layer of photo-resist is deposited on top of the substrate, and a pattern is developed therein. The pattern of developed photo-resist is stripped away, selectively exposing the metal thereunder, which may then be etched away. The undeveloped photo-resist protects the underlying metal from being etched away, and leaves a pattern of upstanding features and vias.

After stripping away the undeveloped photo-resist, a dielectric material, such as a polymer impregnated glass fiber mat, may be laminated around and over the upstanding copper features and/or via posts. After planarizing, subsequent layers of metal conductors and via posts may be deposited there onto by repeating the process to build up a desired multilayer structure.

The via layers created by pattern plating or panel plating methodologies described above are typically known as 'via posts' and feature layers from copper.

It will be appreciated that the general thrust of the microelectronic evolution is directed towards fabricating ever smaller, thinner, lighter and more powerful products having high reliability. The use of thick cored interconnects prevents ultra-thin products being attainable. To create ever higher densities of structures in the interconnect IC substrate or 'interposer', ever more layers of ever smaller connections are required. Indeed, sometimes it is desirable to stack components on top of each other.

If plated laminated structures are deposited on a copper or other appropriate sacrificial substrate, the substrate may be etched away leaving free standing, coreless laminar structures. Further layers may be deposited on the side previously adhered to the sacrificial substrate, thereby enabling a two sided build up, which minimizes warping and aids the attaining of planarity.

One flexible technology for fabricating high density interconnects is to build up pattern or panel plated multilayer structures consisting of metal vias or features in a dielectric matrix. The metal may be copper and the dielectric may be a fiber reinforced polymer. Typically a polymer with a high glass transition temperature ($T_g$) is used, such as polyimide, for example. These interconnects may be cored or coreless, and may include cavities for stacking components. They may have odd or even numbers of layers. Enabling technology is described in previous patents issued to Amitec-Advanced Multilayer Interconnect Technologies Ltd.

For example, U.S. Pat. No. 7,682,972 to Hurwitz et al. titled "Advanced multilayer coreless support structures and method for their fabrication" describes a method of fabricating a free standing membrane including a via array in a dielectric for use as a precursor in the construction of superior electronic support structures. The method includes the steps of fabricating a membrane of conductive vias in a dielectric surround on a sacrificial carrier, and detaching the membrane from the sacrificial carrier to form a free standing laminated array. An electronic substrate based on such a free standing membrane may be formed by thinning and planarizing the laminated array, followed by terminating the vias. This publication is incorporated herein by reference in its entirety.

U.S. Pat. No. 7,669,320 to Hurwitz et al. titled "Coreless cavity substrates for chip packaging and their fabrication" describes a method for fabricating an IC support for supporting a first IC die connected in series with a second IC die; the IC support comprising a stack of alternating layers of copper features and vias in insulating surround, the first IC die being bondable onto the IC support, and the second IC die being bondable within a cavity inside the IC support, wherein the cavity is formed by etching away a copper base and selectively etching away built up copper. This publication is incorporated herein by reference in its entirety.

U.S. Pat. No. 7,635,641 to Hurwitz et al. titled "integrated circuit support structures and their fabrication" describes a method of fabricating an electronic substrate comprising the steps of; (A) selecting a first base layer; (B) depositing a first etchant resistant barrier layer onto the first base layer; (C) building up a first half stack of alternating conductive layers and insulating layers, the conductive layers being interconnected by vias through the insulating layers; (D) applying a second base layer onto the first half stack; (E) applying a protective coating of photo-resist to the second base layer; (F) etching away the first base layer; (G) removing the protective coating of photo-resist; (H) removing the first etchant resistant barrier layer; (I) building up a second half stack of alternating conductive layers and insulating layers, the conductive layers being interconnected by vias through the insulating layers, wherein the second half stack has a substantially symmetrical lay up to the first half stack; (J) applying an insulating layer onto the second hall stack of alternating conductive layers and insulating layers, (K) removing the second base layer, and (L) terminating the substrate by exposing ends of vias on outer surfaces of the stack and applying terminations thereto. This publication is incorporated herein by reference in its entirety.

Over time, it is anticipated that both drill & fill technologies and via post deposition will enable fabrication of substrates with further miniaturization and higher densities of vias and features. Nevertheless, it would appear likely that developments in via post technology will maintain a competitive edge.

Substrates enable chips to interface with other components. Chips have to be bonded to substrates through assembly processes that provide reliable electronic connections to enable electronic communication between chips and substrates.

Embedding chips within the interposers to the outside world enables shrinking the chip package, shortening the connections to the outside world, offers cost savings by simpler manufacturing that eliminates die to substrate assembly processes and potentially has increased reliability.

Essentially, the concept of embedding active components such as analog, digital and MEMS chips involves the construction of chip support structures or substrates, having vias around the chip.

One way of achieving embedded chips is to fabricate chip support structures onto the chip array on the wafer where the circuitry of the support structure is larger than the die unit size. This is known as Fan Out Wafer Layer Packaging (FOWLP). Although the size of silicon wafers is growing, expensive material sets and manufacturing process are still limiting the wafer diameter size to 12", thereby limiting the number of FOWLP units one can place on the wafer. Despite the fact that 18" wafers are under consideration, the investment required, materials sets and equipment are still unknown. The limited number of chip support structures that may be processed at one time increases the unit cost of FOWLP, and make it too expensive for markets requiring highly competitive pricing, such as wireless communication, home appliances and automotive markets.

FOWLP also represents a performance limitation since the metal features placed over the silicon wafer as fan-out or fan-in circuitry are limited in thickness to a few microns. This creates electrical resistance challenges.

An alternative fabrication route involves sectioning the wafer to separate the chips and embedding the chips within a panel consisting of dielectric layers with copper interconnects. One advantage of this alternative route is that the panels may be very much larger with very many more chips embedded in a single process. For example, whereas for example, a 12" wafer enables 2,500 FOWLP chips having dimensions of 5 mm×5 mm to be processed in one go, current panels used the applicant, Zhuhai Access, are 25"×21", enabling 10,000 chips to be processed in one go. Since the price of processing such panels is significantly cheaper than on wafer processing, and since the throughput per panel is 4× higher than throughput on wafer, the unit cost can drop significantly, thereby opening new markets.

In both technologies, the line spacing and the width of the tracks used in industry are shrinking over time, with 15 micron going down to 10 microns being standard on panels and 5 microns going down to 2 microns on wafers.

The advantages of embedding are many. First level assembly costs, such as wire bonding, flip chip or SMD (Surface Mount Devices) soldering, are eliminated. The electrical performance is improved since the die and substrate are seamlessly connected within a single product. The packaged dies are thinner, giving an improved form factor, and the upper surface of the embedded die package is freed up for other uses including further space saving configurations such as those using stacked die and PoP (Package on Package) technologies.

In both FOWLP and Panel based embedded die technologies, the chips are packaged as an array (on wafer or panel), and, once fabricated, are separated by dicing.

RF (Radio Frequency) technologies, such as Wi-Fi, Bluetooth and the like, are becoming widely implemented in various devices, including mobile phones and automobiles.

In addition to Base Band processing and memory chips, RF devices in particular, require passive components such as capacitors, inductors and filters of various sorts. Such passive components may be surface mounted, but to enable ever greater miniaturization and cost savings, such devices may be embedded within the substrate.

U.S. Ser. No. 13/962,075 to Hurwitz, filed on Aug. 8, 2013, and titled "Thin Film Capacitors Embedded in Polymer Dielectric" describes a substrate comprising a capacitor consisting of metal electrodes and a ceramic or metal oxide dielectric layer, the capacitor is embedded in a polymer based encapsulating material and may be connected to a circuit by a via post standing on said capacitor.

U.S. Ser. No. 13/962,316 filed on Aug. 8, 2013, and titled "Multilayer Structures and Embedded Features" describes a composite electronic structure comprising at least one feature layer and at least one adjacent via layer; the layers extending in an X-Y plane and having height z, wherein the structure comprises at least one capacitor coupled in series or in parallel to at least one inductor to provide at least one filter; the at least one capacitor being sandwiched between the at least one feature layer and at least one via in said at least adjacent via layer, such that the at least one via stands on the at least one capacitor, and the at least one of the first feature layer and the adjacent via layer includes at least one inductor extending in the XY plane.

U.S. Ser. No. 14/269,884 to Hurwitz, filed of May 5, 2014 and titled "Interposer Frame with Polymer Matrix and Methods of Fabrication" teaches an array of chip sockets defined by an organic matrix framework surrounding sockets through the organic matrix framework and further comprising a grid of metal vias through the organic matrix framework. Chips may be placed in the sockets and then held in place by a polymer based dielectric, thereby embedding the chip in the frame.

BRIEF SUMMARY

The present invention claims priority from U.S. Ser. No. 13/962,075 to Hurwitz, filed on Aug. 8, 2013, and titled "Thin Film Capacitors Embedded in Polymer Dielectric"; from U.S. Ser. No. 13/962,316 to Hurwitz, filed on Aug. 8, 2013, and titled "Multilayer Structures and Embedded Features", and from U.S. Ser. No. 14/269,884 to Hurwitz, filed of May 5, 2014 and titled "Interposer Frame With Polymer Matrix and Methods of Fabrication".

A first aspect is directed to a chip socket defined by an organic matrix framework, wherein the organic matrix framework comprises at least one via post layer where at least one via through the framework around the socket includes at least one capacitor comprising a lower electrode, a dielectric layer and an upper electrode in contact with the via post.

Typically the dielectric of the capacitor comprises at least one of the group consisting of $Ta_2O_5$, $TiO_2$, $Ba_xSr_{1-x}TiO_3$, $BaTiO_3$, and $Al_2O_3$.

Typically, the lower electrode of the capacitor comprises a noble metal.

Optionally, the lower electrode comprises a metal selected from the group consisting of gold, platinum and tantalum.

In some embodiments, the upper electrode comprises a metal selected from the group consisting of gold, platinum and tantalum.

Typically, the at least one via stands on the at least one capacitor.

Optionally, the upper electrode comprises the via post.

Preferably, the capacitor has a cross-sectional area defined by a cross-sectional area of the via post, that is carefully controlled to tune capacitance of capacitor.

In some embodiments, the at least one capacitor has a capacitance of between 1.5 pF and 300 pF.

In preferred embodiments, the at least one capacitor has a capacitance of between 5 pF and 15 pF.

Optionally, the framework further comprises at least one feature layer.

Optionally, at least one electronic component is embedded within the socket and is electrically coupled to the at least one via.

Optionally, the at least one electronic component comprises a second capacitor.

In some embodiments, the second capacitor is a discrete component having a metal termination on at least one end.

In some embodiments, the second capacitor is a Metal-Insulator-Metal (MIM) capacitor.

In some embodiments, the Metal-Insulator-Metal (MIM) capacitor comprises a dielectric layer consisting of at least one of the group consisting of $Ta_2O_5$, $TiO_2$, $Ba_xSr_{1-x}TiO_3$, $BaTiO_3$ and $Al_2O_3$.

In some embodiments, a lower electrode of the Metal-Insulator-Metal (MIM) capacitor comprises a noble metal.

In some embodiments, the lower electrode comprises a metal selected from the group consisting of gold, platinum and tantalum.

In some embodiments, an upper electrode of the Metal-Insulator-Metal (MIM) comprises a metal selected from the group consisting of gold, platinum and tantalum.

Optionally, the Metal-Insulator-Metal (MIM) capacitor is attached to an insulator carrier.

In some embodiments, the insulator carrier comprises at least one of the group consisting of silicon (Si), $SiO_2$ (silica), glass, AlN, alumina and c-plane sapphire $Al_2O_3$ (0001).

In some embodiments, plates of the Metal-Insulator-Metal (MIM) capacitor are coupled to vias by feature layers.

Typically, the component embedded within the socket is coupled by at least one feature layer to the at least one via having an embedded capacitor.

Optionally, the system further comprises a feature layer on one side of the frame and the embedded components comprise an inductor.

Optionally, the embedded components within the frame, the embedded components within the socket and at least one feature within the feature layer provide a circuit that serves as a filter.

Optionally, the filter is selected from the group consisting of basic LC low pass filters, LC high pass filters, LC series band pass filters, LC parallel band pass filters and Low Pass Parallel-Chebyshev filters.

Optionally, a chip mounted in a socket is protected from electromagnetic radiation by a Faraday cage comprising via posts within the frame, thereby minimizing electromagnetic interference.

In some embodiments, the Faraday cage further comprises feature layers within the frame.

A further aspect is directed to a framework comprising a plurality of sockets for accepting a plurality of chips, wherein each socket comprises a frame and the framework comprises a grid-work of copper via posts and at least one capacitor.

Optionally, a processor chip is embedded in one socket and a passive chip comprising at least one capacitor is embedded in a second socket.

A further aspect is directed to a framework comprising a plurality of chip sockets arranged as an array wherein each chip socket is surrounded by a frame.

Optionally, at least one processor chip is embedded in at least one socket.

A further aspect is directed to an array of chip sockets defined by an organic matrix framework of frames surrounding sockets and further comprising a grid of metal via posts through the organic matrix framework wherein at least one metal via post is coupled in series with at least one capacitor.

Optionally, the capacitor comprises a lower electrode and a dielectric layer and is incorporated at a base of the at least one via post, such that the at least one via post stands on the at least one capacitor.

Optionally, the at least one via post comprises an upper electrode of the at least one capacitor.

Optionally, the frame comprises at least one feature layer wherein at least one inductor is formed in the at least one feature layer.

Typically, the organic matrix framework further comprises glass fiber bundles.

Typically, each via is in the range of 25 micron to 500 micron wide.

Typically, each via is cylindrical and has a diameter in the range of 25 micron to 500 micron.

Typically a frame around at least one socket comprises alternating via posts and feature layers and comprises at least one via post layer and one feature layer.

Typically the organic matrix framework comprises a plurality of layers and the grid-work comprises a plurality of via post layers, wherein each pair of consecutive via post layers is separated by a feature layer.

In some embodiments, a frame around at least one socket comprises a continuous coil of alternating via posts and features spanning at least one via post layer and one feature layer.

Optionally, at least one via posts comprises an elongated via post.

Optionally, a continuous coil of elongated vias posts spans a plurality of via post layers.

Optionally, the array comprises adjacent chip sockets of different dimensions.

Optionally, the array comprises adjacent chip sockets of different size.

Optionally, the array comprises adjacent chip sockets of different shape.

Optionally, the framework comprises at least one feature layer and at least one adjacent via layer, said layers extending in an X-Y plane and having height z, wherein the composite electronic structure comprises at least one capacitor coupled with at least one inductor, the at least one capacitor comprising a lower electrode and a dielectric layer and is incorporated at a base of a via layer sandwiched between the at least one feature layer and a via post such that the at least one via stands on the at least one capacitor and optionally forms an upper electrode, wherein the via layer is embedded in a polymer matrix, and wherein the at least one inductor is formed in at least one of the first feature layer and the adjacent via layer.

Optionally, at least one capacitor and the at least one inductor are coupled in series.

Optionally, the frame comprises at least a second feature layer over the via layer, and the at least one capacitor and the at least one inductor are coupled in parallel via the feature layer.

Optionally, the at least one inductor is fabricated in the feature layer.

Optionally, the at least one inductor is spirally coiled.

Optionally, the inductance of the inductor is at least 0.1 nH.

Optionally, the inductance of the inductor is less than 50 nH.

Optionally, a further inductor is fabricated in a via layer.

Optionally, the inductance of the further inductor is at least 0.1 nH.

Optionally, at least one inductor and said at least one capacitor provide a filter selected from the group consisting of basic LC low pass filters, LC high pass filters, LC series band pass filters, LC parallel band pass filters and Low Pass Parallel-Chebyshev filters.

Optionally, at least one socket contains a chip comprising at least one capacitor within a polymer matrix and the framework and chip are thinned to expose ends of vias and connections and terminations are applied by laying down photo-resist on each side of the thinned polymer matrix and by depositing copper pads into the pattern of photo-resist, the photo-resist is then stripped away and solder-mask is laid down between the copper pads, and a protective coating is applied.

A further aspect is directed to a panel comprising an array of chip sockets, each surrounded and defined by an organic matrix framework comprising a grid of copper via posts through the organic matrix framework, wherein said panel comprises at least one region having sockets with a first set of dimensions for receiving one type of chip, and a second region having sockets with a second set of dimensions for receiving a second type of chip and where at least one via post includes a thin film capacitor.

Optionally, with the panel, at least one via post stands on the thin film capacitor.

Optionally, the at least one via post comprises an upper electrode of the thin film capacitor.

Optionally, the panel comprises a region with two different socket types in close proximity.

The combination of frames having inbuilt capacitors around chip sockets provides greater miniaturization, manufacturing economies and enhanced reliability for RF (Radio Frequency) technologies, such as Wi-Fi, Bluetooth and the like, which are widely used in mobile phones and automobiles, for example.

The protective coating may be selected from ENEPIG and an organic varnish.

The term microns or tm refers to micrometers, or $10^{-6}$ m.

BRIEF DESCRIPTION OF THE DRAWINGS

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice. In the accompanying drawings:

FIG. 3 is a schematic projection of an inductor within a feature layer and an adjacent via post in a via post layer standing on a capacitor that is coupled in series with the inductor;

FIG. 4 is a schematic projection of an inductor via within a via layer coupled in series with a capacitor at a base of a via post;

FIG. 5 is a schematic projection of a pair of inductors, one within a feature layer and one within a via layer, coupled in series to each other and to a capacitor at the base of a via post within the via layer of the via inductor;

FIG. 6 is a schematic projection of an inductor in a feature layer, coupled in parallel with a capacitor, the capacitor and the inductor being coupled together by via posts and a trace in a second, upper feature layer or on the outside of the multilayer structure;

FIG. 7 is a schematic projection of an inductor in a feature layer, coupled in series with an inductive via, and in parallel with a capacitor, the capacitor and the inductive via being coupled together by a trace in a second, upper feature layer or on the outside of the multilayer structure.

FIG. 9(i) to FIG. 9(xxxii) are a series of schematic cross section illustrations illustrating a process for fabricating a substrate with an embedded filter consisting of a capacitor and inductor , each illustration matching the corresponding step of FIG. 9;

FIG. 10(xxxiii) to FIG. 10(xL) are a series of schematic cross section illustrations illustrating a process for termination a substrate with an embedded filter, each illustration matching the corresponding step of FIG. 10;

FIG. 11 is a schematic illustration of a frame with a three layer coil embedded therein consisting of elongated vias, and including an embedded capacitor, showing the flexibility of the manufacturing technique and how it may be used to fabricate embedded filters and the like;

FIG. 12c is a schematic cross section of the basic LC low pass filter of FIG. 12a;

FIG. 14a is a schematic three dimensional view of a basic LC band pass series filter;

FIG. 14b shows how the basic LC band pass series filter of FIG. 14a may be represented as an LC filter circuit component;

FIG. 15a is a schematic three dimensional view of basic LC band pass parallel filter comprising a capacitor and inductors;

FIG. 15b shows how the basic LC band pass parallel filter of FIG. 15a may be represented as an LC filter circuit component;

FIG. 16a is a schematic three dimensional view of a Low Pass Parallel-Chebyshev Filter, and FIG. 16b shows how the Low Pass Parallel-Chebyshev Filter may be represented as an LC filter.

Figure 1:
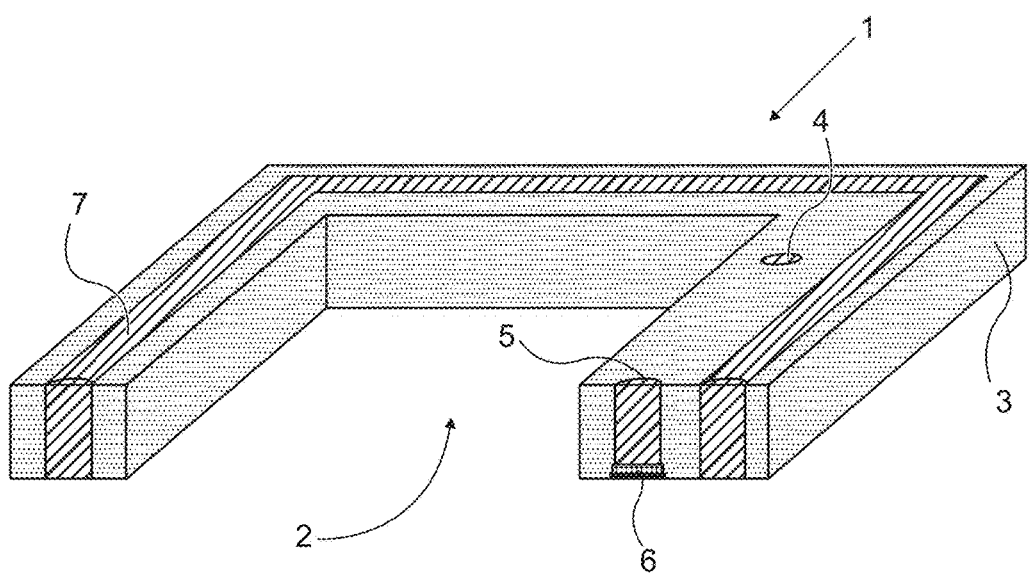
FIG. 1 is a schematic isometric projection with the front cut-away, of a polymer based dielectric frame defining a socket, wherein the frame has embedded via posts, at least one of which includes a thin film capacitor.

It will be appreciated that the Figures are schematic illustrations only, and are not to scale. Very thin layers may appear thick. The width of features may appear out of proportion to their length, etc.

In particular, it will be noted that due to the desire towards ever greater miniaturization, equivalent structures may be arranged to have very different spatial arrangements, and may thus look somewhat different.

DETAILED DESCRIPTION

In the description hereinbelow, sockets structures for embedding chips are considered. The socket structures consist of metal vias in a dielectric matrix, particularly, copper via posts in a polymer matrix, such as polyimide, epoxy or BT (Bismaleimide/Triazine) or their blends, reinforced with glass fibers.

The socket structures described below further comprise capacitors built into the frame of the socket. Such capacitors are typically Metal Insulator Metal (M-I-M) Capacitors which comprises a lower metal electrode that may be gold, tantalum or tantalum, and an inorganic dielectric layer that may be $Ta_2O_5$, $TiO_2$, $Ba_xSr_{1-x}TiO_3$, $BaTiO_3$ or $Al_2O_3$, for example. The capacitor may comprise a dedicated upper electrode that is typically gold, tantalum or tantalum, or, the via, typically copper, may be deposited thereover as the upper electrode.

Since parallel plate capacitors comprise a dielectric material sandwiched between electrodes that is typically a material with a very high dielectric constant, the dielectric material used for encapsulation is referred to hereinbelow as an encapsulation dielectric to differentiate it from the dielectric of the capacitor.

The figures are illustrative, and no attempt is made to indicate scale. Furthermore, small numbers of vias and individual capacitors and filters are shown, whereas a socket frame may include several capacitors and filters and large numbers of vias. Indeed, typically large arrays of socket frames are cofabricated.

Where vias are fabricated with drill & fill technology, the vias generally have a substantially circular cross-section, as they are fabricated by first drilling a laser hole in the dielectric. Since the encapsulating dielectric is heterogeneous and anisotropic, and consists of a polymer matrix with inorganic fillers and glass fiber reinforcements, the circular cross-section of the via is typically rough edged and may also be slightly distorted from a true circular shape. Furthermore, typically drill and fill vias tend to taper somewhat, being inverse frusto-conical instead of cylindrical.

Using the 'drill & fill' via approach, it becomes prohibitive to fabricate non-circular vias due to difficulties in cross-section control and shape. There is also a minimum via size of about 50-60 micron diameter due to the limitations of the laser drilling. These difficulties were described at length in the background section hereinabove and are related, inter-alia, to dimpling and/or domed shaping that result from the copper via fill electro-plating process, via tapering shape and side wall roughness that result from the laser drilling process and the higher cost that results from using the expensive laser drilling machine for milling slots, in a 'routing' mode to generate trenches in the polymer/glass dielectrics.

In addition to the other limitations of laser drilling as described hereinabove, there is a further limitation of the drill & fill technology in that it is difficult to create different diameter vias in the same layer, since when different sized via channels are drilled and then simultaneously filled with metal to simultaneously fabricate different sized vias, the via channels fill up at different rates. Consequently, the typical problems of dimpling or overfill (doming) that characterize drill & fill technology are exasperated, since it is impossible to simultaneously optimize deposition techniques for different sized vias. Thus in practical applications, drill & fill vias have substantially circular cross-sections albeit sometimes distorted somewhat due to the heterogeneous nature of the substrate, and all vias have substantially similar cross-sections.

Furthermore, it will be noted that laser drilled vias in composite dielectric materials such as polyimide/glass or epoxy/glass or BT (Bismaleimide/Triazine)/glass or their blends with ceramic and/or other filler particles, are practically limited to about $60 \times 10^{-6}$ m diameter, and even so suffer from significant tapering shape as well as rough side walls due to the nature of the composite material drilled, in consequence of the ablation process involved.

It is a feature of Access' photo-resist and pattern or panel plating and laminating technology, as described in U.S. Pat. Nos. 7,682,972, 7,669,320 and 7,635,641 to Hurwitz et al., incorporated herein by reference, that there is no effective upper limit to the in-plane dimensions of a feature.

An alternative, more accurate and more flexible manufacturing technique than drill and fill consists of plating both copper via layers and feature layers within a pattern developed in a photo-resist (pattern plating), or by panel plating a layer of copper and then selectively etching superfluous material away. Both these routes leave up standing via posts and up standing features. These upstanding elements may subsequently be encapsulated by laminating dielectric thereover, typically by laying down layers of dielectric pre-preg over the upstanding features and via posts and subsequently curing the resin of the pre-preg.

Using the flexibility of the bottom up approach comprising electro-plating into patterned photo-resist and then laminating (or panel-plating, selective etching and laminating, a wide range of via shapes and sizes may be cost-effectively fabricated. Furthermore, different via shapes and sizes may be fabricated in the same layer. This is especially facilitated when the copper pattern plating approach is used, by first depositing a metal seed layer and then depositing a photo-resist material and developing smooth, straight, non-tapering trenches therein which may subsequently be filled by depositing copper into these trenches by pattern plating onto the exposed seed layer. In contrast to the drilled & filled via approach, via post technology enables trenches in a photoresist layer to be filled to obtain dimple-less and dome-less copper connectors. After deposition of the copper, the photo-resist is subsequent stripped away, the metal seed layer is removed and a permanent, polymer-glass composite encapsulating material is applied thereover and therearound. The 'via conductor' structure thus created may use the process flows as described in U.S. Pat. Nos. 7,682,972, 7,669,320 and 7,635,641 to Hurwitz et al.

It is a further feature of the bottom up electroplating technology that vias fabricated by electroplating using photo-resist, may be narrower than vias created by drill & fill. At present, the narrowest drill & fill vias are about 60 microns. By electroplating using photo-resist, a resolution of better than 50 microns or even as little as 25 microns is achievable. Coupling ICs to such substrates is challenging. One approach for flip chip coupling is to provide copper pads that are flush with the surface of the dielectric. Such an approach is described in U.S. Ser. No. 13/912,652 (granted as U.S. Pat. No. 9,049,791) to the present inventors.

In addition to via conductor and features, it has been found possible to fabricate passive components such as capacitors and filters within structures that include via post technology, by using electroplating, PVD and encapsulation technologies for creating the capacitors and filters.

With reference to FIG. 1, a polymer based dielectric frame 1 defining a socket 2 is shown in schematic isometric projection with the front of the frame 1 cut away. The frame 1 has embedded via posts 5, 6, 7, at least one of the via posts 5 includes a thin film capacitor 6. Via posts fabricated by electroplating need not be circular, and may extend in one in-plane direction. One via post shown is an elongated via post 7 that extends within the X-Y plane and can serve as an inductor.

Figure 2:
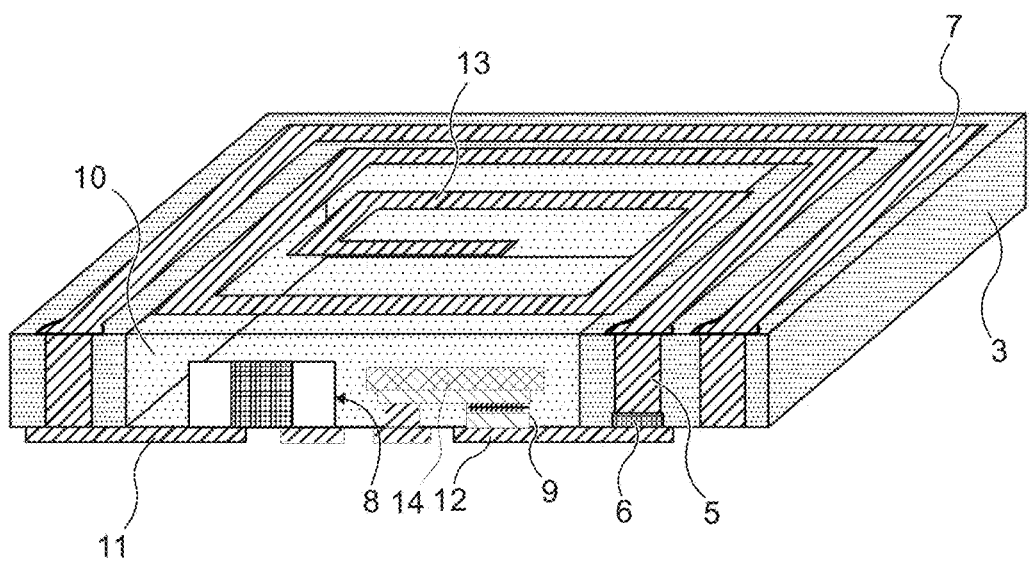
FIG. 2 is a schematic cut-away isometric projection of a polymer based dielectric frame defining a socket, wherein the frame has embedded via posts, at least one of which includes a thin film capacitor and the socket includes an embedded component, which, in this case comprises additional capacitors, and where the via post with embedded capacitor in the frame is coupled to the embedded capacitors within the socket by a feature layer that includes an inductor.

FIG. 2 is a schematic cut-away isometric projection of the polymer based dielectric frame 1 defining a socket 2 of FIG. 1, but wherein the socket 2 includes one or more embedded components, in this case additional capacitors 8, 9, and where the via post 5 with embedded metal insulator metal (MIM) capacitor 6 in the frame 1 is coupled to the embedded capacitors 8, 9 within the socket 2 by features 11, 12 of a feature layer. An embedded capacitor 9 may be fabricated on an insulating substrate 14 such as silicon (Si), silica ($SiO_2$), glass, AlN, α-alumina or c-plane alumina (sapphire). Furthermore, a second feature layer is deposited over the filled socket 2, that includes an inductor 13. The additional regular via post 4 shown in FIG. 1 is not included in FIG. 2, or at least not where shown in FIG. 1. It will, however be appreciated that frames 1 of the invention may include one or more of regular via posts 4, via posts 5 standing on capacitors 6 and inductive via posts 7.

Both the M-I-M capacitor within the via 5 in the frame 1 and MIM capacitors 8, 9 embedded within the socket may comprise a lower metal electrode that may be gold, tantalum or tantalum, and an inorganic dielectric layer that may be $Ta_2O_5$, $TiO_2$, $Ba_xSr_{1-x}TiO_3$, $BaTiO_3$, or α-$Al_2O_3$, for example.

The capacitor may comprise a dedicated upper electrode that is typically gold, tantalum or tantalum, or, the via 5, typically copper, may be deposited over the dielectric 6 and itself serve as the upper electrode. Similarly, an embedded capacitor 8, 9 that is embedded into the frame may comprise gold, tantalum or tantalum electrodes and an inorganic dielectric layer that may be $Ta_2O_5$, $TiO_2$, $Ba_xSr_{1-x}TiO_3$, $BaTiO_3$, or $Al_2O_3$. Such embedded capacitors 8, 9 may be fabricated on an inorganic substrate, such as c-plane $Al_2O_3$ (sapphire) for example.

Combinations of capacitors and inductors may serve as filters that protect chips from fluctuating currents and noise. Filters are of particular importance with regard to RF telecommunications, such as WIFI, Bluetooth, and the like. Filters may serve to isolate parts of a circuit from other elements, to prevent interference.

Figure 3:
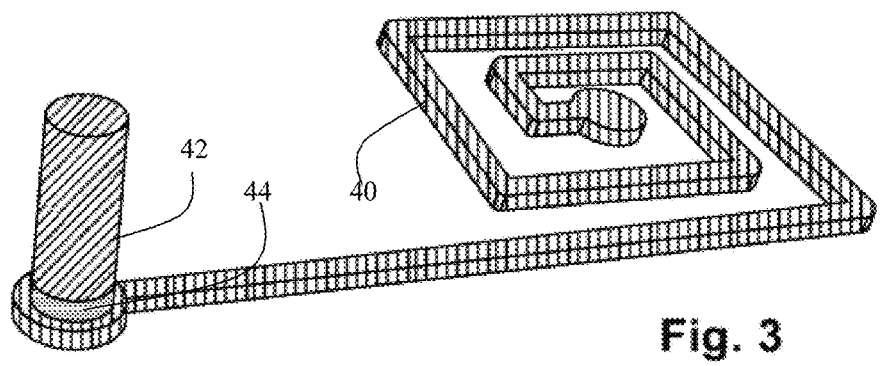
In FIGS. 3-7, the vias and features are shown without the surrounding dielectric for clarity.

With reference to FIG. 3, there is shown a schematic projection of an inductor 40 within a feature layer and an adjacent via post 42 in a via post layer standing on a capacitor 44 that is coupled in series with the inductor 40. For clarity, the surrounding encapsulating dielectric material is not shown. Only the metallic structures and capacitor are shown. The structure of FIG. 3 may be fabricated from copper, with the capacitor 44 comprising a dielectric material such as $Ta_2O_5$, $TiO_2$, $Ba_xSr_{1-x}TiO_3$, $BaTiO_3$, or $Al_2O_3$, and typically has electrodes of tantalum or another noble metal. Typically, the via post 42 will be encapsulated within a polymer dielectric which may include fillers, and may be fabricated using a woven fiber pre-preg. The feature layer including the inductor 40 may be first deposited with the capacitor 44 and via post 42 built up thereover. The polymer based dielectric material, which may be a polymer film or a woven fiber pre-preg, may be laminated over the feature 40 and via post 42. Alternatively, the via post 42 and capacitor 44 may be fabricated and laminated with a polymer dielectric, with then an inductor 40 in a feature layer may be deposited thereover, or, as shown, thereunder, and left non-laminated as a surface trace such as the inductor 13 of FIG. 2, or may be subsequently laminated, possibly together with an additional via layer, not shown. Thus an inductor 40 may be included in a feature layer that is part of the frame (1, FIG. 1), or in a surface layer over or under the frame (1, FIG. 1), such as part 13 in FIG. 2. Furthermore, and continuing to refer to FIG. 2, if external to the frame 1 and applied after embedding components 8 and 9 in a polymeric dielectric 10, such as a molding compound or pre-preg, within cavity 2, the inductor 40 (13) may be deposited partly over the filled cavity.

Figure 4:
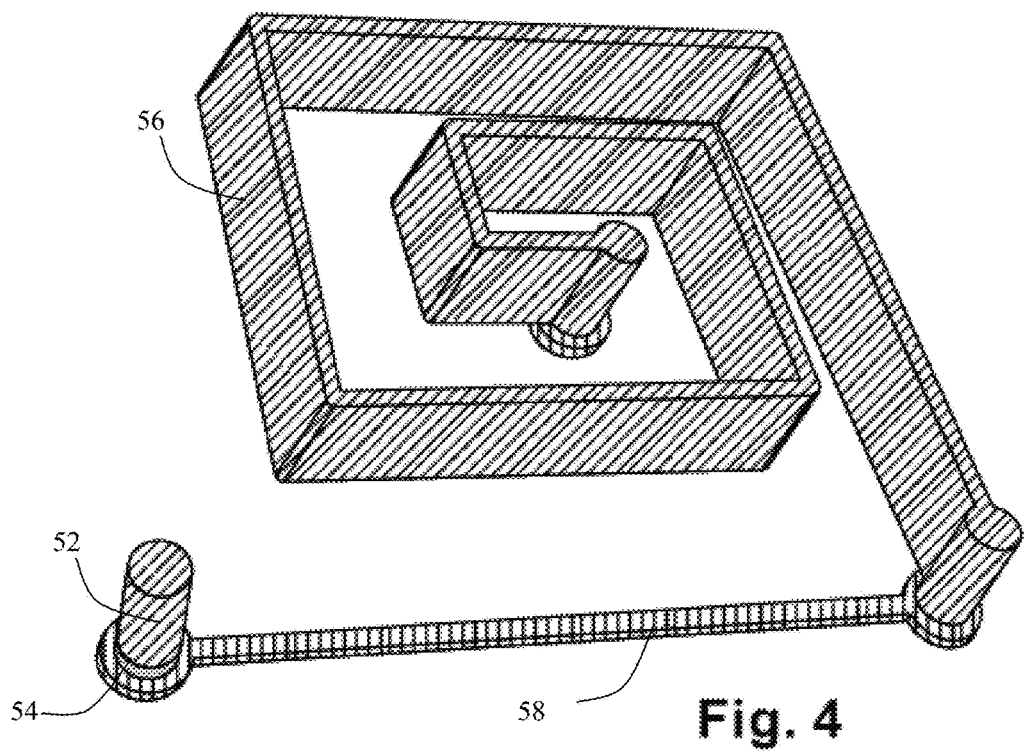

It will be appreciated that feature layers are very thin, typically about 10 microns. Via layers however, may be rather thicker. FIG. 4 is a schematic projection of an inductor via 56 that extends within the via layer coupled in series with a capacitor 54 at a base of a via post 52. The capacitor 54 is coupled to the inductor via 56 by a trace 58 deposited in z feature layer or on a surface of the frame, in this case, on a bottom surface. Inductor via 56 may have a thickness of about 30 microns and has different characteristics from feature layer inductor 40 of FIG. 3. Typically, the inductor via 40 is a high Q inductor having an inductance ranging from about 0.1 nH to about 10 nH. As shown, via inductor 56 may be a fairly tight coil. It will be appreciated however, that it may be formed within a frame 1 and totally wound around the socket 2 of the frame 1, or it may be embedded in one side of a frame alongside a socket.

Figure 5:
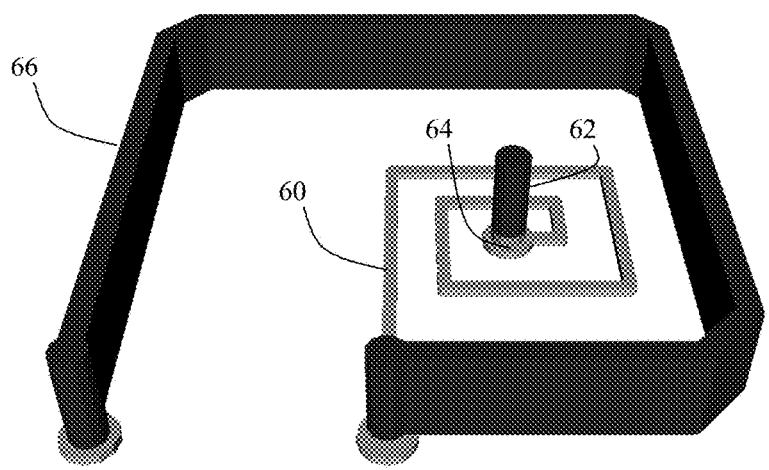

With reference to FIG. 5, it will be appreciated that a filter may be fabricated that includes a pair of inductors; a first inductor 60 within a feature layer and a second inductor 66 within a via post layer. Referring back to FIGS. 1 and 2, the first inductor 60 may be surface mounted on to a frame 1 or onto a filled frame over a cavity 2 filled with polymer 10 as per inductor 13 of FIG. 2, or it may be deposited under the filled cavity in the layer including features 11 and 12, or indeed in a subsequent layer. The filter shown in FIG. 5 includes a second inductor 66 within a via layer that further comprises regular via posts. The second inductor 66 may be fully fabricated within a framework 1 around a cavity 2. The inductors 60, 66 may be coupled in series to each other and to a capacitor 64 at the base of a via post 62 within the via layer of the via inductor 66.

It will be appreciated that for some filtering purposes, it is required to couple the components in parallel.

Figure 6:
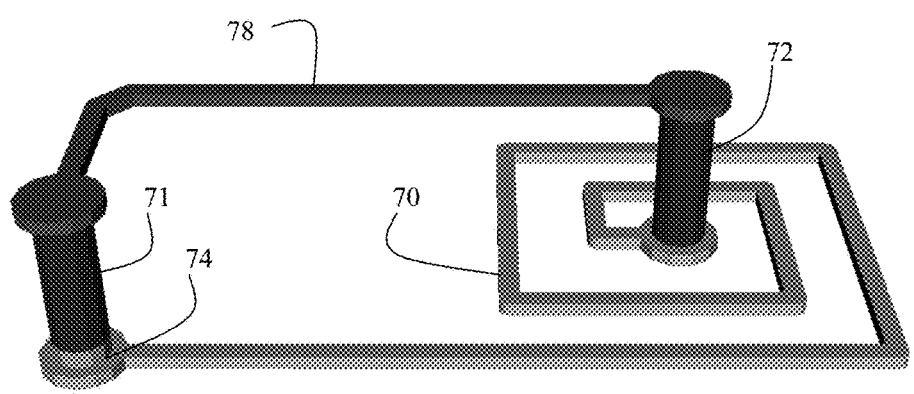

For example, FIG. 6 is a schematic projection of an inductor 70 in a feature layer, coupled in parallel with a capacitor 74 at the base of a via post 71. The capacitor 74 and the inductor 70 are coupled together by via posts 71, 72 and a trace 78 in a second, upper feature layer or on the outside of the multilayer structure. Referring back to FIG. 2, the via posts 71, 72 will be positioned within the frame 1. One or more of the inductor 70 and connector 78 may be deposited in feature layers of the frame if the frame is multi-layer, or may be deposited by electroplating into photo-resist on the outside of the filled frame 1 of FIG. 2, possibly spanning over (or under) the filling 10 of the cavity 2.

Figure 7:
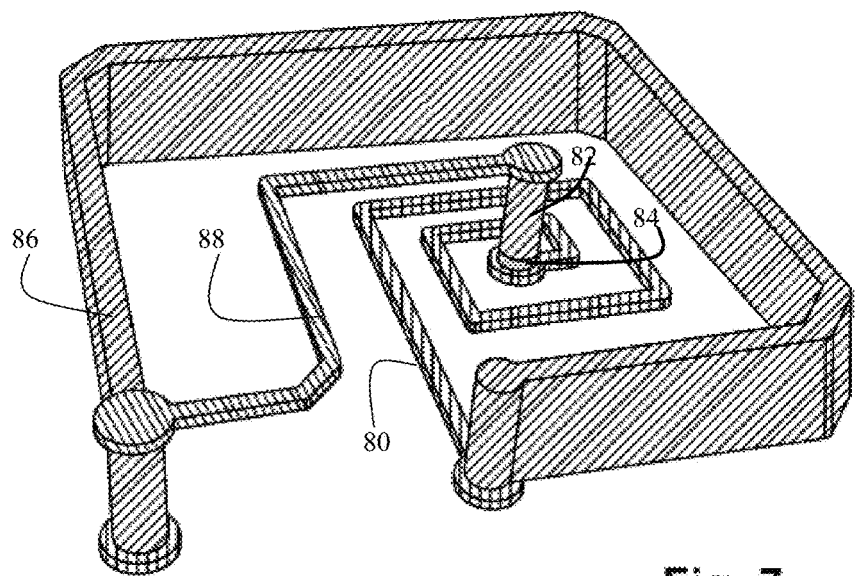

FIG. 7 is a schematic projection of an inductor 88 in a feature layer (of the frame 1) or a lower surface layer (deposited onto the frame 1 and possibly onto the filled cavity 2, such as inductor 13 of FIG. 2), coupled in series with an inductive via 86 that, like via 7 of FIGS. 1 and 2, and in parallel with a capacitor 84. The capacitor 84 and inductive via 86 are coupled together by a trace 88 in a second, (as drawn, upper) feature layer of the frame or on the outside of the frame 1, possibly spanning the cavity 2).

Figure 8:
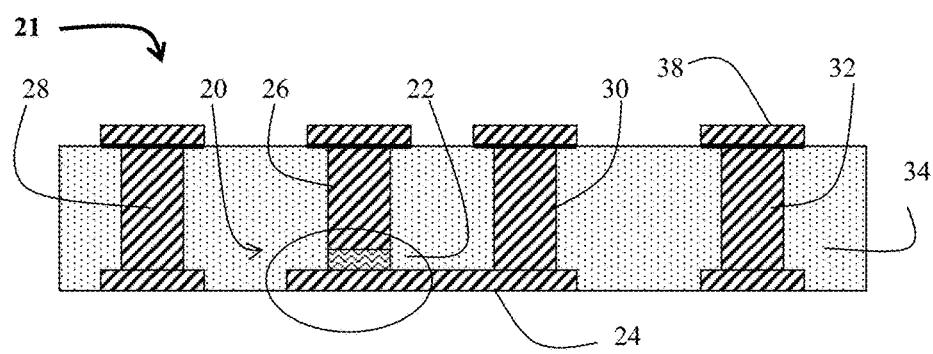
FIG. 8 is a schematic section through a layer of via posts coupled between feature layers, wherein one via post shown has an integral capacitor.

With respect to FIG. 8, there is shown a cross section through a substrate 21 (such as the frame 1 if FIG. 1) that includes a one layer parallel plate capacitor 20 consisting of a dielectric material layer 22 sandwiched between a copper feature layer 24 and a copper pillar 26. Optionally, the dielectric layer 22 is deposited over the copper feature layer 24 and the copper pillar 26 is then grown over the dielectric layer 22. The dielectric material may be $Ta_2O_5$, $TiO_2$, $Ba_xSr_{1-x}TiO_3$, $BaTiO_3$, or $Al_2O_3$ for example, and may be deposited by a physical vapor deposition process, such as sputtering, for example, or by a chemical vapor deposition process.

To obtain high quality capacitors, the dielectric may include $Ta_2O_5$, $TiO_2$, $Ba_xSr_{1-x}TiO_3$, $BaTiO_3$, or $Al_2O_3$ which may be deposited by a physical vapor process, and may further comprise a layer of aluminum metal that is previously or subsequently deposited, possibly by sputtering alongside the dielectric ceramic. After the optional aluminum deposition, the structure may be heated up in the presence of oxygen, either in a furnace or oven, or by exposing to infra red radiation. The aluminum is thereby converted in situ into aluminum oxide (alumina $Al_2O_3$). Since $Al_2O_3$, is less dense than aluminum, it spreads and seals defects into the ceramic layer, ensuring a high dielectric constant and preventing leakage.

The copper pillars 26, 28, 30, 32 are encapsulated in an encapsulating dielectric material 34. Where copper pillars 26, 28, 30, 32 are fabricated as via posts by electroplating into photo-resist (or by panel plating and etching) and subsequently laminated, the encapsulating dielectric material 34 may be applied as a glass fiber reinforced polymer resin pre-preg that is laminated over the copper pillars 26, 28, 30, 32.

By using the bottom up pattern or panel plating, one of more of the copper pillars 28, 32 may be extensive inductive via posts such as inductive via post 7 of FIGS. 1 and 2.

The copper feature layer 24 may have a thickness of about 15 microns, with a tolerance of about +−5 microns. Each via post layer is typically about 40 microns wide but may be anywhere from, say, 20 microns to 80 microns. Outer feature layers 24, 38 which may be termination pads, are again typically about 15 microns but may be anywhere from, say, 10 microns to 25 microns.

As known, the capacitance of a capacitor is defined by the dielectric constant of the dielectric layer multiplied by the surface area of the capacitor, which is the area of the via pillar 26, divided by the thickness of the dielectric layer 22.

Using the simple one layer capacitor 20 of FIG. 8, it is possible to optimize the thickness of the dielectric material 22 and the deposition process thereof. The capacitance is a property of the dielectric constant of the dielectric material 22, and of the area of the metal electrodes, which, in this case, is the cross-sectional area of the copper pillar 26.

In typical embodiments, noble metal electrodes, generally fabricated from tantalum, but optionally fabricated from gold or platinum, are applied on either side of the dielectric layer. The capacitor is thus incorporated within a via layer at the base of a via post. Keeping the thickness and nature of the dielectric layer constant, where the via post defines the upper electrode; it defines and can be used to fine tune the capacitance.

As explained in more detail hereinbelow, even where tantalum electrodes are used, deposition of a carefully sized via post enables plasma etching away of the electrode and dielectric layers of the capacitor, leaving the capacitor sandwich only by a selective etch that removes tantalum and tantalum oxide but does not harm copper, such as a hydrogen fluoride and oxygen etch, for example. Furthermore, since the via post may be formed by electroplating it need not be cylindrical, but may be rectangular or have another cross-section shape.

Figure 9I:
Figure 9:
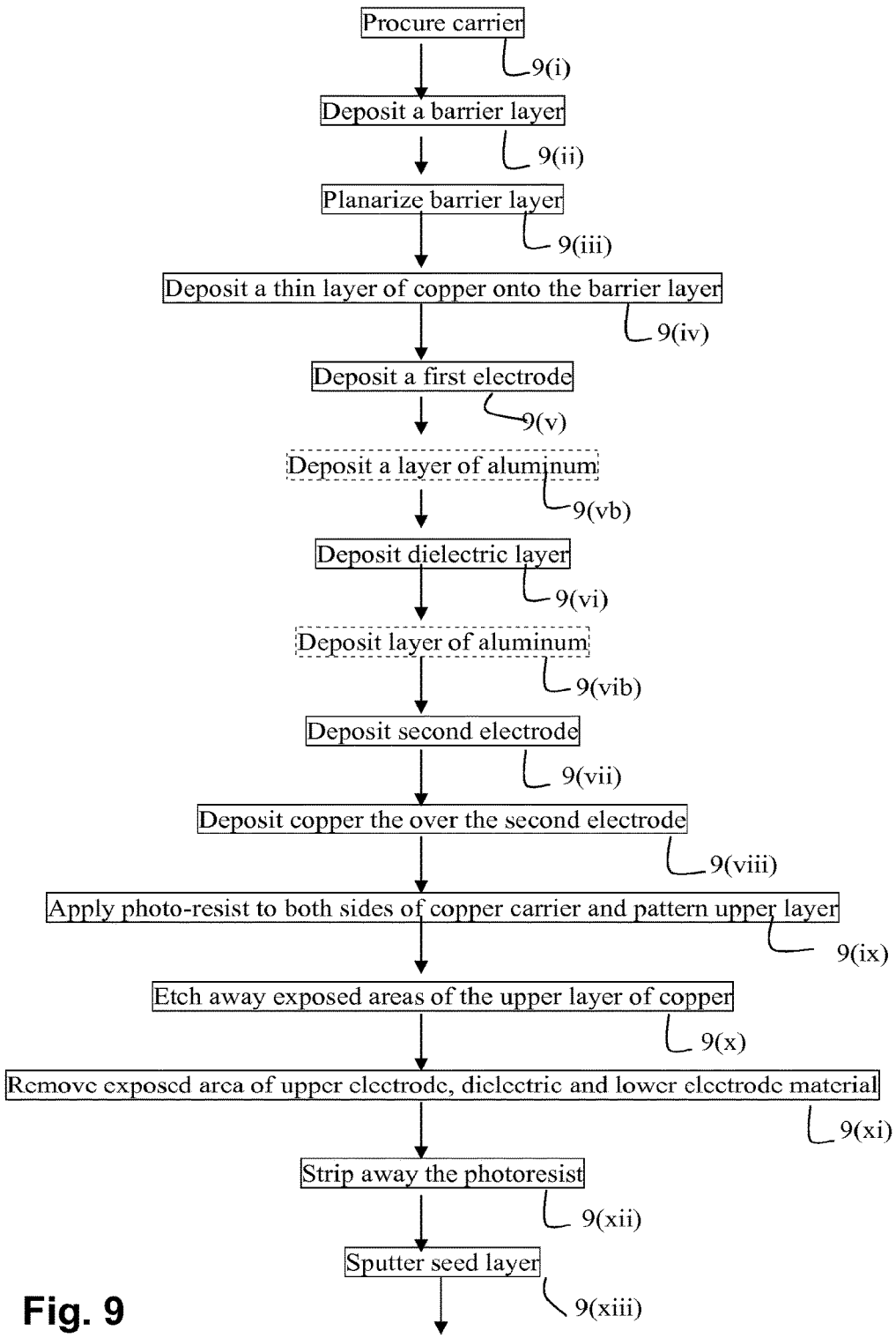
FIG. 9 is a flow chart illustrating a process for fabricating a substrate with an embedded filter consisting of a capacitor and inductors.
Figure 9:
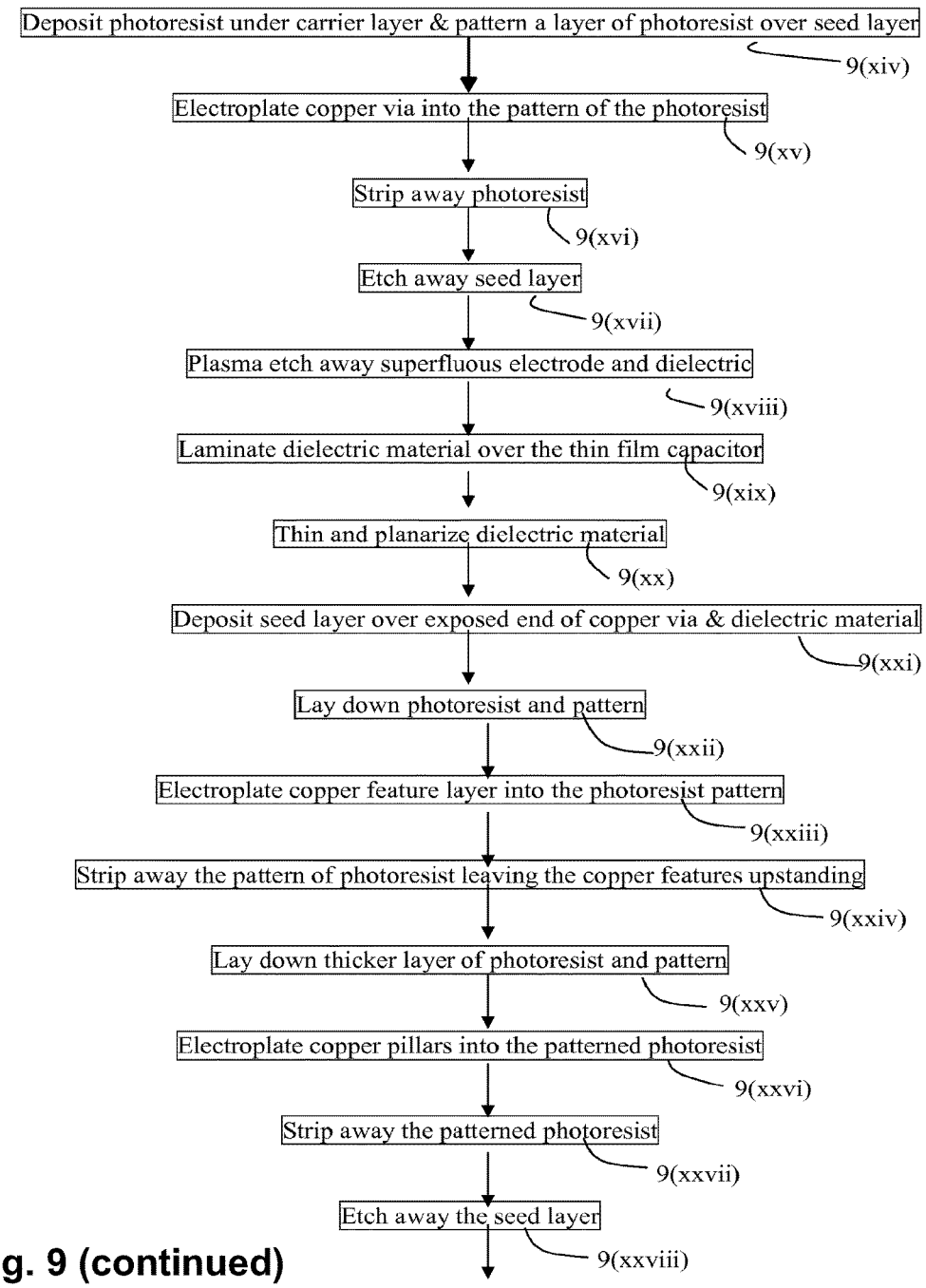
Figure 9:
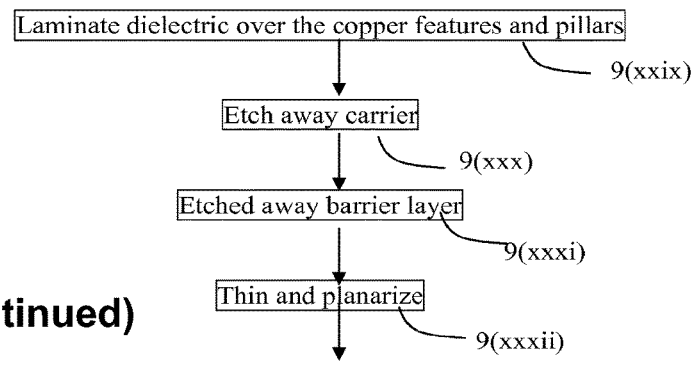

With reference to FIG. 9 and to FIGS. 9(i) to 9(xxxi), a method of fabricating a thin film capacitor under a via post, embedded in a polymer dielectric is shown in more detail. It will be appreciated that the method illustrated may be used to co-deposit an array of via posts including thin film capacitors within a framework. Regular substantially cylindrical via posts (such as via post 4 of FIG. 1) and inductive via post (such as inductive via post 7 of FIG. 1) may be deposited within the same via layer. However, to keep figures simple, additional via posts are not shown or related to in the following description.

The capacitor 248 shown in FIG. 9(xx) has dedicated electrodes of a different material, typically a noble metal such as gold, platinum or tantalum. Generally tantalum is used, as it cheaper than gold or platinum. However, in alternative constructions, the upper electrode may be the via post 232 electroplated thereonto.

Firstly, a carrier 210 is procured—step 9(i). The carrier 210 is typically a sacrificial copper substrate. In some embodiments, it may be a copper carrier with a quick release thin film of copper appended thereto.

A barrier layer 212 is deposited onto the copper carrier 210—step 9(ii). The barrier metal layer 212 may be fabricated from Nickel, Gold, Tin, Lead, Palladium, Silver and combinations thereof. In some embodiments, the barrier metal layer has a thickness in a range of from 1 micron to 10 microns. Typically, the barrier layer 212 comprises nickel. A thin barrier layer 212 of nickel may be deposited by a physical vapor deposition process or by a chemical deposition process, and typically it is sputtered or electroplated onto the copper carrier 210. For fast processing, the barrier layer 212 may be electroplated. To ensure planarity and a smooth surface, it may then be planarized—step 9(iii) (FIG. 9(iii) is identical to FIG. 9(ii), by chemical mechanical polishing (CMP) for example.

A thin layer of copper 214 may now be deposited onto the barrier layer 212—step 9(iv). The thickness of the copper layer 214 is typically several microns and may be fabricated by sputtering or by electroplating.

A first electrode 216 is now deposited—step 9(v). By way of example, first electrode 216 may be fabricated from tantalum by sputtering.

A dielectric layer 218 is now deposited—step 9(vi). For high performance capacitors, the dielectric layer 218 must be kept as thin as possible, whilst not risking faults that enable charge leakage. There are various candidate materials that may be used. These include $Ta_2O_5$, $BaO_4SrTi$, and $TiO_2$, which may be deposited by sputtering, for example. Typically the thickness of the dielectric layer 218 is in the range of 0.1 to 0.3 microns.

A second electrode 220 may now be deposited—step 9(vii). By way of example, the second electrode 220 may be fabricated from tantalum by sputtering.

In a variant process, a second noble electrode 220 is not applied. Rather, a copper via is deposited directly onto the dielectric, its footprint defining the upper electrode and thus the effective area and capacitance of the capacitor.

Furthermore, it is difficult to fabricate thin dielectric layers of $Ta_2O_5$, $BaO_4SrTi$, or $TiO_2$ without defects that may result in charge leakage. To overcome this problem, in some embodiments an aluminum layer (not shown) is deposited before or after depositing the $Ta_2O_5$, $TiO_2$, $Ba_xSr_{1-x}TiO_3$, $BaTiO_3$ layer (optional step 9(v)b or optional step 9(vi)b—see FIG. 9), and by exposure to heat in an oxygen environment, the aluminum layer is oxidized into the high dielectric ceramic alumina ($Al_2O_3$). The alumina is less dense than aluminium and expands into adjacent voids. In this manner, it is possible to cure defects and to ensure that a continuous thin dielectric separates the electrodes.

In the main process, a further layer of copper 222 is deposited over the second electrode 220—step 9(viii). The further layer of copper 222 may be deposited by sputtering or by electroplating, for example. The further copper layer 222 may be deposited into a patterned photo-resist by pattern plating it may be fabricated by printing and etching to provide pads, conductors and inductors, for example. A layer of photo-resist 208 may be applied beneath the copper carrier 210, and a second layer of photo-resist 224 is applied over the further layer of copper 222 and developed into a pattern-step 9(ix).

Areas of the further layer of copper 222 that are not protected by the patterned photo-resist 224 are etched away—step 9(x). A wet etch may be used. By way of example, one way of etching away the areas of the further layer of copper 222 not protected by the patterned photo-resist 224 consists of exposing the sacrificial substrate to a solution of ammonium hydroxide at an elevated temperature. Alternatively copper chloride or a wet Ferric Chloride etch may be used.

The exposed electrode layers 216, 220 and dielectric layer 218 may be removed by dry etching using a plasma etching process—step 9(xi). For example a hydrogen fluoride and oxygen plasma etch may be used to etch $TiO_2$ or $Ta_2O_5$ and a hydrogen fluoride and Argon plasma etch may be used to etch $BaO_4SrTi$ (BST). Typical concentration ratios for $CF_4$: $O_2$ are in the range of between 50:50 to 95:5 where 95 is the concentration of $CF_4$. Typical concentration ratios for $CF_4Ar$ can be any ratio between 50:50 to 5:95 where 95 is the concentration of Argon.

In a variant method, as described hereinabove, no upper electrode 220 is deposited. Rather a copper via is fabricated directly onto the dielectric material. Patterning a photo-resist, either with a stencil or with a laser, enables accurate control of the cross-sectional size and shape of the via, which serves as the upper electrode and defines the capacitance of the capacitor, since the capacitance is proportional to the effective area of the via electrode.

In the main process, the patterned photo-resist 224 is now stripped away—step 9(xii) as is generally, the second layer of photo-resist 208. However, as the second layer of photo-resist 208, is shortly replaced with a similar layer of photo-resist 228—it could alternatively be retained.

A seed layer of copper 226 is deposited step 9(xiii) over and around the capacitor and exposed copper layer 214. To help adhesion, a first seed layer of titanium may be first deposited.

Now moving to a different scale for FIG. 9(xiv) onwards, a further layer of photoresist 228 is applied to protect the copper substrate (assuming that layer 208 shown in FIG. 9(ix) was removed), and a thick layer of photo-resist 230 is deposited and patterned over the seed layer 226 (step 9(xiv). Copper interconnects 232 are electroplated into the pattern created by the photo-resist 230—step 9(xv).

The photo-resist 228 (208), 230 is now stripped away—step 9(xvi), thereby exposing the capacitor 248 which is shorted by seed layer 226, and the copper via post 232 interconnect.

The seed layer 226 is etched away—step 9(xvii), with a quick etch to minimize the damage to the copper layer 214 and the via 232, but to ensure that the copper layer 214 and the copper via 232 are isolated from each other by the capacitor 248.

The process is capable of many variations. For example, with reference to FIG. 9(xviii), prior to laminating the polymer based dielectric material 234 over the copper substrate and via, the structure may be plasma etched with a plasma etch that copper is resistant to, but which tantalum and titanium oxide are susceptible to, such as a mix of hydrogen fluoride and oxygen.—step 9(xviii). This reduces the dimensions of the capacitor 348 to that of the via post 232. Since the via post 232 is fabricated by electroplating into a photo-resist, this provides the possibility of fabricating to virtually any size and shape with high accuracy, and may be square or rectangular, instead of round, to enable high packing density. Removing the excess capacitor material enables high packing density between components.

Capacitor 348 or capacitor 248 is then embedded in a polymer based dielectric material 234 by laminating a layer of the polymer based dielectric material 234 over the copper substrate and via—step 9(xix). The polymer based dielectric material 234 is typically a polyimide, epoxy or BT (Bismaleimide/Triazine) or their blends, and may be reinforced with glass fibers. In some embodiments, a pre-preg consisting of woven fiber mats in a polymer resin may be used. The polymer matrix may include inorganic particulate fillers that typically have a mean particle size of between 0.5 microns and 30 microns and the polymer typically includes between 15% and 30% of particulate by weight.

Although sometimes referred to as being a dielectric, the polymer based dielectric material 234 has a significantly lower dielectric constant than that of the dielectric layer 218 of the capacitor 248, which is typically a more exotic material such as $Ta_2O_5$ or $BaO_4SrTi$ or $TiO_2$, for example.

The cured polymer based dielectric material 234 is then thinned and planarized—step 9(xx), by chemical mechanical polishing (CMP) for example, thereby exposing the end of the copper via 232. A further seed layer of copper 236 is then deposited over the polymer based dielectric material 234 and over the end of the copper vias 232—step 9(xxi). A layer of photo-resist 238 is applied over the seed layer 236 and the layer of photo-resist 238 is patterned—step 9(xxii). A feature layer of copper 240 is then electroplated into the pattern—step 9(xxiii).

The photo-resist 238 may now be stripped away—Step 9(xxiv).

At this stage, the lower copper layer 214 is coupled by the copper interconnect 232 to the upper copper layer 240 via a capacitor 248 embedded in the copper interconnect 232.

A further layer of photo-resist 242 may be deposited and patterned—step 9(xxv), and copper vias 244 may be electroplated into the pattern—step 9(xxvi).

The photo-resist 242 may be stripped away leaving the upstanding copper vias 244—step 9(xxvii), and the copper seed layer 236 is then etched away—step 9(xxviii). The copper seed layer may be removed by a dry plasma etch, or by a short etch with copper chloride or with ammonium chloride solution, for example.

With reference to FIG. 9(xxix), a dielectric material 234 may laminated over the upstanding vias 244.

The copper carrier 210 may now be etched away, typically using a copper chloride or ammonium chloride solution for so doing—step 9(xxx), with the (typically nickel) barrier layer 212 serving as an etch stop.

The barrier layer 212 may then be removed with an appropriate etching technique, such as plasma etching, or with a specific chemical etchant—step 9(xxxi). For example, to etch away nickel without removing copper, a mixture of nitric acid hydrogen peroxide may be used. Other alternatives that dissolve nickel that may be used include hydrochloric acid +hydrogen peroxide, hot concentrated sulfuric acid and iron(III) chloride acidified with hydrochloric acid.

The polymer layer 246 may then be thinned and planarized—step 9(xxxii), to expose the ends of the copper vias 244. Grinding, polishing or a combined chemical mechanical polishing (CMP) may be used.

Thus far, it has been shown how an advanced, high performance capacitor 248 may be embedded into a composite structure 250 comprising a copper via layer that includes a copper via 232 that stands on a thin film capacitor 248, but, as those shown in FIG. 1, may also include inductive vias 7 and regular via posts 4.

Where the frame 1 comprises a single via layer, after stage 9(xx), cavities 2 (FIG. 1) are punched into the frame and components (e.g. 8 and 9 FIG. 2) are positioned within the frame 1 and embedded using a polymer based dielectric material 10 that may be fiber reinforced polymer filler or applied as woven fiber pre-pregs.

In such cases, the feature layer 240 and upper via layer 244 may be deposited over the filled frame which is ground smooth using CMP and is treated as a substrate for further build up.

Alternatively, the frame may comprise the feature layer 240 and, perhaps, a second via layer 244, and even additional layers embedded in a polymer based dielectric matrix 234, 246. Cavities may then be stamped or cut out of the multiple layer frame.

Since the in-plane shape of the capacitor plates and dielectrics are determined by patterning photo-resist, it will be appreciated that the capacitor may be fabricated with substantially any shape. Typically, the capacitor will be square or rectangular, but it may be circular, or, indeed, may have practically any other shape. The capacitor may have one, two, three or more layers. The thickness of the dielectric may be carefully controlled, so it is possible to tailor capacitors fabricated by this process to have substantially any capacitance over a large range, and it is possible to accurately control the capacitance, optimizing it for particular operating frequencies.

It will also be noted that via 244 is not restricted to being a simple cylindrical via post, since it is not fabricated by the drill & fill technology. By fabricating using electroplating into a pattern within a photo-resist 242, via 244 may also have substantially any shape and size. Since via 244 may be an extensive wire within the via layer, via 244 may be an inductor and may be a high Q inductor having an inductance ranging from about 0.1 nH to about 10 nH.

It will be appreciated that the combination of a capacitor 248 and an inductor 244 enables the provision of an RF filter.

With reference to steps 10(xxxiii) to steps 10(xL) and corresponding Figures (xxxiii) to 10(xL), a technology for fabricating the ports of a filter is now described.

It will be appreciated that such ports may be deposited onto a frame 1, but will typically be deposited onto a structure including a frame 1 around a filled cavity 2 with embedded components 8, 9 and typically additional layers on both sides.

With reference to step 10(xxxiii), a titanium seed layer 252 is now sputtered over the matrix 246 and the exposed ends of the copper (inductor) vias 244. Referring to step 10(xxxiv), a copper layer 254 is sputtered over the titanium layer 252.

With reference to step 10(xxxv), layers of photo-resist 256, 258 are laid down and patterned on each side of the composite structure 250. Referring to step 10(xxxvi), copper 260, 262 is electroplated into the patterned photo-resist 256, 258 to create ports.

With reference to step 10(xxxvii), the layers of photo-resist 256, 258 are now stripped away leaving the copper ports 260, 262 upstanding. With reference to step 10(xxxviii), the titanium 252 and copper 254 layers are etched away. (Copper pads 260, 262 will be slightly damaged in this process).

The hollows thus formed may be filled with solder mask 264—step 10(xxxix), and the copper protected with ENEPIG 266—step 10(xL) or other appropriate termination technology.

As described hereinabove, using the preferred via post technology, electroplated vias deposited into photo-resist and subsequently laminated may have a wide range of shapes and sizes. Furthermore, a frame can include 2 or more via layers separated by pads.

Figure 11:
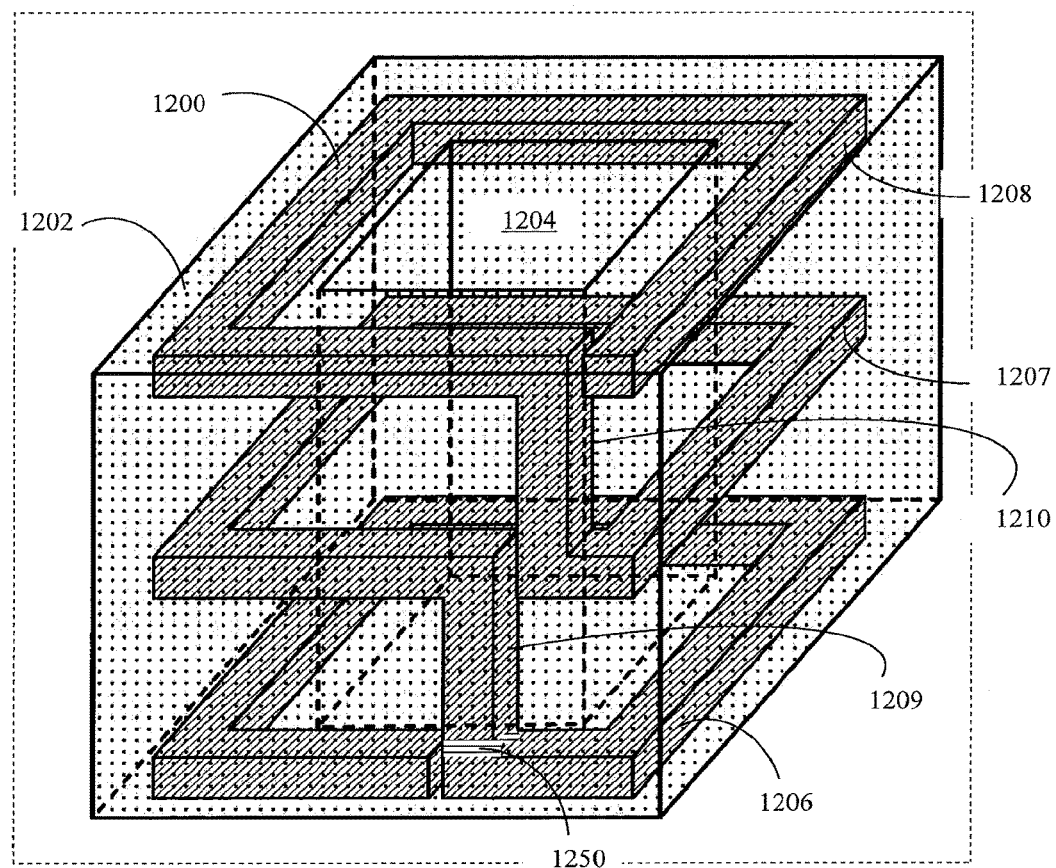

With reference to FIG. 11, this flexibility enables embedding a coil of copper 1200, typically comprising via posts, to be embedded within a dielectric frame 1202 around a cavity 1204. By way of example only, the coil 1200 shown has three layers of extending via posts 1206, 1207, 1208, possibly via posts deposited on feature layers. The layers 1206, 1207, 1208 are coupled together by vertical elements 1209, 1210. The vertical elements 1209, 1210 may be via posts or feature layers, or a via post on a feature layer.

A capacitor 1250 may be fabricated beneath or within an inductor, typically at the base of a via post 1209. Techniques for fabricating capacitors are described hereinabove with reference to FIGS. 8 and 9. In practice, the coil of copper via post 1200 will generally comprise elongated via posts coupled together by feature layers, or elongated feature layers coupled by via posts. In general, via post layers alternate with feature layers and a coil has to be built up layer by layer.

By combining a capacitor and an inductor, a filter may be provided. Examples of filters are shown in FIGS. 12-16. It will be appreciated that any of these filters or similar may be fabricated within the frame of a chip socket and combined with an embedded chip to provide an embedded circuit including both a chip and a filter. A substrate may include two or more sockets for two or more chips, such as for a processor chip and a memory chip, for example. Furthermore, some layers may be fabricated over the embedded chip, for example a capacitor or an inductor in a feature layer may be deposited over the chip.

Figure 10:
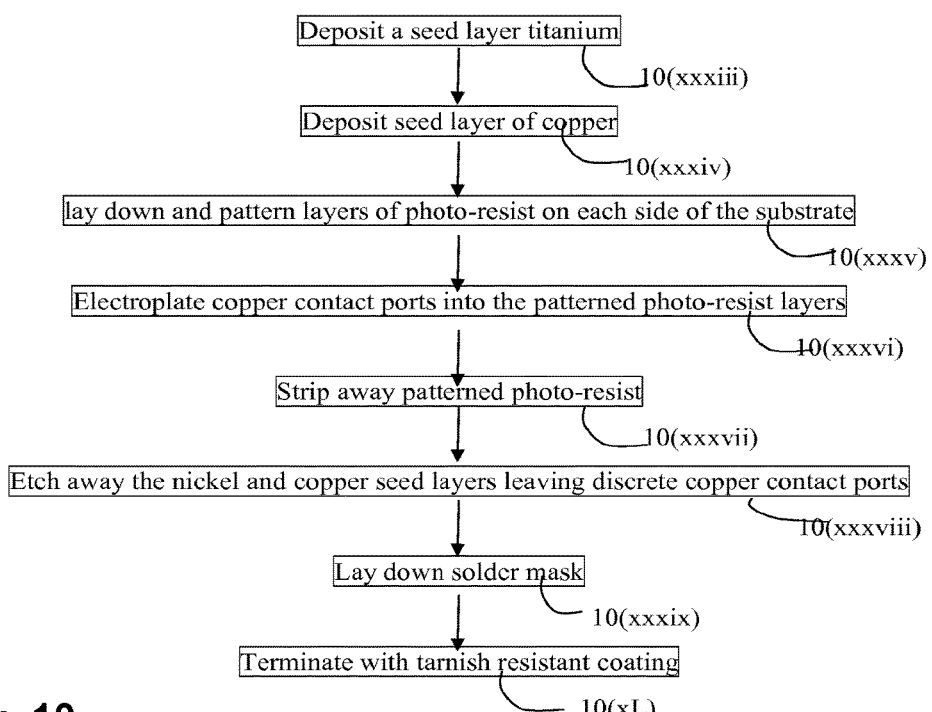
FIG. 10 is a flow chart illustrating a process for terminating the filter of FIG. 8.
Figure 9:
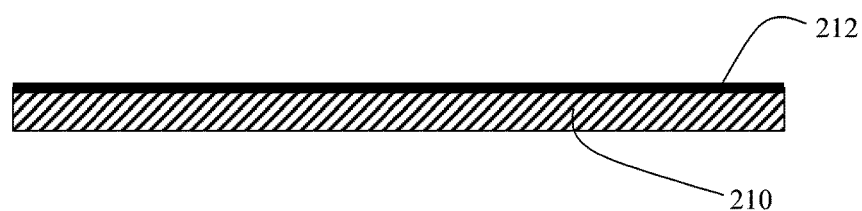
Figure 9:
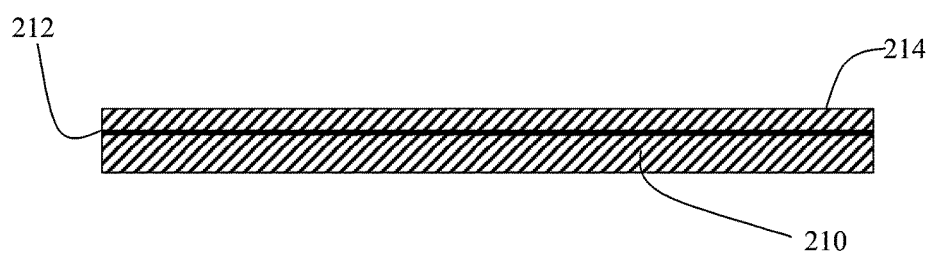
Figure 9V:
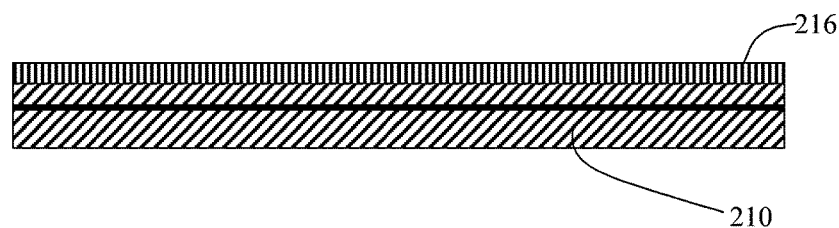
Figure 9:
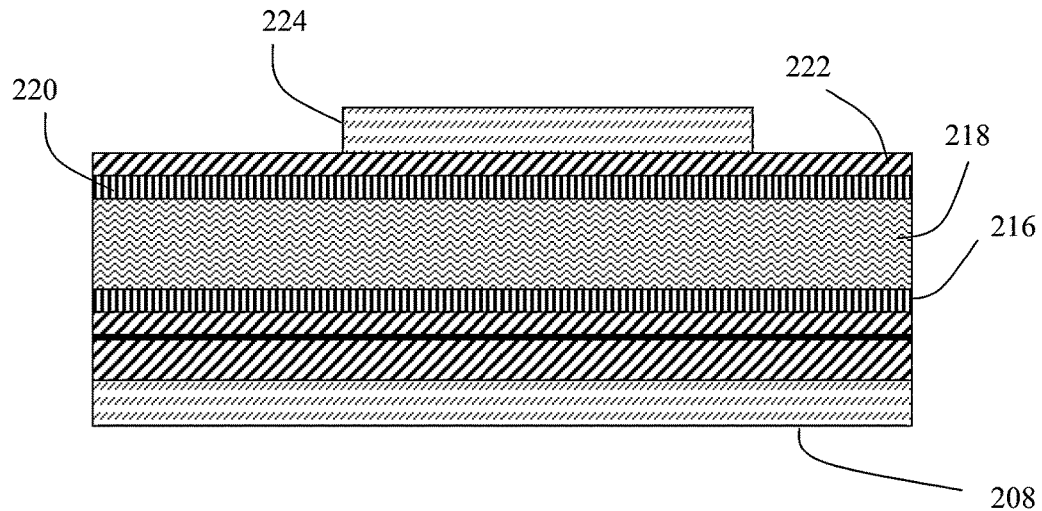
Figure 9X:
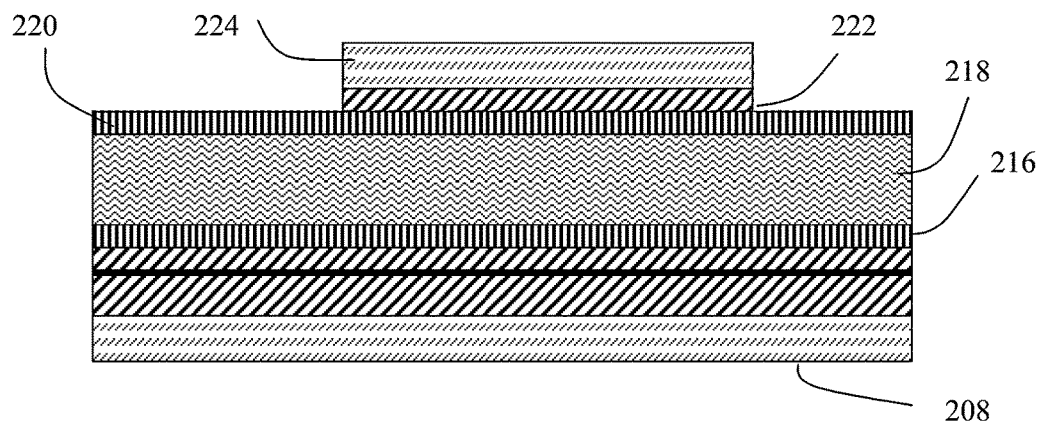
Figure 9:
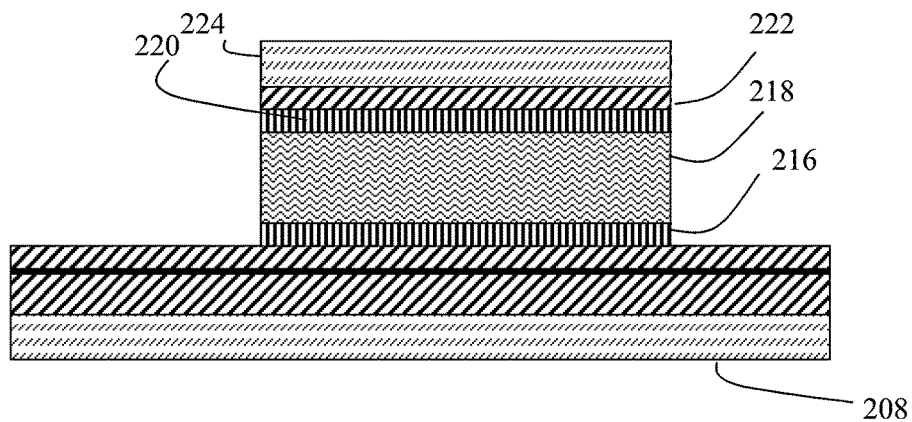
Figure 9:
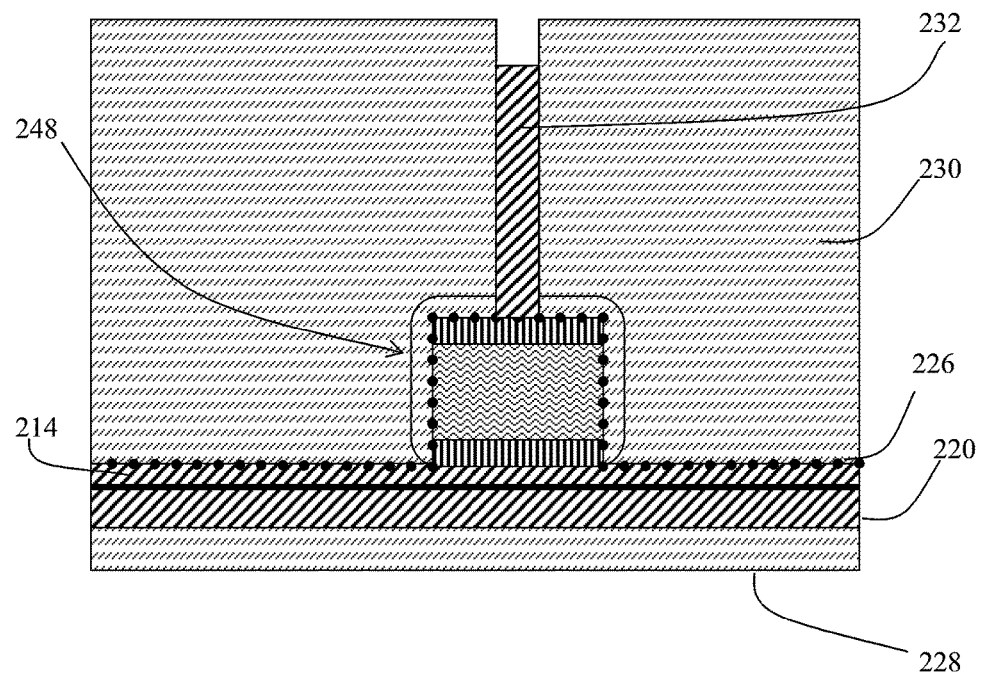
Figure 9:
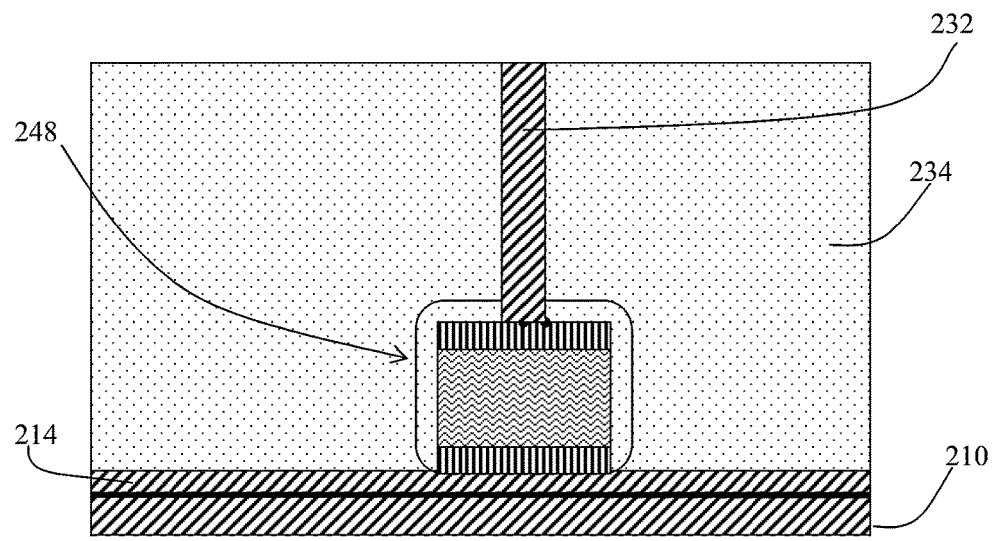
Figure 10:
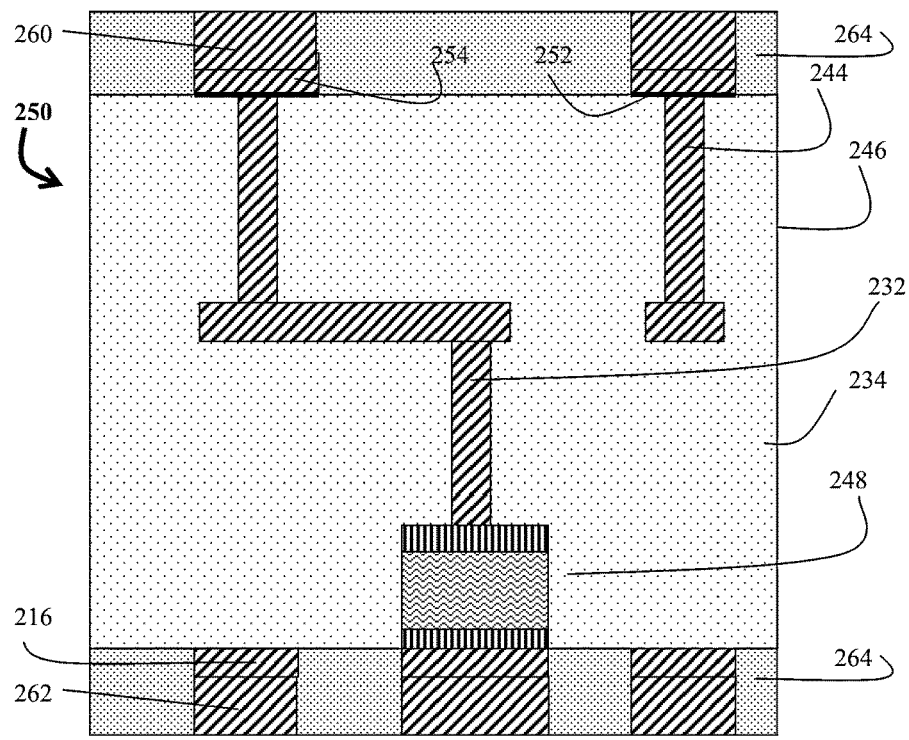
Figure 10:
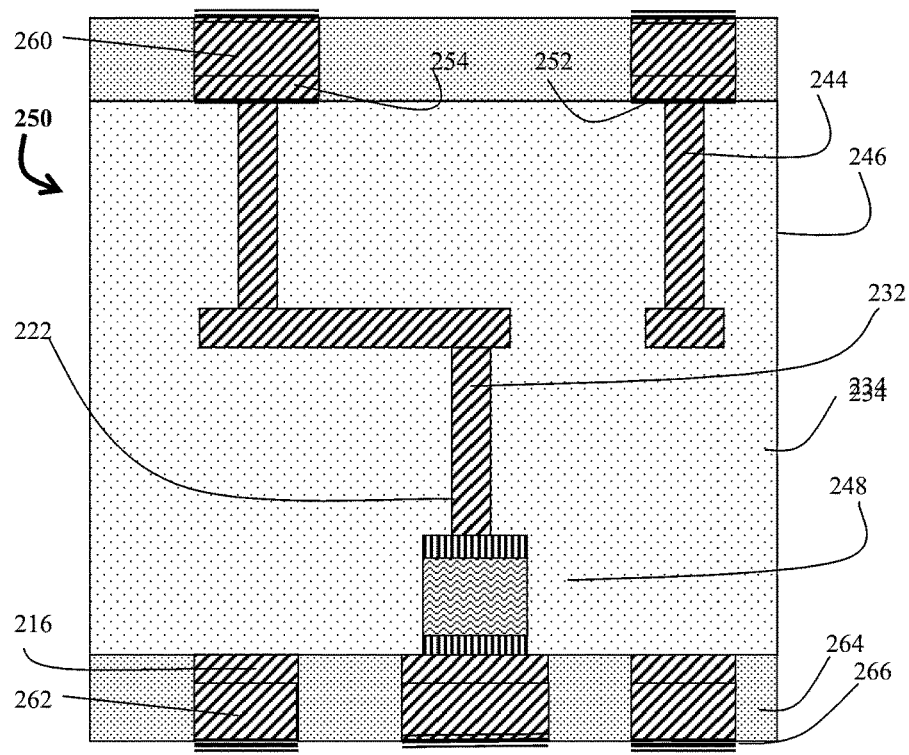
Figures 12A, 12B:
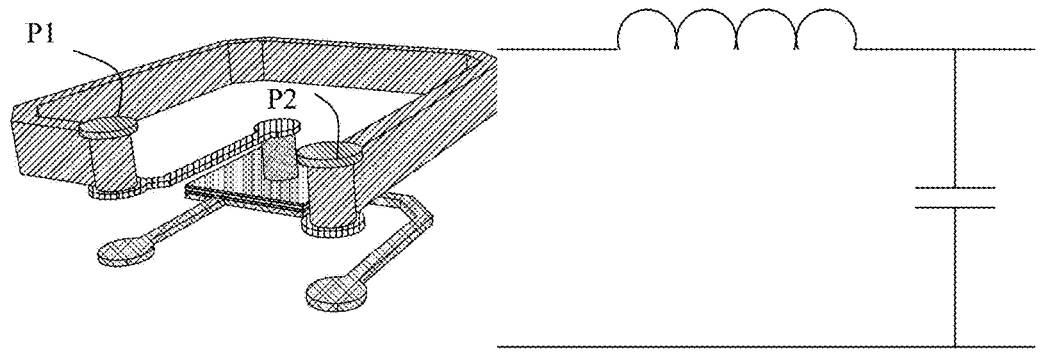
FIG. 12a is a schematic three dimensional view of a basic LC low pass filter.
FIG. 12b shows how the basic LC low pass filter of FIG. 12a may be represented as an LC filter circuit.
Figure 12C:
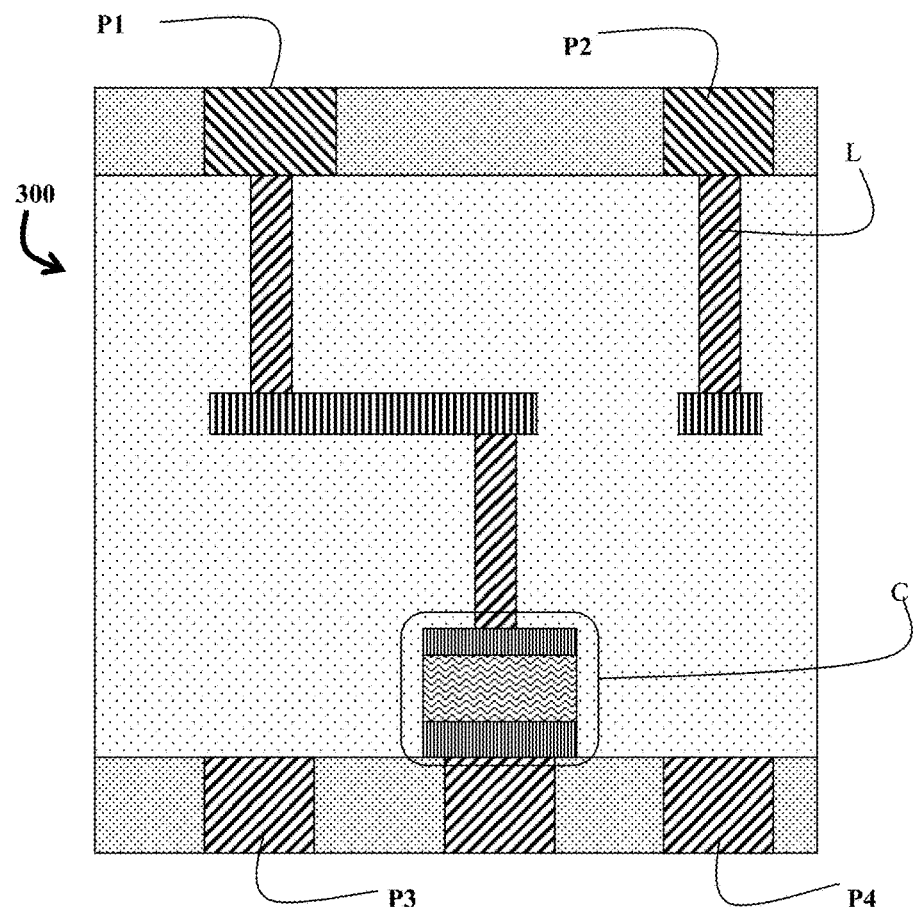

With reference to FIG. 12*a*, which is a three dimensional representation shows the structure of FIG. 10(xL), to FIG. 12*b* which is an equivalent circuit diagram, and to FIG. 12*c*, which is a flat schematic illustration of the structure of FIG. 10(xL), it will be appreciated that the structure thus created is essentially a basic LC low pass filter 300 consisting of four ports, P1, P2, P3, P4, a capacitor C and an inductor L.

Figure 12D:
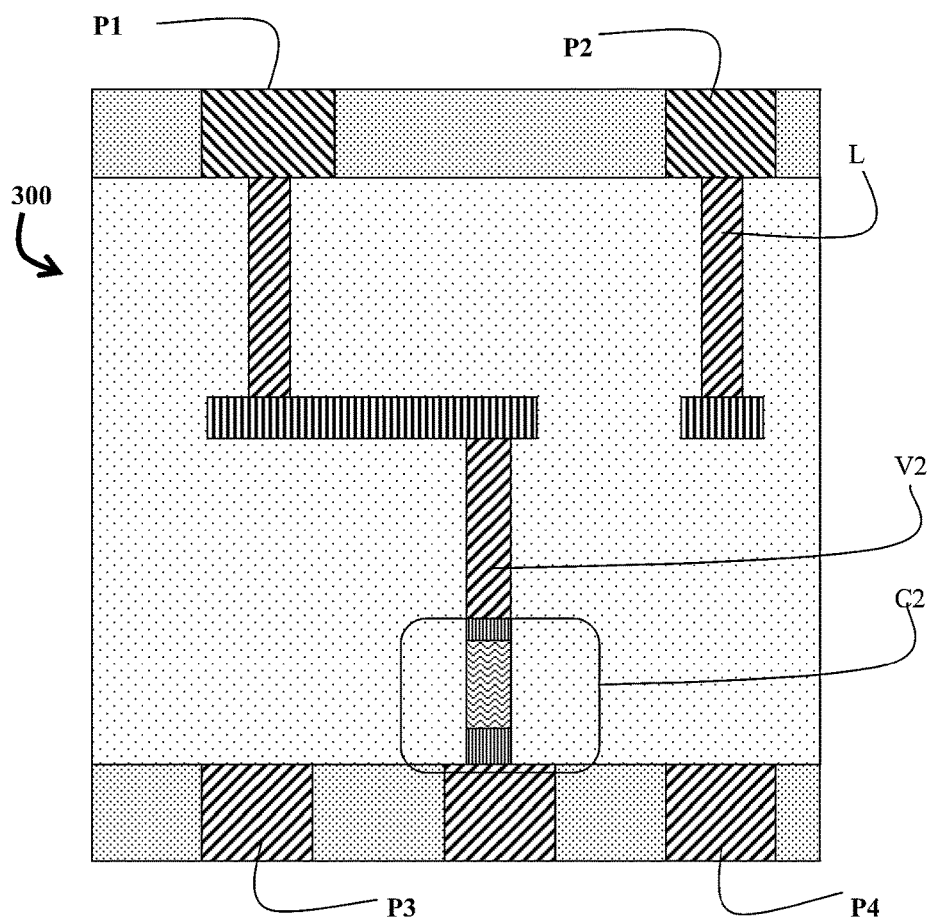
FIG. 12d is a schematic cross section of the basic LC low pass filter of FIG. 12a wherein the capacitor is sized to the via pillar thereover, which defines the effective capacitance of the capacitor.

Referring to FIG. 12*d*, in a variant manufacturing technique using the plasma etching step shown in FIG. 9(xviii), the footprint of via V2 defines the capacitance and the size of the capacitor C2, where excess material is etched away with a plasma etch. Thus 12*d* is a schematic cross-section of a basic LC low pass filter equivalent to FIG. 12*a* wherein the via pillar V2 defines the size of the electrodes and dielectric layer of the capacitor, as in the structures of FIGS. 3 to 7.

Figure 12E:
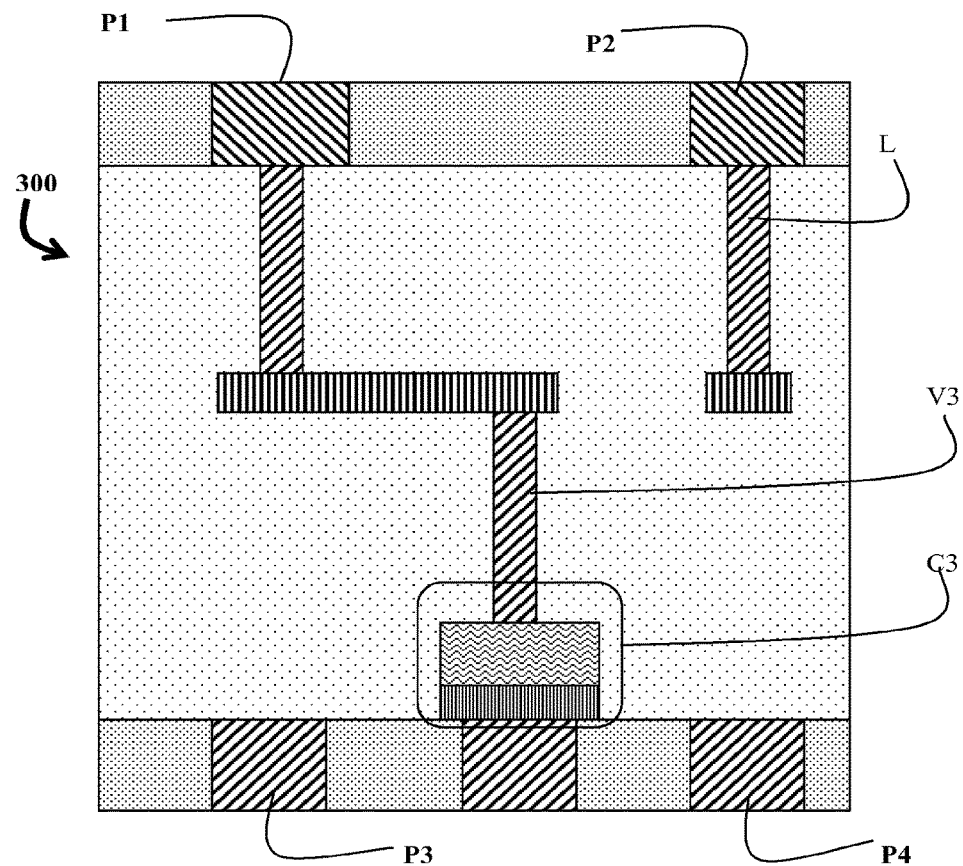
FIG. 12e is a schematic cross section of the basic LC low pass filter of FIG. 12a wherein the top electrode is the via pillar thereover.

FIG. 12*e* is a schematic cross-section of yet another basic LC low pass filter of FIG. 12*a* wherein the top electrode of the capacitor C3 is the via pillar V3 without first depositing an upper electrode of noble metal. In the fabrication of such a structure care must be taken to remove all of the copper seed layer from the dielectric.

It will be appreciated that the technology detailed in FIG. 9 and FIG. 9(i) to FIG. 9(xxxii) and FIG. 10(xxxiii) to FIG. 10(xL) can be used to create a very wide range of filters circuits with different characteristics. As shown in FIG. 2, many of these can include capacitors 8, 9 embedded in a cavity 2, or to protect an active component embedded in a cavity 2.

Figure 13A:
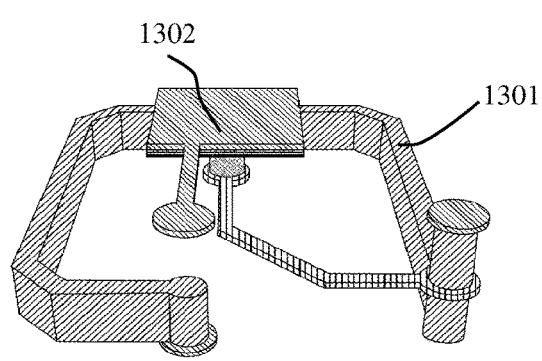
FIG. 13a is a schematic three dimensional view of a basic LC high pass filter.
Figure 13B:
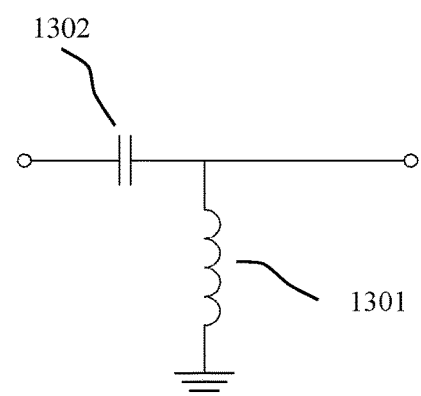
FIG. 13b shows how the basic LC high pass filter of FIG. 13a may be represented as an LC filter circuit component.

For example, with reference to FIGS. 13*a* and 13*b* a basic LC high pass filter may be fabricated, having inductor 1301 and capacitor 1302. With reference to FIGS. 14*a* and 14*b*, a basic LC series band pass filter may be fabricated, having inductor 1401 and capacitor 1402. With reference to FIGS. 15*a* and 15*b*, a basic LC parallel band pass filter may be fabricated, having inductor 1501 and capacitor 1502. With reference to FIGS. 16*a* and 16*b*, with appropriate variations, mutatis mutandis, a Low Pass Parallel-Chebyshev filter can be fabricated, having capacitors 1601 and 1062.

Although single filters have been illustrated, it will be appreciated that in practice, vast arrays of such filters are cofabricated in large plates that may then be singulated. Other components may be cofabricated together with the filters. The filter 260 may be surface mounted on a substrate or embedded into a substrate by depositing further feature and via layers there-around.

As described below, in some embodiments, filters as described above may be embedded in a substrate and a socket may be punched through the substrate for receiving a chip, such as a processor chip or a memory chip, to enable the fabrication of fully embedded RF circuits which may include processors and filters, for example.

In general, despite the obvious advantages of embedding to increase the degree of integration, it will be appreciated that there is an inherent disadvantage with embedded components, in that if something goes wrong, the component and the structure into which it is embedded must be discarded. Sometimes, diagnosing the route cause of a problem may be difficult where a component cannot be isolated and tested individually. However, due to demands for the expensive (real estate) on the surface of the substrate and a general trend towards miniaturization, there are significant advantages in embedding filters and other passive components, and also active components such as processors and memories.

It is a feature of the present invention, that filters and other passive components may be fabricated as stand-alone products for surface mounting. However, once optimized, the processing may be integrated into the fabrication processing of the substrate to embed such components.

It will be appreciated that the capacitances of capacitors depends on the electrode plate area, the thickness of the dielectric and its dielectric constant. Typically, capacitors for RF filters have capacitances of between about 5 and about 15 pF. Using the technology described herein, it is possible to control the capacitance to a narrow range, such as between 9 and 12 pF, and even to between 10 and 11 pF.

Inductors of the invention may have inductances in the range of nano-Henrys. Say from 0.2 nH to 300 nH, but typically, from 1 nH to about 10 nH.

It is possible to control the inductances of these inductors to narrow ranges, such as has to the range of from about 4 nH to about 8 nH, or even, where required to a range of less than one nano Henry, say between about 5 nH and about 6 nH.

As described hereinabove, substrates may be fabricated with embedded passive components. Active components such as chips may be surface mounted on such substrates or embedded within sockets in such substrates using a technology more fully described hereinbelow. Embodiments of the present invention propose fabricating embedded passive components in frames around a socket into which a chip such as a memory chip or a processor chip may then be embedded.

Such frames may be laid out in large frameworks around arrays of sockets. Each socket of an array may be identical for receiving an identical chip. Alternatively, an array may consist of different sockets with different embedded passives in some or all frames therearound. For example, an array may include alternating sockets for memory and processing chips. A socket may also receive a chip that comprises a passive component such as a capacitor or filter. Both passive and active components may be embedded into sockets. For example, multi-socket frames may include one or more sockets for a passive component and one or more sockets for an active component such as a memory chip or processor chip. To ease fabrication, such chips may be deposited by a robot into the sockets and then held in place by pouring a polymer dielectric there around, which may include fiber reinforcements. In some cases, the chip may be held in place by lamination a polymer film thereover.

All methods for attaching chips to interposers are costly. Wire bonding and flip chip technologies are costly and broken connections result in failure. Embedding chips rather than surface mounting may reduce manufacturing costs and increase reliability and yields.

A technology for fabricating sockets and for embedding a chip into such socket is now described.

Figure 17:
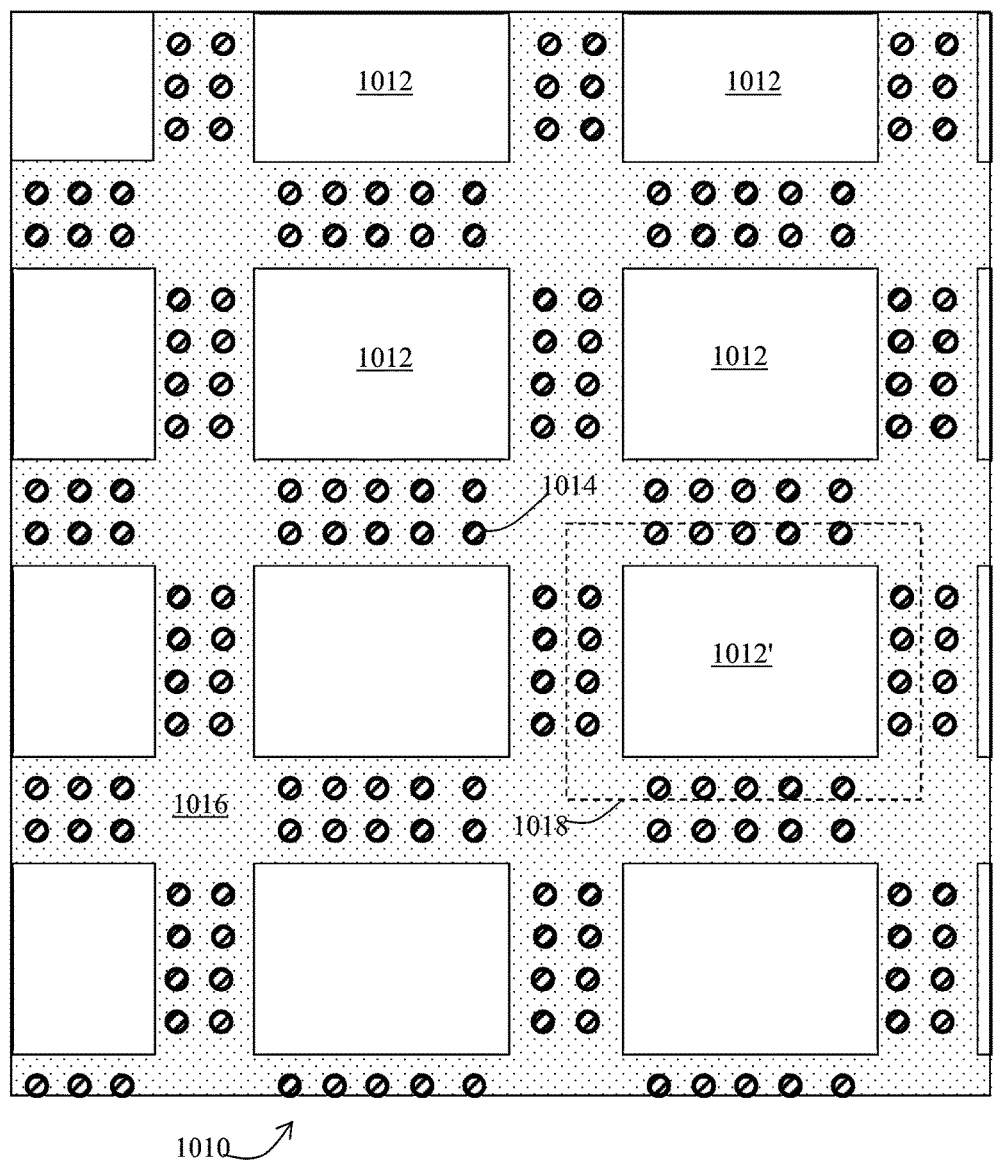
FIG. 17 is schematic illustration of a part of a polymer or composite grid having sockets therein for chips, and also having through vias around the sockets.

With reference to FIG. 17, there is shown part of an array 1010 of chip sockets 1012 defined by a framework comprising a polymer matrix 1016 and an array of metal vias 1014 through the polymer matrix framework 1016.

The array 1010 may be part of a panel comprising an array of chip sockets 1012, each surrounded and defined by a polymer matrix framework 1018 comprising a grid of copper vias 1014 through the polymer 1016 of the polymer matrix framework 1018. The polymer matrix 1016 typically includes glass fiber reinforcements, and is most typically fabricated from a resin impregnated woven fiber pre-preg.

Each chip socket 1012 is thus surrounded by a frame 1018 of polymer matrix 1016 with a number of copper through vias through the frame 1018, arranged around the socket 1012'.

The frame 1018 may be fabricated from a polymer applied as a polymer sheet, or may be a glass fiber reinforced polymer, applied as a pre-preg. More details may be found below with reference to FIGS. 22 and 23, where methods of manufacture are discussed.

Figure 18:
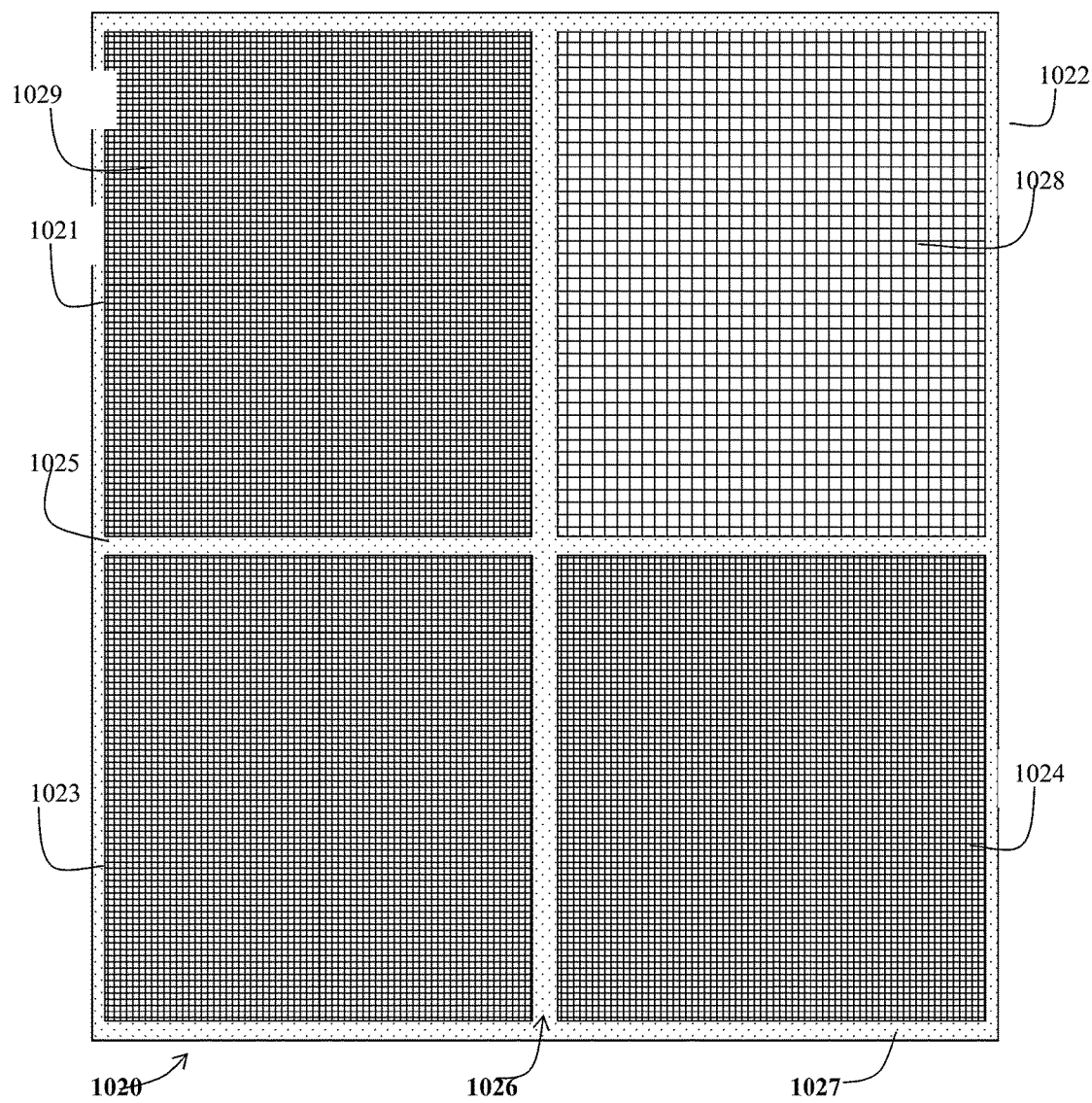
FIG. 18 is a schematic illustration of a panel used for fabricating embedded chips with surrounding through vias, showing how part of the panel IT IS may have sockets for a different type of chip.

With reference to FIG. 18, the applicant, Zhuhai Access' panels 1020 are typically divided into a 2×2 array of blocks 1021, 1022, 1023, 1024 separated from each other by a main frame consisting of a horizontal bar 1025 a vertical bar 1026 and an external frame 1027. The blocks comprise array of chip sockets 1012—FIG. 17. Assuming a 5 mm×5 mm chip socket and Access' 21"×25" panels, this manufacturing technique enables 10,000 chips to be packaged on each panel. In contradistinction, it will be noted that fabricating chip packages on a 12" wafer, which is currently the largest wafer used in industry, enables only 2,500 chips to be processed in one go, so the economies of scale in fabricating on large panels using Zhuhai Access' technology, will be appreciated.

Panels appropriate for this technology, may, however, vary in size somewhat. Typically, panels would be between about 12"×12" and about 24"×30". Some standard sizes in current use are 20"×16", 20.3"×16.5" and 24.7"×20.5".

Not all the blocks of the panel 1020 need to have chip sockets 1012 of the same size therein. For example, in the schematic illustration of FIG. 18, the chip sockets 1028 of the top right block 1022 are larger than the chip sockets 1029 of the other blocks 1021, 1023, 1024. Furthermore, not only may one or more blocks 1022 be used for a different sized socket for receiving a different sized chip, but any sub array of any size may be used to fabricate any specific die package, so despite the large throughputs, small runs of small numbers of die packages may be fabricated, enabling different die packages to be simultaneously processed for a specific customer, or different packages to be fabricated for different customers. Thus a panel 1020 may comprise at least one region 1022 having sockets 1028 with a first set of dimensions for receiving one type of chip, and a second region 1021 having sockets 1029 with a second set of dimensions for receiving a second type of chip.

As described hereinabove with reference to FIG. 17, each chip socket 1012 (1028, 1029 FIG. 18) is surrounded by a polymer frame 1018 and in each block (1021, 1022, 1023, 1024—FIG. 18), an array of sockets 1028 (1029) are positioned.

Figure 19:
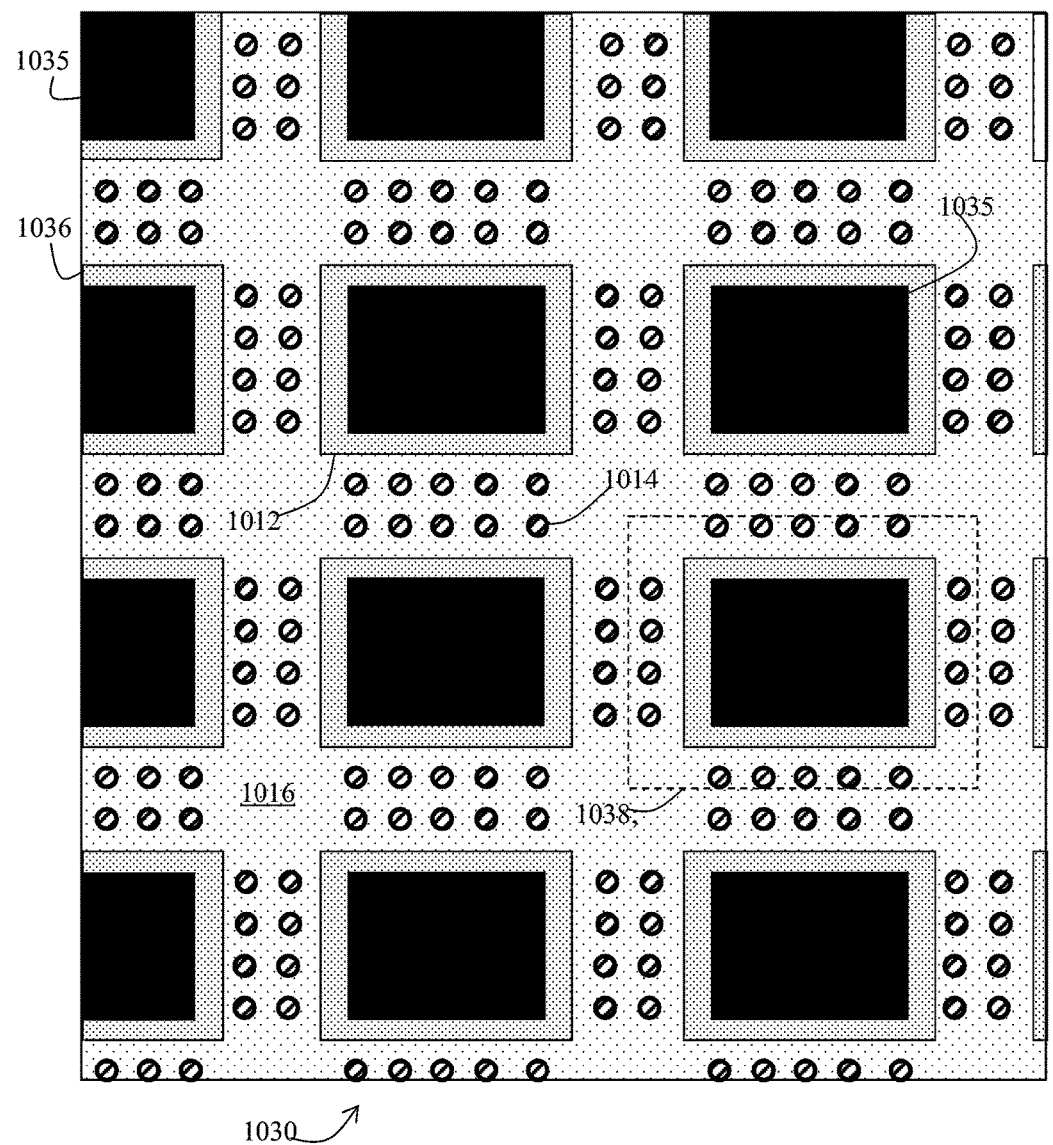
FIG. 19 is schematic illustration of the part of the polymer or composite framework of FIG. 17, with chips within each socket, held in place by a polymer or composite material, such as a molding compound, for example.

With reference to FIG. 19, a chip 1035 may be positioned in each socket 1012, and the space around the chip 1035 may be filled in with a polymer 1036 or polymer based composite which may or may not be the same polymer as that used for fabricating the frame 1016. It may be a molding compound for example. In some embodiments, the matrix of the filler polymer 1036 and that of the frame 1016 may use similar polymers, but with different reinforcing fibers. For example, the frame may include reinforcing fibers, whereas the polymer 1036 used for filling in the socket may be fiber free.

Typical die sizes may be anything from about 1.5 mm×1.5 mm, up to about 31 mm×31 mm, with the sockets slightly larger to accommodate the intended dies with clearance. The thickness of the interposer frame must be at least the depth of the die, and is preferably 10 microns to 100 microns. Typically, the depth of the frame is the thickness of the die + a further 20 microns.

As a result of the embedding of chips 1035 into the sockets 1012, each individual chip is surrounded by a frame 1038 having vias 1014 therethrough, arranged around the edges of each die.

Using Access' via post technology, either by pattern plating or by panel plating followed by selective etching, the vias 1014 may be fabricated as via posts and subsequently laminated with a dielectric material, using polymer films, or, for added stability, pre-pregs consisting of woven glass fiber bundles in a polymer matrix. In one embodiment, the dielectric material is Hitachi 705G. In another embodiment, MGC 832 NXA NSFLCA is used. In a third embodiment, Sumitomo GT-K may be used. In another embodiment, Sumitomo LAZ-4785 series films are used. In another embodiment, Sumitomo LAZ-6785 series is used. Alternative materials include Taiyo HBI and Zaristo-125, for example.

Alternatively, the vias may be fabricated using what is generally known as drill-fill technology. First a polymer or fiber reinforced polymer matrix is fabricated and then, after curing, it is drilled with holes, either by mechanical or by laser drilling. The drilled holes may then be filled with copper by electroplating.

There are, however, many advantages in fabricating the vias using via post rather than the drill-fill technology. In via post technology, since all vias may be fabricated simultaneously, the via post technology is faster than drill and fill whereas holes are drilled individually. Furthermore, drilled vias are essentially cylindrical whereas via posts may have any shape. In practice all drill-fill vias have the same diameter (within tolerances), whereas via posts may have different shapes and sizes. Also, for enhanced stiffness, preferably the polymer matrix is fiber reinforced, typically with woven bundles of glass fibers. Where fiber in polymer pre-pregs are laid over upstanding via posts and cured, the posts are characterized by smooth, vertical sides. However, drill-fill vias typically taper somewhat and, where a composite is drilled; the vias typically have rough surfaces which result in stray inductances that cause noise.

Generally, the vias 1014 are in the range of 40 micron to 500 micron wide. If cylindrical, such as required for drill-fill and such as is often the case for via posts, each via may have a diameter in the range of 25 micron to 500 micron.

With further reference to FIG. 19, after fabricating the polymer matrix framework 1016 with embedded vias, the sockets 1012 may be fabricated by CNC or punching. Alternatively, using either panel plating or pattern plating, sacrificial copper blocks may be deposited. If the copper via posts 1014 are selectively shielded, using a photo-resist, for example, such sacrificial copper blocks may be etched away to create the sockets 1012.

A polymer framework of a socket array 1038 with vias 1014 in the frame 1038 around each socket 1012 may be used for creating individual and multiple chip packages, including multiple chip packages and built up multilayer chip packages, such as Package-on-Package "PoP" arrays.

Once the chips 1035 are positioned in the sockets 1012, they may be fixed in place using a polymer 1036, such as a molding compound, a dry film or a pre-preg.

Figure 20:
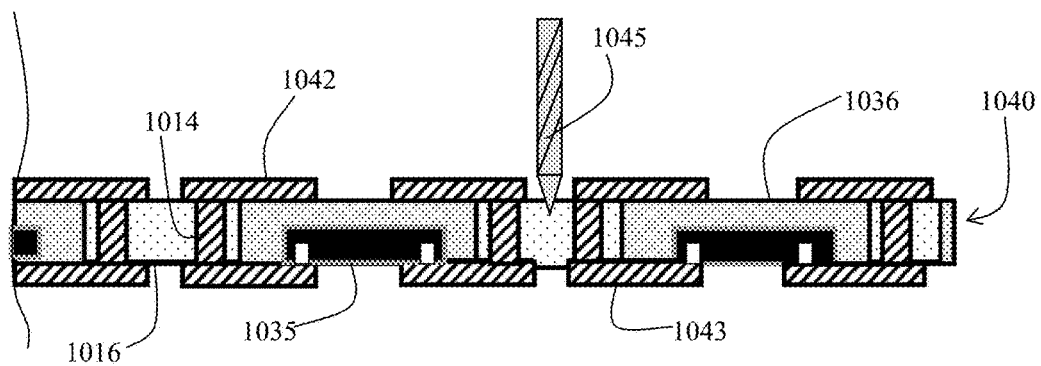
FIG. 20 is a schematic illustration of a cross-section through part of the framework showing embedded chips held within each socket by a polymer material, and also showing through vias and pads on both sides of the panel.

With reference to FIG. 20, copper routing layers 1042, 1043 may be fabricated on one or both sides of the framework 1040 embedded with chips 1035. Typically, the chips 1035 are flip chips and are coupled to pads 1043 that fan out beyond the edges of the chip 1035. By virtue of the through vias 1014, pads 1042 on the upper surface allow coupling a further layer of chips for PoP packaging and the like. Essentially, it will be appreciated that the upper and lower pads 1042, 1043 enable building up further via posts and routing layers to create more complex structures.

Figure 21:
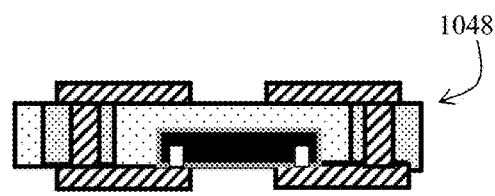
FIG. 21 is a schematic illustration of a cross-section through a die containing an embedded chip.

A dicing tool 1045 is shown. It will be appreciated that the array of packaged chips 1035 in the panel 1040 by be easily diced into individual chips 1048 as shown in FIG. 21.

Figure 22:
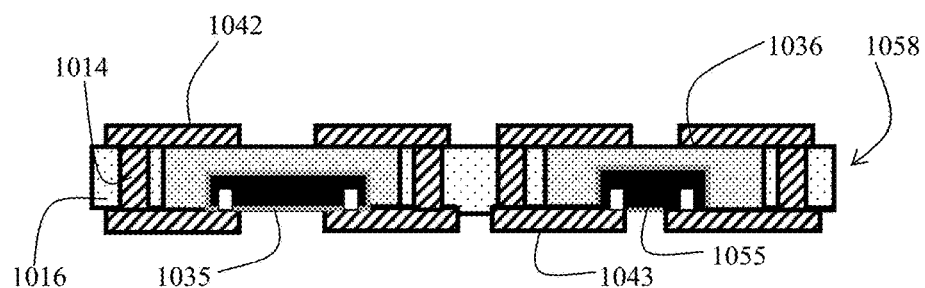
FIG. 22 is a is a schematic illustration of a cross-section through a package containing a pair of dissimilar dies in adjacent sockets.

Referring to FIG. 22, in some embodiments, adjacent chip sockets may have different dimensions, including different sizes and/or different shapes. For example, a processor chip 1035 may be positioned in one socket and coupled to a memory chip 1055 positioned in an adjacent socket. When the array is diced, adjacent sockets may be kept together. Thus a package may include more than one chip, and may include different chips, possibly including a passive filter chip, but it will be noted, that by using the technology described above for fabricating capacitors and filters, there can be co-fabricated as part of the framework.

The pads 1042, 1043 may couple to chips via ball grid arrays BGA or land grid arrays LGA. At the current state of the art, via posts may be about 130 microns long. Where the chips 1035, 1055 are thicker than about 130 microns, it may be necessary to stack one via on top of another. The technology for stacking vias is known, and is discussed, inter alia, in co-pending applications U.S. Ser. No. 13/482,099 (granted as U.S. Pat. No. 9,269,593) and U.S. Ser. No. 13/483,185 (granted as U.S. Pat. No. 9,185,793) to Hurwitz et al.

Figure 23:
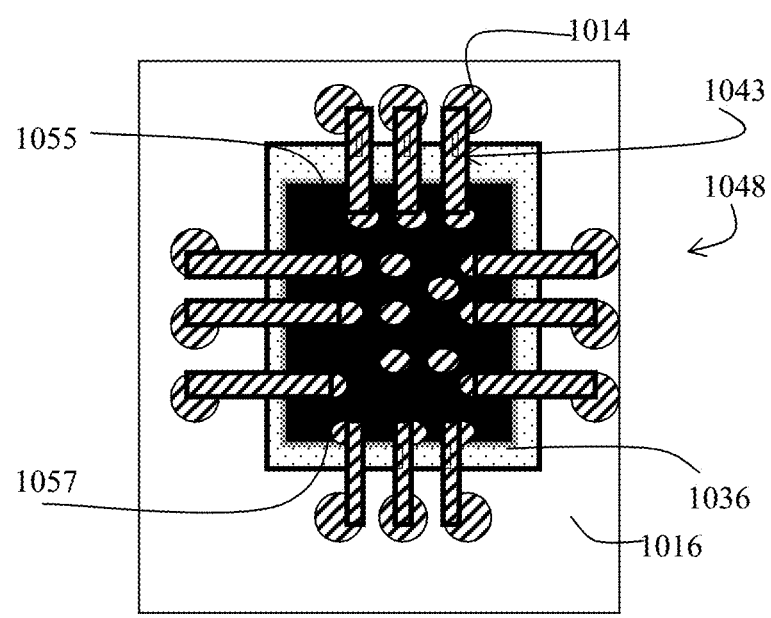
FIG. 23 is a schematic bottom view of a package such as that shown in FIG. 21.

With reference to FIG. 23, a die package 1048 comprising a die 1055 in a polymer frame 1016 is shown from below, such that the die 1055 is surrounded by the frame 1016 and through vias 1014 are provided through the frame 1016 around the perimeter of the die 1055. The die is positioned in a socket and held in place by a second polymer 1036. The frame 1016 is typically fabricated from a fiber reinforced pre-preg for stability. The second polymer 1036 may also be a pre-preg but may be a polymer film or a molding compound. Typically, as shown the through vias 1014 are simple cylindrical vias, but they may have different shapes and sizes. Some of the ball grid array of solder balls 1057 on the chip 1055 are connected to the through vias 1014 by pads 1043 in a fan out configuration. As shown, there may be additional solder balls that are coupled directly to a substrate beneath the chip. In some embodiments, for communication and data processing, at least one of the through vias is a coaxial via. In other embodiments, at least one via is a transmission line. Technologies for manufacturing coaxial vias are given in co-pending application U.S. Ser. No. 13/483,185, for example. Technologies for fabricating transmission lines are provided in U.S. Ser. No. 13/483,234 (granted as U.S. Pat. No. 9,312,593) for example.

In addition to providing contacts for chip stacking, through vias 1014 surrounding a chip may be used to isolate the chip from its surroundings and to provide Faraday shielding. Such shielding vias may be coupled to pads that interconnect the shielding vias over the chip and provide shielding thereto.

There may be more than one row of through vias surrounding the chip, and the inner row could be used for signaling and the outer row for shielding. The outer row could be coupled to a solid copper block fabricated over the chip that could thereby serve as a heat sink to dissipate heat generated by the chip. Different dies may be packaged in this manner. It will be particularly noted that one or more vias may be extensive inductors, and capacitors may be cofabricated and embedded in the frame, so that the inductors and capacitors together provide a filter.

The embedded chip technology with a frame having through vias described herein is particularly suited for analog processing, since the contacts are short, and there are a relatively small number of contacts per chip.

It will be appreciated that the technology described herein is not limited to packaging IC chips. In some embodiments, the die comprises a component selected from the group consisting of fuses, capacitors, inductors and filters. Technologies for manufacturing inductors and filters are described in co-pending application number U.S. Ser. No. 13/962,316 to Hurwitz et al.

Figure 24:
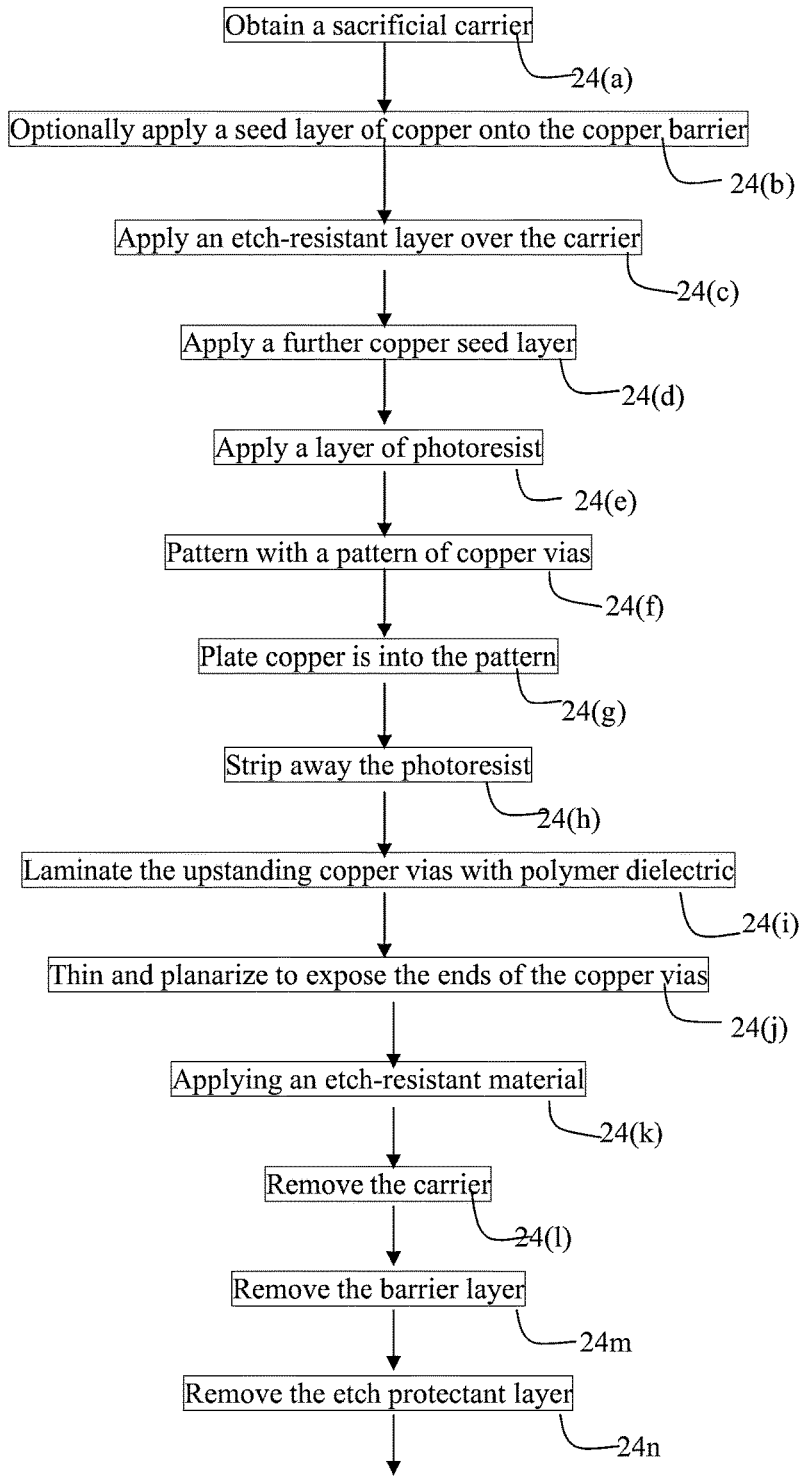
FIG. 24 is a flowchart showing a manufacturing process for fabricating a polymer or composite panel including an array of through vias.
Figure 24A:
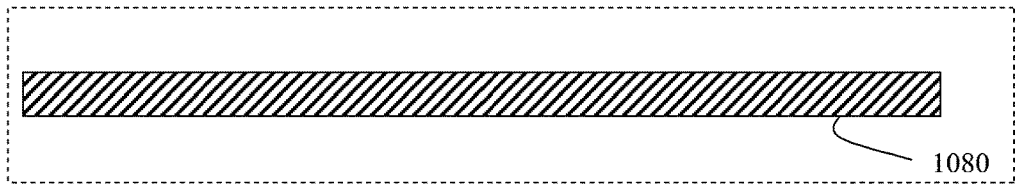
FIGS. 24(a) to 24(n) are schematic illustrations of the intermediate substructures obtained after each step of the flowchart 24.
Figure 24B:
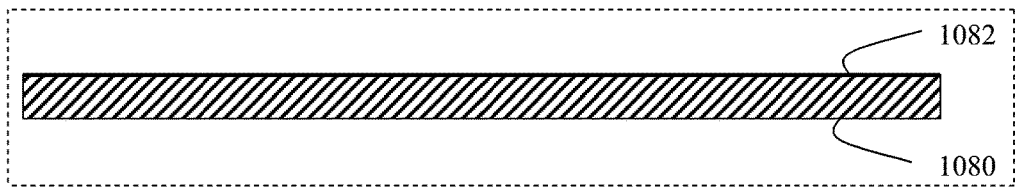
Figure 24C:
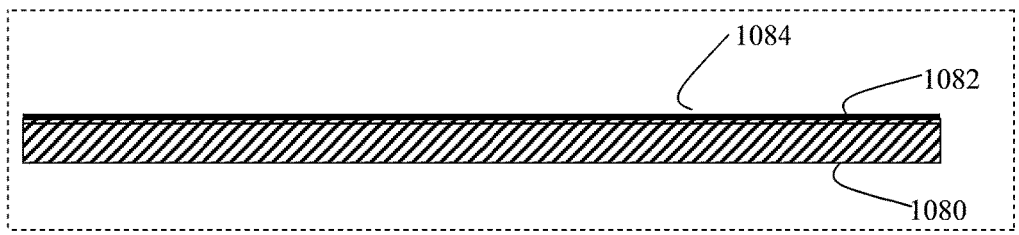
Figure 24D:
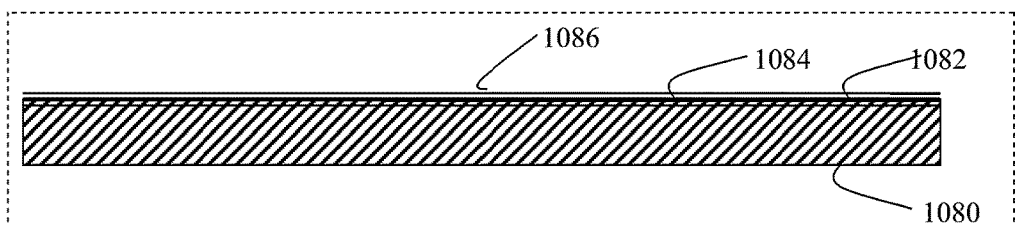
Figure 24E:
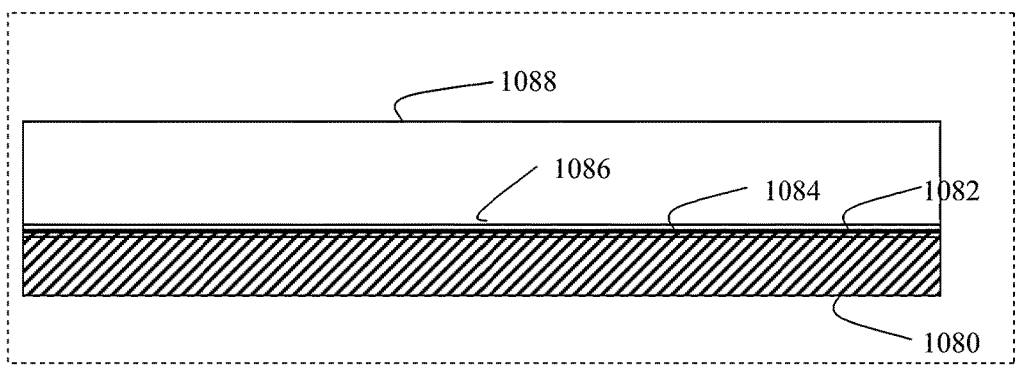
Figure 24F:
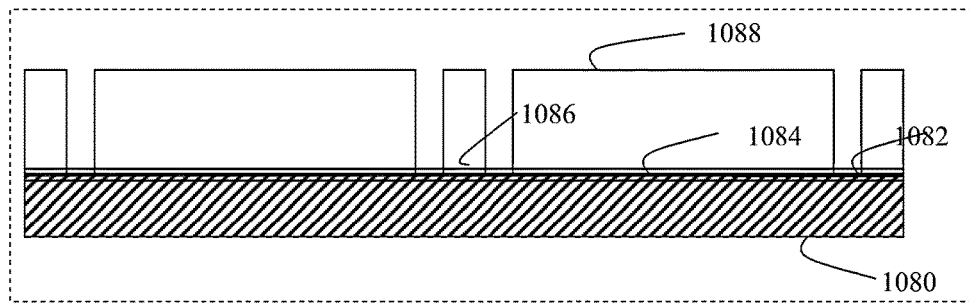
Figure 24G:
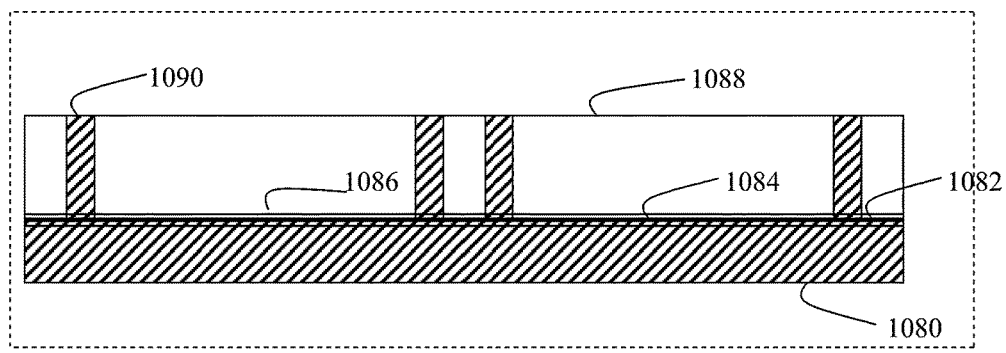
Figure 24H:
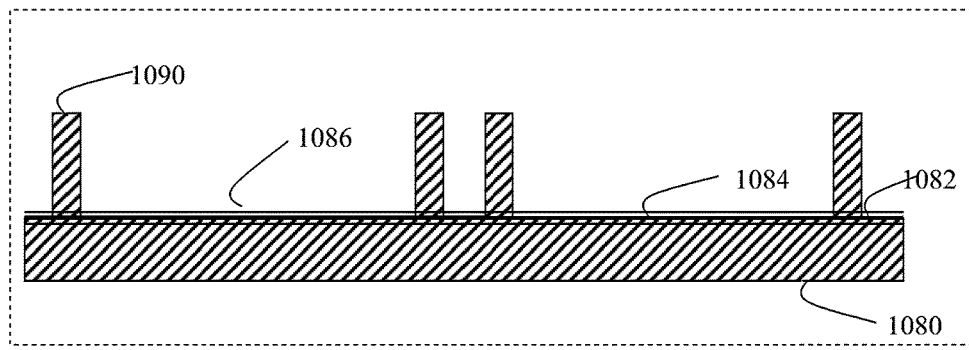
Figure 24I:
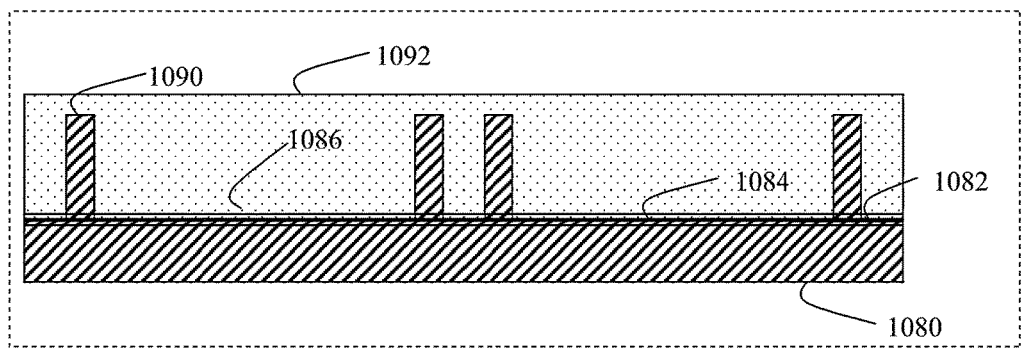
Figure 24J:
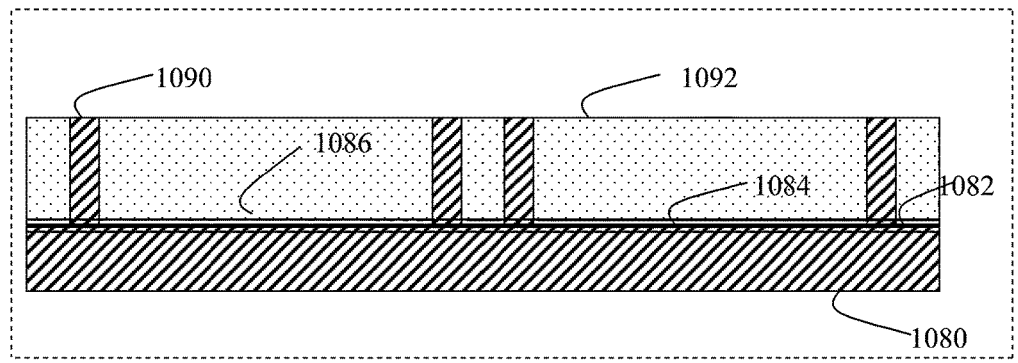
Figure 24K:
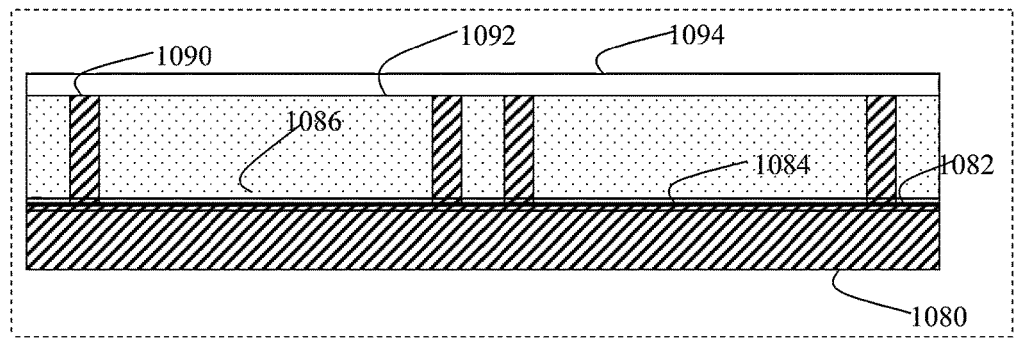
Figure 24L:
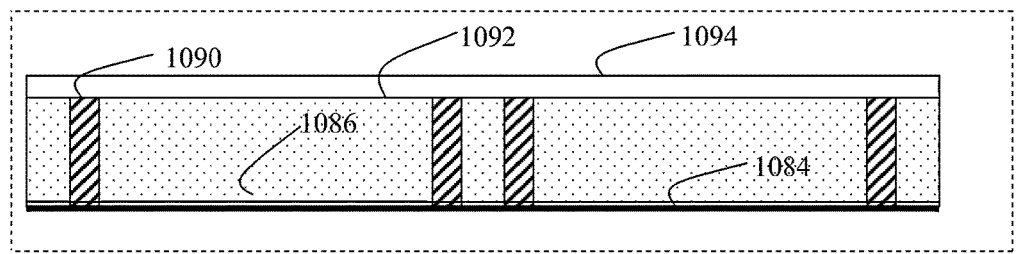
Figure 24M:
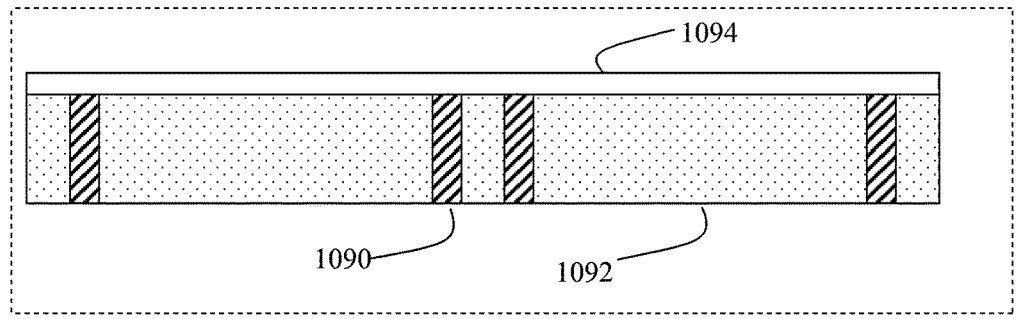
Figure 24N:
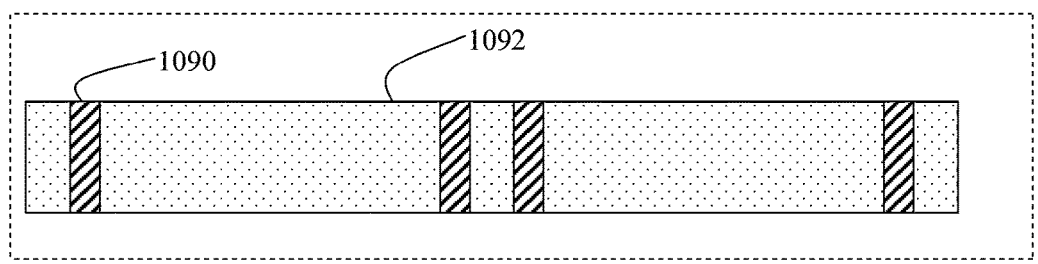

With reference to FIG. 24 and to FIGS. 24(*a*) to 24(*l*), a method of fabricating an array of chip sockets surrounded by an organic matrix framework comprises the steps of: obtaining a sacrificial carrier 1080—24(*a*).

Optionally a seed layer of copper 1082 is applied onto the copper carrier 1080—24(*b*). An etch-resistant layer 1084 is applied over the seed layer 1082—24(*c*), typically consisting of nickel and is typically deposited by a physical vapor process such as sputtering. It may alternatively be deposited by electroplating or electro-less plating, for example. Other candidate materials include tantalum, tungsten, titanium, titanium-tungsten alloy, tin, lead, tin-lead alloy, all of which may be sputtered, and tin and lead may also be electroplated or electro-less plated, the barrier metal layer is typically 0.1 to 1 micron thick. (Each candidate barrier layer material is later removed with appropriate solvent or plasma etching conditions.) After application of the barrier layer, a further copper seed layer 1086 is applied—24(*d*). The copper seed layer is typically about 0.2 microns to 5 microns thick.

Steps 24(*b*) to 24(*d*) are preferable to ensure good adhesion of the barrier layer to the substrate, good adhesion and growth of vias, and to enable subsequent removal of the substrate by etching without damaging vias. Although best results include these steps, they are, however, optional, and one or more may not be used.

A layer of photo-resist 1088 is now applied—step 24(*e*), FIG. 24(*e*) and patterned with a pattern of copper vias—22 (*f*). Then copper 1090 is plated into the pattern—24(*g*), and the photo-resist 1088 is stripped away—24(*h*). The upstanding copper vias 1090 are laminated with polymer dielectric 1092—24(*i*) which may be a fiber reinforced polymer matrix pre-preg. The laminated via array is thinned and planarized to expose the ends of the copper vias—24(*j*). The carrier is then removed.

Optionally and preferably, the planarized polymer dielectric with exposed ends of copper vias is protected by applying an etch-resistant material 1094—24(*k*) such as a photo-resist or dielectric film, prior to the copper carrier 1080 being removed 24(*l*). Typically the carrier is a copper carrier 1080 that is removed by dissolving the copper. Ammonium-hydroxide or copper chloride may be used to dissolve the copper.

The barrier layers may then be etched away—24(*m*), and the etch protecting layer 1094 may be removed—step 24(*n*).

Although not described herein, it will be appreciated that the upstanding copper vias could be fabricated by panel plating and selectively etching away superfluous copper to leave the vias. Indeed, the sockets could alternatively be fabricated by selectively etching away parts of a copper panel whilst shielding the vias.

It will be appreciated as described hereinabove, that one or more vias 1090 may be the modified via 5 of FIG. 1 that includes a capacitor 6 therein. Furthermore, one or more vias may be an inductor via 7 of FIG. 1.

Although via post technology is preferred, where only simple vias 1090 are required, and not the modified via 5 of FIG. 1 that includes a capacitor 6 therein, or inductor vias 7 of FIG. 1, but only simple cylindrical vias are required, drill & fill technology can also be used.

Figure 25:
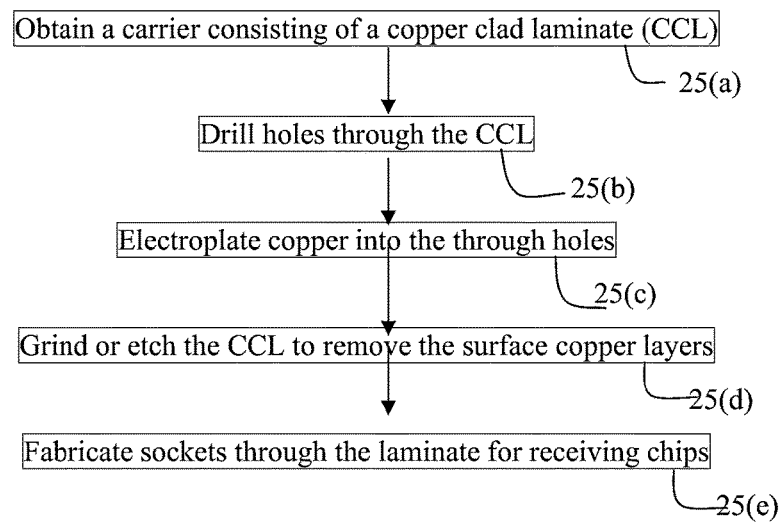
FIG. 25 is a flowchart showing how drill-fill technology may be used to create plated through-holes, with sockets punched out.
Figure 25A:
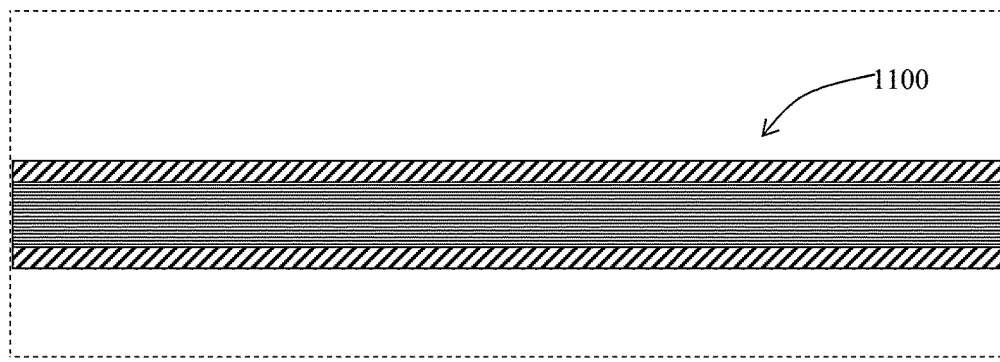
FIGS. 25(a) to 25(e) are schematic illustrations of the intermediate substructures obtained after each step of flowchart 24.
Figure 25B:
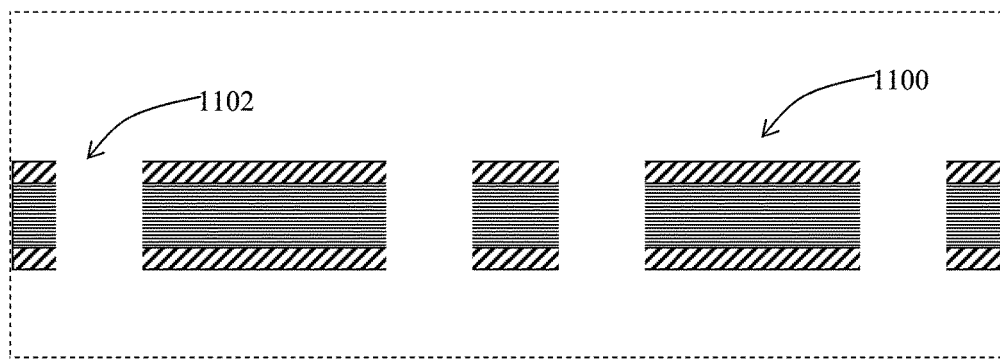
Figure 25C:
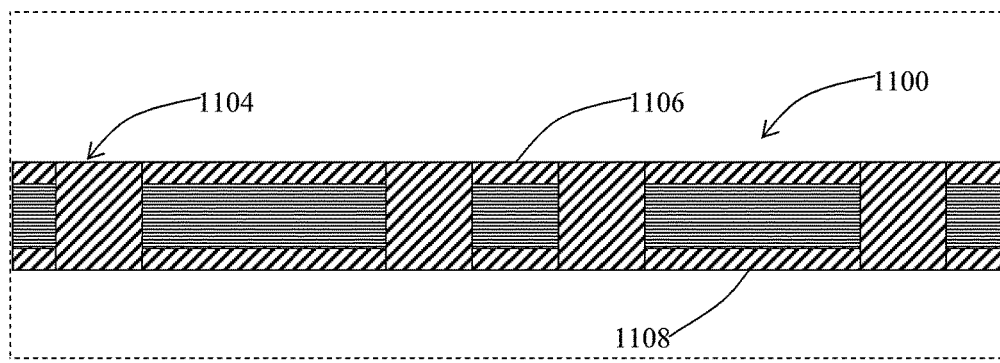
Figure 25D:
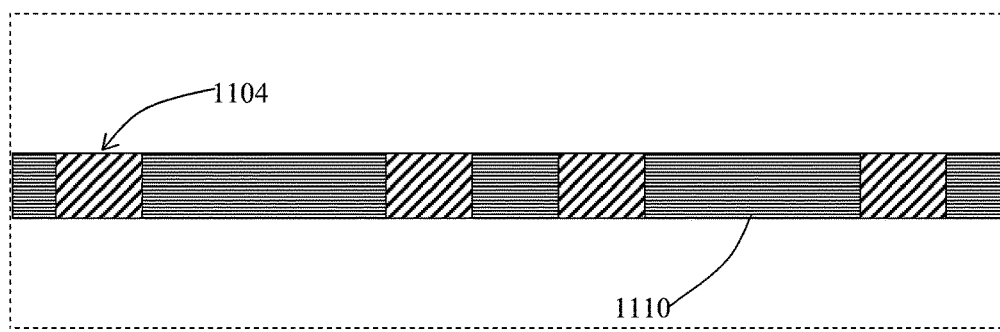
Figure 25E:
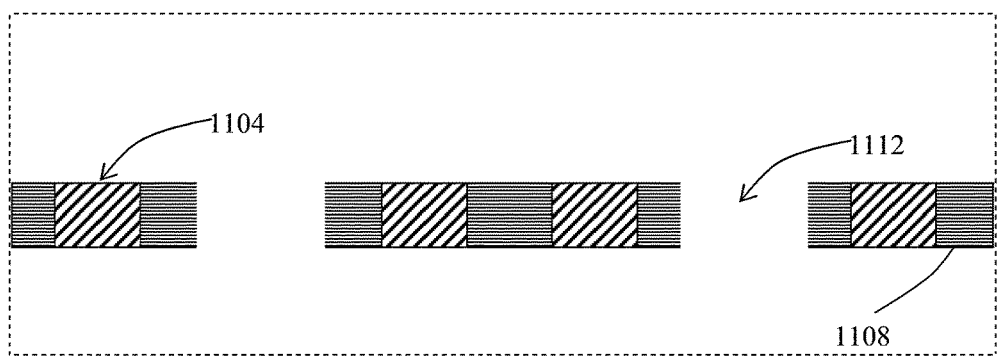

With reference to FIG. 25 and to FIGS. 25(a) to 25(e), in another variant method, a carrier consisting of a copper clad laminate (CCL) 1100 is obtained—25(a). CCLs have thicknesses of 10s to hundreds of microns. A typical thickness if 150 microns. Holes 1102 are drilled through the CCL—25 (b). The holes 1102 may have a diameter of 10s to hundreds of microns. Typically, the diameter of the holes is 150 microns.

The through holes are now plated to create plated through holes 1104—25(c).

The copper clad laminate 1100 is then ground or etched to remove the surface copper layers 1106, 1108, leaving the laminate 1110 with plated through hole (Pth) copper vias 1104—25(d).

Then, using CNC or a punch, sockets 1112 are fabricated through the laminate for receiving chips—25(e).

Figure 26:
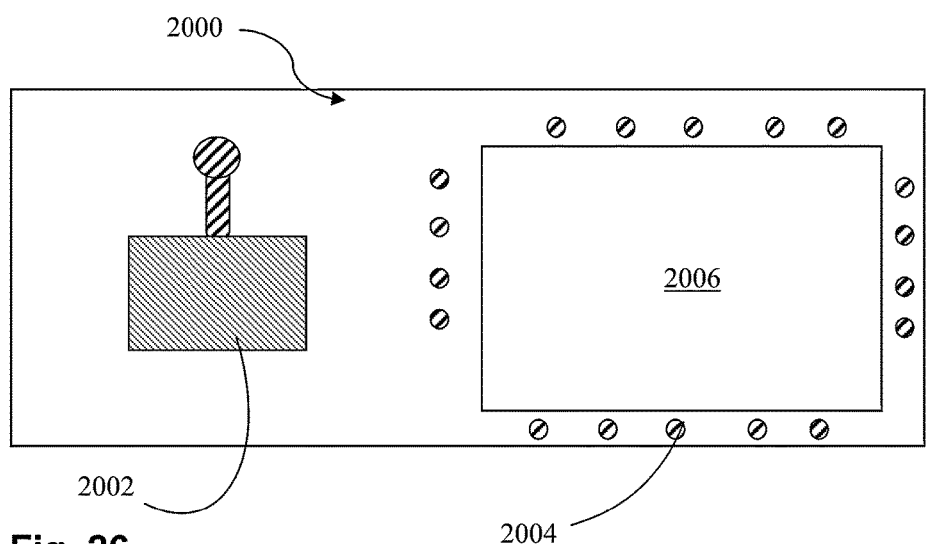
FIG. 26 is a plan view of a frame with a filter embedded alongside a socket for a chip.

Referring to FIG. 26, there is shown a plan view of a frame 2000 with an embedded filter 2002 therein and various routing vias 2004 may contain a socket 2006 for receiving a chip such as a processor chip or a memory chip. Such a frame 2000 may be fabricated as part of a large array, such as those shown in FIGS. 17-19, for example. The frame 2000 as shown includes one socket 2006 for receiving a single chip. It will, however, be appreciated that frames may include two or more sockets for receiving two or more chips. Such sockets 2006 could be used for embedding processor chips, memory chips or passive chips with filters and the like embedded therein.

In this specification, there has been described in some detail how inductors and capacitors may be fabricated as embedded passives within an organic substrate. The combination of such capacitors and inductors may provide a filter. The specification then goes on to explain how polymer frames with embedded vias may be fabricated and how these may be used as sockets for embedded active components. The combination of these technologies enables the fabrication of a package comprising one or more embedded chips and embedded filters for very small highly integrated RF components that include both active and passive components.

The above description is provided by way of explanation only. It will be appreciated that the present invention is capable of many variations.

Several embodiments of the present invention have been described. Nevertheless, it will be understood that various modifications may be made without departing from the spirit and scope of the invention. Accordingly, other embodiments are within the scope of the following claims.

Thus persons skilled in the art will appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components.

What is claimed is:

1. A chip socket for an embedded chip defined by a frame around a socket, the frame having an organic matrix, wherein the frame comprises at least one via post layer comprising at least one via post, wherein at least one capacitor coupled to at least one via post is incorporated within the frame around the chip socket.

2. The chip socket of claim 1, wherein a dielectric of the capacitor comprises at least one of the group consisting of $Ta_2O_5$, $TiO_2$, $Ba_xSr_{1-x}TiO_3$, $BaTiO_3$, $BaO_4SrTi$ and $Al_2O_3$.

3. The chip socket of claim 1, wherein a lower electrode of the capacitor comprises a noble metal.

4. The chip socket of claim 1, wherein the lower electrode of the capacitor comprises a metal selected from the group consisting of gold, platinum and tantalum.

5. The chip socket of claim 1, wherein an upper electrode of the capacitor comprises a metal selected from the group consisting of gold, platinum and tantalum.

6. The chip socket of claim 1, wherein the capacitor comprises a lower electrode layer, a dielectric layer and an upper electrode layer, and the at least one via post stands on the upper electrode layer.

7. The chip socket of claim 1, wherein the capacitor comprises a lower electrode layer and a dielectric layer and the at least one via post stands on the dielectric layer and serves as the upper electrode of the capacitor.

8. The chip socket of claim 7, wherein contact area of the via post in contact with the dielectric layer multipled by dielectric constant of the dielectric layer divided by thickness of the dielectric layer is capacitance of the capacitor.

9. The chip socket of claim 1, wherein the at least one capacitor has a capacitance of between 1.5 pF and 300 pF.

10. The chip socket of claim 1, wherein the at least one capacitor has a capacitance of between 5 pF and 45 pF.

11. The chip socket of claim 1 wherein the frame further comprises at least one feature layer.

12. The chip socket of claim 1, wherein at least one electronic component is embedded within the socket and is electrically coupled to the at least one via.

13. The chip socket of claim 12, wherein the at least one electronic component comprises a second capacitor.

14. The chip socket of claim 13, wherein the second capacitor is a discrete component having a metal termination on at least one end.

15. The chip socket of claim 13, wherein the second capacitor is a Metal-Insulator-Metal (MIM) capacitor.

16. The chip socket of claim 15, wherein the Metal-Insulator-Metal (MIM) capacitor comprises a dielectric layer consisting of at least one of the group consisting of $Ta_2O_5$, $TiO_2$, $Ba_xSr_{1-x}TiO_3$, $BaTiO_3$, $BaO_4SrTi$ and $Al_2O_3$.

17. The chip socket of claim 15, wherein a lower electrode of the Metal-Insulator-Metal (MIM) capacitor comprises a noble metal.

18. The chip socket of claim 15, wherein an upper electrode of the Metal-Insulator-Metal (MIM) capacitor comprises a metal selected from the group consisting of gold, platinum and tantalum.

19. The chip socket of claim 13, wherein the lower electrode comprises a metal selected from the group consisting of gold, platinum and tantalum.

20. The chip socket of claim 13, wherein electrodes of the Metal-Insulator-Metal (MIM) capacitor are coupled to vias by feature layers.

21. The chip socket of claim 20, wherein a feature layer on one side of the frame and embedded components comprises an inductor.

22. The chip socket of claim 20 wherein embedded components within the frame, socket and at least one feature within the feature layer provides a filter.

23. The chip socket of claim 22, wherein the filter is selected from the group consisting of basic LC low pass filters, LC high pass filters, LC series band pass filters, LC parallel band pass filters and Low Pass Parallel-Chebyshev filters.

24. The chip socket of claim 1, wherein a chip mounted in a socket is protected from electromagnetic radiation by a Faraday cage comprising via posts within the frame, thereby minimizing electromagnetic interference.

25. The chip socket of claim 24 wherein at least some of the via posts extend in the XY plane.

26. The chip socket for an embedded chip of claim 1 wherein there are a plurality of chip sockets, each one of the chip sockets defined by a respective frame around a respective socket, the respective frame having an organic matrix, wherein the respective frame comprises at least on via post layer comprising at least one via post, wherein at least one capacitor coupled to at least one via post is incorporated within the respective frame around the chip socket.

27. The chip socket of claim 26 wherein the plurality of chip sockets are arranged as an array.

28. The chip socket of claim 27 wherein at least one processor chip is embedded in a first of the plurality of sockets.

29. The chip socket of claim 28 wherein a passive chip comprising at least one capacitor is embedded in a second of the plurality of sockets.

30. The chip socket of claim 26 wherein the at least one capacitor is coupled with at least one inductor in series.

* * * * *